United States Patent
Inoue et al.

(10) Patent No.: US 11,888,003 B2
(45) Date of Patent: Jan. 30, 2024

(54) PHOTODETECTOR

(71) Applicant: Panasonic Intellectual Property Management Co., Ltd., Osaka (JP)

(72) Inventors: Akito Inoue, Osaka (JP); Yuki Sugiura, Kyoto (JP); Yutaka Hirose, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 749 days.

(21) Appl. No.: 17/039,128

(22) Filed: Sep. 30, 2020

(65) Prior Publication Data

US 2021/0028202 A1 Jan. 28, 2021

Related U.S. Application Data

(63) Continuation of application No. PCT/JP2019/013885, filed on Mar. 28, 2019.

(30) Foreign Application Priority Data

Mar. 30, 2018 (JP) ................................. 2018-067892

(51) Int. Cl.
H01L 27/146 (2006.01)
H04N 25/75 (2023.01)

(52) U.S. Cl.
CPC .... H01L 27/1461 (2013.01); H01L 27/14603 (2013.01); H01L 27/14643 (2013.01); *H04N 25/75* (2023.01)

(58) Field of Classification Search
CPC .... H01L 27/146–14893; H01L 31/107; H04N 25/75
See application file for complete search history.

(56) References Cited

U.S. PATENT DOCUMENTS 6,222,235 B1 4/2001 Kojima et al.
8,093,624 B1 1/2012 Renzi et al.
(Continued)

FOREIGN PATENT DOCUMENTS

EP 0749169 A2 12/1996
JP H04-256376 9/1992
(Continued)

OTHER PUBLICATIONS

Japanese Office Action dated Feb. 7, 2023 issued in the corresponding Japanese Patent Application No. 2021-143684.
(Continued)

*Primary Examiner* — Eric A. Ward
(74) *Attorney, Agent, or Firm* — Rimon P.C.

(57) ABSTRACT

A photodetector includes: a semiconductor substrate having a first main surface and a second main surface; a first semiconductor layer that is of a first conductivity type, and is included in the semiconductor substrate and closer to the first main surface than to the second main surface; a second semiconductor layer that is of a second conductivity type different from the first conductivity type, and is included in the semiconductor substrate and interposed between the first semiconductor layer and the second main surface; a multiplication region that causes avalanche multiplication to a charge generated in the semiconductor substrate through photoelectric conversion; a circuit region disposed alongside the first semiconductor layer in a direction parallel to the first main surface; at least one isolation transistor disposed in the circuit region; and an isolation region interposed between the first semiconductor layer and the circuit region.

22 Claims, 53 Drawing Sheets

(56) References Cited

U.S. PATENT DOCUMENTS

| | | |
|---|---|---|
| 9,178,100 B2 | 11/2015 | Webster et al. |
| 9,978,885 B1 | 5/2018 | Kuznetsov |
| 2005/0167709 A1 | 8/2005 | Augusto |
| 2009/0256223 A1 | 10/2009 | Yamamura et al. |
| 2009/0315135 A1* | 12/2009 | Finkelstein ........... H01L 31/107 257/E31.113 |
| 2011/0024774 A1* | 2/2011 | Tredwell ............. H01L 31/1896 257/E33.044 |
| 2011/0180869 A1 | 7/2011 | Sanada |
| 2014/0291481 A1* | 10/2014 | Zhang ................. H01L 27/1463 257/431 |
| 2014/0374867 A1 | 12/2014 | De Munck et al. |
| 2015/0054111 A1 | 2/2015 | Niclass et al. |
| 2015/0281620 A1 | 10/2015 | Usuda et al. |
| 2016/0163906 A1 | 6/2016 | Muscara' et al. |
| 2018/0188356 A1 | 7/2018 | Na et al. |

FOREIGN PATENT DOCUMENTS

| | | |
|---|---|---|
| JP | H04-256376 A | 9/1992 |
| JP | H07-226532 A | 8/1995 |
| JP | 09/064407 A | 3/1997 |
| JP | 09/181348 A | 7/1997 |
| JP | 2004-319576 A | 11/2004 |
| JP | 2004-363437 A | 12/2004 |
| JP | 2005-123644 A | 5/2005 |
| JP | 2011-151320 A | 8/2011 |
| JP | 2015/005752 A | 1/2015 |
| JP | 2015-041746 A | 3/2015 |
| JP | 2017-005276 A | 1/2017 |
| WO | 2008/004547 A1 | 1/2008 |
| WO | 2014/097519 A1 | 6/2014 |

OTHER PUBLICATIONS

International Search Report (ISR) dated Jun. 25, 2019 in International (PCT) Application No. PCT/JP2019/013885.

Non-Final Office Action dated Sep. 14, 2023 issued in U.S. Appl. No. 17/479,835.

* cited by examiner

|  | COMPARATIVE EXAMPLE | EMBODIMENT 2 |
|---|---|---|
| THICKNESS: 5 μm | 37 V | 24 V |
|  | 0.62 V | 0.15 V |
| THICKNESS: 15 μm | 64 V | 24 V |
|  | 4.7 V | 0.15 V |
| UPPER COLUMN: AVERAGE VALUE OF AVALANCHE BREAKDOWN VOLTAGE LOWER COLUMN: STANDARD DEVIATION ||||

PHOTODETECTOR

CROSS REFERENCE TO RELATED APPLICATIONS

This application is a U.S. continuation application of PCT International Patent Application Number PCT/JP2019/013885 filed on Mar. 28, 2019, claiming the benefit of priority of Japanese Patent Application Number 2018-067892 filed on Mar. 30, 2018, the entire contents of which are hereby incorporated by reference.

BACKGROUND

1. Technical Field

The present disclosure relates to photodetectors.

2. Description of the Related Art

In recent years, highly sensitive photodetectors have been used in various fields, such as medicine, communications, biology, chemistry, surveillance, in-vehicle technology, and radiation detection. As a means to enhance sensitivity, avalanche photodiodes (hereinafter, also referred to as APDs) are used. With an APD, photodetection sensitivity is enhanced through multiplication performed, using avalanche breakdown, on a signal charge generated by photoelectrically converting light incident on a photoelectric conversion layer. The use of an APD allows even a small number of photons to be detected.

For example, a photon-counting photodetector including an APD (see WO 2008/004547, for instance) and a highly sensitive image sensor (see WO 2014/097519, for instance) have been developed.

Moreover, a reach-through APD has been disclosed as an example of APD configurations, for example (see WO 2014/097519 and Japanese Unexamined Patent Application Publication No. 2015-5752, for instance).

Furthermore, a configuration that includes a thick photoelectric conversion layer without increasing an avalanche breakdown voltage has been developed (see U.S. Unexamined Patent Application Publication No. 2016/0163906, for example).

This configuration includes a photoelectric conversion layer having a built-in potential gradient, which causes electrical charge to drift. As a result, a photoelectric conversion film can be increased in thickness without increasing the avalanche breakdown voltage.

Moreover, a configuration including a pixel and a pixel circuit disposed close to each other to enhance flexibility of a circuit that reads an electrical charge detected by an APD has been developed (see Japanese Unexamined Patent Application Publication No. 2004-363437 and Japanese Unexamined Patent Application Publication No. 2004-319576, for example).

Furthermore, a configuration that enhances a circuit flexibility by connecting a wafer including an APD array to another wafer including an interface circuit has been developed (see U.S. Pat. No. 8,093,624, for example).

The present disclosure provides a highly sensitive photodetector.

SUMMARY

In order to solve the above problem, a photodetector in accordance with an aspect of the present disclosure includes: a semiconductor substrate that has a first main surface and a second main surface opposed to the first main surface; a first semiconductor layer that is of a first conductivity type, and is included in the semiconductor substrate and closer to the first main surface than to the second main surface; a second semiconductor layer that is of a second conductivity type different from the first conductivity type, and is included in the semiconductor substrate and interposed between the first semiconductor layer and the second main surface; a multiplication region that is included in the first semiconductor layer and the second semiconductor layer and causes avalanche multiplication to a charge generated in the semiconductor substrate through photoelectric conversion; a circuit region that is disposed alongside the first semiconductor layer in a direction parallel to the first main surface; an isolation transistor that is disposed in the circuit region, the isolation transistor comprising at least one isolation transistor; an isolation region that is interposed between the first semiconductor layer and the circuit region; a first contact that is disposed on the first semiconductor layer, the first contact comprising at least one first contact; a first line that connects the first contact to a source of the isolation transistor; and a readout circuit that is connected to a drain of the isolation transistor and reads a first charge included in the charge generated in the semiconductor substrate through photoelectric conversion.

With this configuration, the first charge, which is a charge carrier of the first conductivity type included in the charge photo-generated in the photoelectric conversion layer, is drifted in the photoelectric conversion layer and enters the multiplication region where avalanche multiplication is thus caused. The charge generated through photoelectric conversion is amplified by avalanche multiplication. This allows the incident light even with low intensity to be detected. More specifically, this configuration enhances the sensitivity (that is, the photosensitivity) of the photodetector.

For example, the configuration disclosed in U.S. Pat. No. 8,093,624 is unable to be fabricated by a complementary metal oxide semiconductor (CMOS) process.

In contrast, the photodetector according to an aspect of the present disclosure includes the APD and the pixel circuits, such as the isolation transistor, in the same semiconductor substrate and thus can be fabricated by a typical CMOS process. Hence, the photodetector according to an aspect of the present disclosure can be fabricated at lower cost.

For example, the photodetector further includes a second contact that is disposed on the second main surface, wherein the charge generated between the first semiconductor layer and the second semiconductor layer through photoelectric conversion includes a second charge that is opposite in polarity to the first charge and that flows outside the semiconductor substrate via the second contact.

With this configuration, the second charge, which is a charge carrier of the second conductivity type generated through photoelectric conversion and avalanche multiplication, is discharged outside the photodetector via the second contact disposed on the second main surface that is the backside of the semiconductor substrate.

According to an aspect of the present disclosure, the second charge that is not used as a signal for photodetection by the photodetector can be discharged in a short time via the backside of the semiconductor substrate. This can reduce temporal fluctuations and spatial non-uniformity in voltage of the backside of the semiconductor substrate (such as the first semiconductor layer and the second semiconductor layer). Thus, spatial and temporal fluctuations in the photodetection efficiency can be reduced.

For example, a configuration disclosed in U.S. Pat. No. 9,178,100 includes an anode and a cathode on the same plane. In this case, the direction in which the charge is drifted for the avalanche multiplication is opposite to the direction in which the charge moves when discharged. This leads to a longer time before the discharge, resulting in a decrease in the photodetection efficiency.

For example, the isolation region separates the first semiconductor layer and the circuit region according to a potential.

With this configuration, the isolation region can be reduced in size. Thus, the aperture ratio can be increased and the pixel can be miniaturized. Moreover, the isolation region can be easily fabricated, as compared with the case where the isolation region is, for example, a trench.

For example, the potential is greater than a voltage change in the first semiconductor layer caused by the charge generated through the avalanche multiplication.

With this configuration, even if a voltage change occurs in the first semiconductor layer, the first semiconductor layer and the circuit region can be electrically separated by the isolation region.

For example, the isolation region is depleted.

According to an aspect of the present disclosure, the first semiconductor layer and the circuit region of the photodetector are separated by the isolation region. Depletion of the isolation region allows the first semiconductor layer and the circuit region to be separated at a short separation distance and also allows the electric field of the isolation region to be reduced. This maintains the photosensitivity of the photodetector and also achieves miniaturization of the photodetector, according to an aspect of the present disclosure. Thus, the photodetector according to an aspect of the present disclosure has a higher aperture ratio and thus achieves an enhanced photosensitivity.

For example, a region including the first semiconductor layer and the isolation region includes no shallow trench isolation (STI) nor contact.

The isolation region in this configuration includes no STI nor first contact, unlike the configuration disclosed in U.S. Unexamined Patent Application Publication No. 2016/0163906. Thus, a dark current can be reduced.

For example, the second semiconductor layer has one of (i) a same shape as the first semiconductor layer in plan view and (ii) a larger area than the first semiconductor layer in plan view.

With this configuration, the avalanche multiplication region is increased in size, which results in enhancement of the photosensitivity of the photodetector.

For example, the second semiconductor layer is disposed to cover a whole surface of the first main surface.

With this configuration, the avalanche multiplication region is further increased in size, which results in further enhancement of the photosensitivity of the photodetector.

For a configuration having a contact in the isolation region as disclosed in U.S. Unexamined Patent Application Publication No. 2016/0163906 and U.S. Pat. No. 9,178,100, the avalanche multiplication region cannot be increased in size because electric field concentration in an end part of the avalanche multiplication region needs to be prevented.

As disclosed in U.S. Unexamined Patent Application Publication No. 2016/0163906, the enriched region needs to be smaller than the anode region. For this reason, the multiplication region cannot be increased in size.

As disclosed In U.S. Pat. No. 9,178,100, the guard ring is interposed between the avalanche multiplication region and the contact to prevent the electric field concentration in the end part of the avalanche multiplication region. For this reason, the avalanche multiplication region cannot be increased in size.

For example, an impurity concentration of the second semiconductor layer increases with depth.

The photoelectric conversion layer laminated on the avalanche multiplication region needs to be thick. However, a thick photoelectric conversion layer causes a higher avalanche breakdown voltage in the configurations disclosed in WO 2008/004547, WO 2014/097519, and Japanese Unexamined Patent Application Publication No. 2015-5752. Moreover, for the configuration disclosed in Japanese Unexamined Patent Application Publication No. 2004-363437, a voltage higher than the avalanche breakdown voltage needs to be applied to the line.

In contrast, the photoelectric conversion film of the photodetector according to an aspect of the present disclosure can be thick without an increase in the avalanche breakdown voltage. This can achieve both a low avalanche breakdown voltage and a high photosensitivity.

For example, an impurity concentration distribution of the second semiconductor layer is roughly constant in the direction parallel to the first main surface.

This configuration reduces variations of the potential of the isolation region in the horizontal direction with respect to the top surface of the semiconductor substrate, and thus enables the avalanche multiplication region to have a uniform electric field. Thus, the avalanche multiplication region can be increased in size, resulting in an enhancement in the photosensitivity.

For example, the photodetector in accordance with the aspect of the present disclosure further includes a first well that is disposed in the circuit region, the first well comprising at least one first well, wherein the first well is of the first conductivity type and has a lower impurity concentration than the first semiconductor layer at an interface between the first well and the second semiconductor layer.

With this configuration, an electric field and a current generated in the first well can be reduced. Thus, power consumption is reduced.

For example, the first well is disposed further toward the second main surface than the first semiconductor layer is.

With this configuration, an electric field and a current generated in the first well can be further reduced. Thus, power consumption is further reduced.

For example, a gradient of an impurity concentration distribution of the second semiconductor layer is steeper toward the second main surface from the first main surface.

With this configuration, the charge generated in a deeper region can be drifted faster. This further reduces a response time taken from light reception by the photodetector to charge readout by the readout circuit, according to an aspect of the present disclosure. This also reduces variations in response time.

For example, an interface between the first semiconductor layer and the second semiconductor layer is closer to the second main surface than a part of a top surface of the second semiconductor layer is.

With this configuration, variations in the avalanche breakdown voltage are reduced.

For example, an impurity concentration of the first semiconductor layer is greater than an impurity concentration of the second semiconductor layer, in a region including an interface between the first semiconductor layer and the second semiconductor layer.

With this configuration, variations in the avalanche breakdown voltage are further reduced.

For example, an impurity concentration of the second semiconductor layer is at least $10^{16}$ cm$^{-3}$.

With this configuration, the avalanche breakdown voltage is 50 V or lower.

For example, the first semiconductor layer includes a region where an impurity concentration increases with depth.

With this configuration, the charge generated in an Si—SiO$_2$ interface (the first main surface) of the first semiconductor layer is drifted in a direction away from the avalanche multiplication region. Thus, a dark count rate (DCR) is reduced.

For example, the first semiconductor layer includes a second conductivity layer that is in contact with the first main surface of the semiconductor substrate.

With this configuration, the DCR is further reduced.

For example, in the photodetector in accordance with the aspect of the present disclosure, the first contact comprises a plurality of first contacts, the isolation transistor comprises a plurality of isolation transistors each of which is connected to a corresponding one among the plurality of first contacts, and the plurality of isolation transistors are disposed in a same circuit region.

This configuration reduces the size of the circuit region of the photodetector according to an aspect of the present disclosure. Thus, the aperture ratio can be further increased and miniaturization can also be achieved.

For example, at least two among the plurality of isolation transistors share the readout circuit.

This configuration further reduces the size of the circuit region of the photodetector according to an aspect of the present disclosure. Thus, the aperture ratio can be further increased and miniaturization can also be achieved.

For example, at least two among the plurality of isolation transistors share a drain connected to the readout circuit.

This configuration further reduces the circuit region in size. Thus, the aperture ratio can be further increased and miniaturization can also be achieved.

For example, the first semiconductor layer comprises N first semiconductor layers disposed in an N-polygon having an M-fold rotational symmetry to have the M-fold rotational symmetry, in plan view, where N is a positive integer not less than 3, and M is a positive integer not less than 2, the circuit region is disposed in a rotational center of the N-polygon having the M-fold rotational symmetry, and the isolation transistor comprises N isolation transistors disposed in the circuit region.

With this configuration, variations in the photosensitivity among the pixels included in the repeat cycle are reduced. This enhances the image quality of an image taken by the photodetector according to an aspect of the present disclosure.

For example, the readout circuit includes, in the circuit region: a reset transistor that is connected to the drain of the isolation transistor and resets the first semiconductor layer via the isolation transistor; a source follower transistor that reads an output signal from the isolation transistor; and a selection transistor that is connected to the source follower transistor.

With this configuration, the signal can be amplified for each pixel. This improves a signal-to-noise (S/N) ratio.

For example, a photodetector in accordance with another aspect of the present disclosure includes: a semiconductor substrate that has a first main surface and a second main surface opposed to the first main surface; a first semiconductor layer that is of a first conductivity type, and included in the semiconductor substrate and closer to the first main surface than to the second main surface; a second semiconductor layer that is of a second conductivity type different from the first conductivity type, and is included in the semiconductor substrate and interposed between the first semiconductor layer and the second main surface; a multiplication region that is included in the first semiconductor layer and the second semiconductor layer, and causes avalanche multiplication to a charge generated in the semiconductor substrate through photoelectric conversion, the multiplication region comprising at least two multiplication regions; and an isolation region that separates the at least two multiplication regions.

With this configuration, the charge photo-generated in the photoelectric conversion layer is drifted in the photoelectric conversion layer and enters the multiplication region where avalanche multiplication is thus caused. The charge generated through photoelectric conversion is amplified by avalanche multiplication.

This allows the incident light even with low intensity to be detected. More specifically, this configuration enhances the sensitivity (that is, the photosensitivity) of the photodetector.

This configuration eliminates the need for a contact or a STI in the isolation region, and thus can reduce the isolation region in size. Hence, the multiplication region of the photodetector can be increased in size, which results in enhancement of the photosensitivity.

For example, the photodetector further includes a second contact that is disposed on the second main surface, wherein one of a first charge and a second charge that are generated between the first semiconductor layer and the second semiconductor layer through photoelectric conversion flows outside the semiconductor substrate via the second contact, the second charge being opposite in polarity to the first charge.

With this configuration, the second charge, which is a charge carrier of the second conductivity type generated through photoelectric conversion and avalanche multiplication is discharged outside the photodetector via the contact disposed on the second main surface that is the backside of the semiconductor substrate. This can reduce temporal fluctuations and spatial non-uniformity in voltage of the backside of the semiconductor substrate. Thus, spatial and temporal fluctuations in the photodetection efficiency of the photodetector can be reduced.

For example, the isolation region separates the at least two multiplication regions according to a potential.

This configuration reduces the isolation region in size and increases the aperture ratio to achieve a higher photosensitivity, unlike the configurations disclosed in U.S. Unexamined Patent Application Publication No. 2016/0163906 and U.S. Pat. No. 9,178,100 in which a contact or an STI is disposed in the isolation region.

For example, the potential is greater than a voltage change in the first semiconductor layer caused by the charge generated through the avalanche multiplication.

With this configuration, even if a voltage change occurs in the first semiconductor layer, the two multiplication regions can be electrically separated by the isolation region. This prevents electrical color shifts caused by an overflow.

For example, the isolation region is depleted.

With this configuration, depletion of the isolation region allows the two multiplication regions to be separated at a shorter separation distance and also allows the electric field of the isolation region to be reduced. Thus, the photodetector according to an aspect of the present disclosure has an increased aperture ratio and an enhanced photosensitivity. Moreover, this configuration maintains the photosensitivity of the photodetector and also achieves miniaturization of the photodetector. Thus, the photodetector according to an aspect of the present disclosure has a higher aperture ratio.

For example, a region including the first semiconductor layer and the isolation region includes no shallow trench isolation (STI) nor contact.

With this configuration, a defect level density of the top surface of the semiconductor substrate can be reduced. Thus, generation of a dark current can be prevented.

For example, the second semiconductor layer has one of (i) a same shape as the first semiconductor layer in plan view and (ii) a larger area than the first semiconductor layer in plan view.

With this configuration, the avalanche multiplication region is increased in size, which results in enhancement of the photosensitivity of the photodetector.

For example, the first semiconductor layer comprises a plurality of first semiconductor layers, and the second semiconductor layer is continuously disposed in the semiconductor substrate to overlap with the plurality of first semiconductor layers in plan view.

With this configuration, the avalanche multiplication region is further increased in size, which results in further enhancement of the photosensitivity of the photodetector.

For a configuration having a contact in the isolation region as disclosed in U.S. Unexamined Patent Application Publication No. 2016/0163906 and U.S. Pat. No. 9,178,100, the avalanche multiplication region cannot be increased in size because electric field concentration in an end part of the avalanche multiplication region needs to be prevented.

As disclosed in U.S. Unexamined Patent Application Publication No. 2016/0163906, the enriched region needs to be smaller than the anode region. For this reason, the multiplication region cannot be increased in size.

As disclosed In U.S. Pat. No. 9,178,100, the guard ring is interposed between the avalanche multiplication region and the contact to prevent the electric field concentration in the end part of the avalanche multiplication region. For this reason, the avalanche multiplication region cannot be increased in size.

For example, an impurity concentration of the second semiconductor layer increases with depth.

The photoelectric conversion layer laminated on the avalanche multiplication region needs to be thick. However, a thick photoelectric conversion layer causes a higher avalanche breakdown voltage in the configurations disclosed in WO 2008/004547, WO 2014/097519, and Japanese Unexamined Patent Application Publication No. 2015-5752. Moreover, for the configuration disclosed in Japanese Unexamined Patent Application Publication No. 2004-363437, a voltage higher than the avalanche breakdown voltage needs to be applied to the line.

In contrast, the photoelectric conversion film of the photodetector according to an aspect of the present disclosure can be thick without an increase in the avalanche breakdown voltage. This can achieve both a low avalanche breakdown voltage and a high photosensitivity.

For example, an impurity concentration distribution of the second semiconductor layer is roughly constant in the direction parallel to the first main surface.

This configuration reduces variations of the potential of the isolation region in the horizontal direction with respect to the top surface of the semiconductor substrate, and thus enables the avalanche multiplication region to have a uniform electric field. Thus, the avalanche multiplication region can be increased in size, resulting in an enhancement in the photosensitivity.

The present disclosure provides a highly sensitive photodetector.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
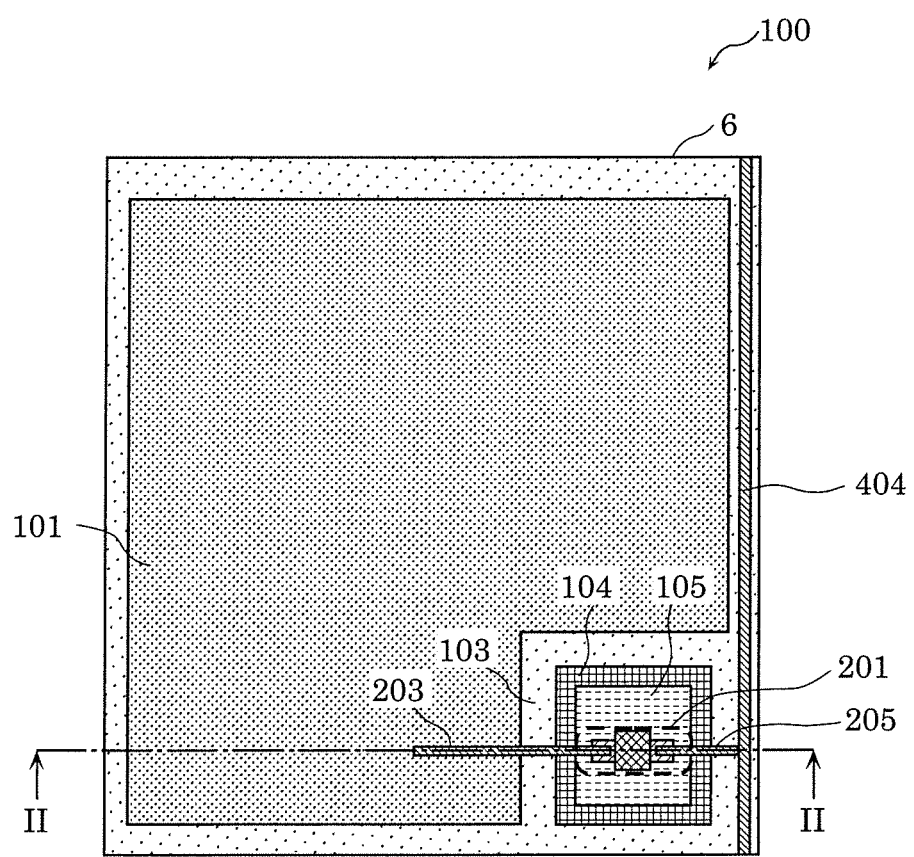
FIG. 1 is a plan view of a photodetector according to Embodiment 1 of the present disclosure.

Hereinafter, certain exemplary embodiments will be described in detail with reference to the accompanying Drawings. The following embodiments are specific examples of the present disclosure. The numerical values, shapes, materials, elements, arrangement and connection configuration of the elements, steps, the order of the steps, etc., described in the following embodiments are merely examples, and are not intended to limit the present disclosure. Among elements in the following embodiments, those not described in any one of the independent claims indicating the broadest concept of the present disclosure are described as optional elements.

Note that the respective figures are schematic diagrams and are not necessarily precise illustrations. Therefore, the scales or the like applied in the figures are not necessarily unified. Additionally, components that are essentially the same share like reference signs in the figures. Accordingly, overlapping explanations thereof are omitted or simplified.

A photodetector according to the present disclosure can be achieved by a combination of multiple embodiments.

In the following embodiments, the term "roughly" is used as in "roughly horizontal direction". For example, the term "roughly the same" means not only "completely the same" but also "substantially the same". Thus, this term indicates that there may be about several percent of difference, for example.

Moreover, a voltage value used in the present specification is indicated as relative to ground potential.

Furthermore, the terms "upward" and "downward" are used in the present specification. Note that these terms do not refer to an upward direction (vertically upward) and a downward direction (vertically downward) in an absolute space recognition. More specifically, these terms in the present specification are defined depending on a relative position relationship based on an order in which layers are laminated in a laminate structure. In the present specification, the side where a first main surface is disposed is the "upward" side of the semiconductor substrate and the side where a second main surface is disposed is the "downward" side of the semiconductor substrate. Note also that the terms "upward" and "downward" are used not only in the case where two structural elements are disposed to leave a space between these elements so that a different structural element is interposed between the two structural elements, but also in the case where the two structural elements are disposed to be in absolute contact with each other.

Moreover, the term "depth direction" used in the present specification does not refer to a direction in an absolute space recognition. More specifically, this term is defined by a direction in which the layers are laminated in the laminate structure. The "depth direction" used in the present specification refers to a direction that is parallel to the normal to the first main surface of the semiconductor substrate, and is a direction from the first main surface toward the second main surface of the semiconductor substrate.

Furthermore, the "plan view" in the present specification refers to a view seen from the normal direction of a light receiving surface of the photoelectric conversion layer. Moreover, the terms like "above (upward)" and "shallow" in the present specification are used to indicate a location toward a first main surface of an epitaxial layer in the cross-sectional view. Similarly, the terms like "below (downward)" and "deep" are used to indicate a location toward a second main surface of the epitaxial layer in the cross-sectional view.

Embodiment 1

Figure 2:
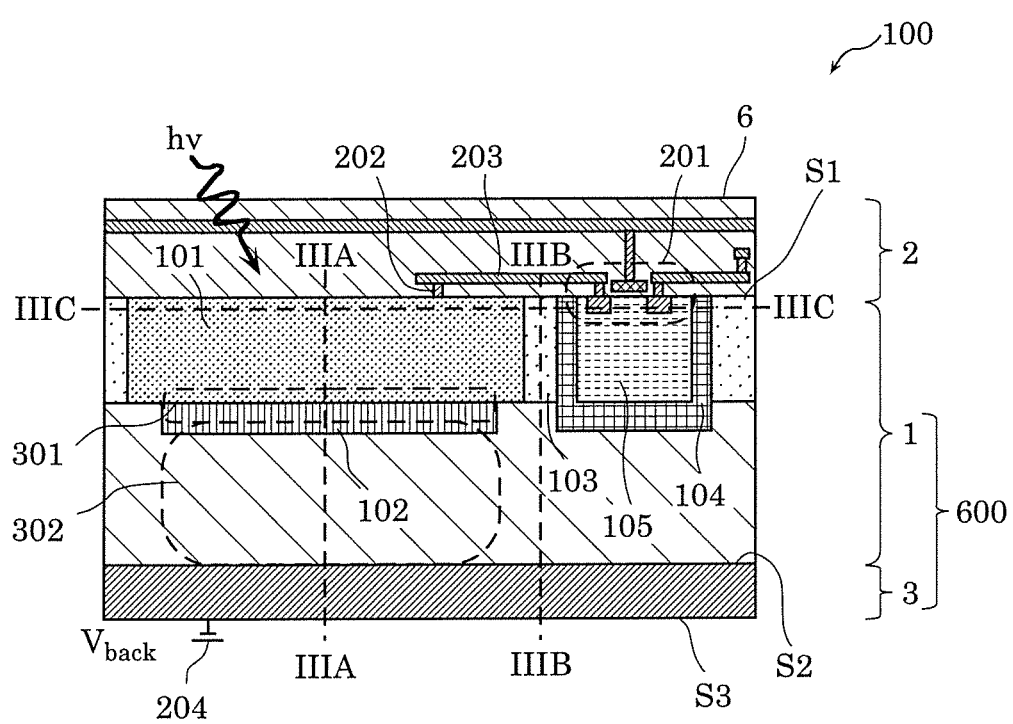
FIG. 2 is a cross-sectional view of the photodetector along line II-II of FIG. 1, according to Embodiment 1 of the present disclosure.

A configuration of a photodetector according to Embodiment 1 is first described, with reference to FIG. 1 and FIG. 2.

FIG. 1 is a plan view of photodetector 100 according to Embodiment 1 of the present disclosure. FIG. 2 is a cross-sectional view of photodetector 100 along line II-II of FIG. 1, according to Embodiment 1 of the present disclosure.

Figure 5:
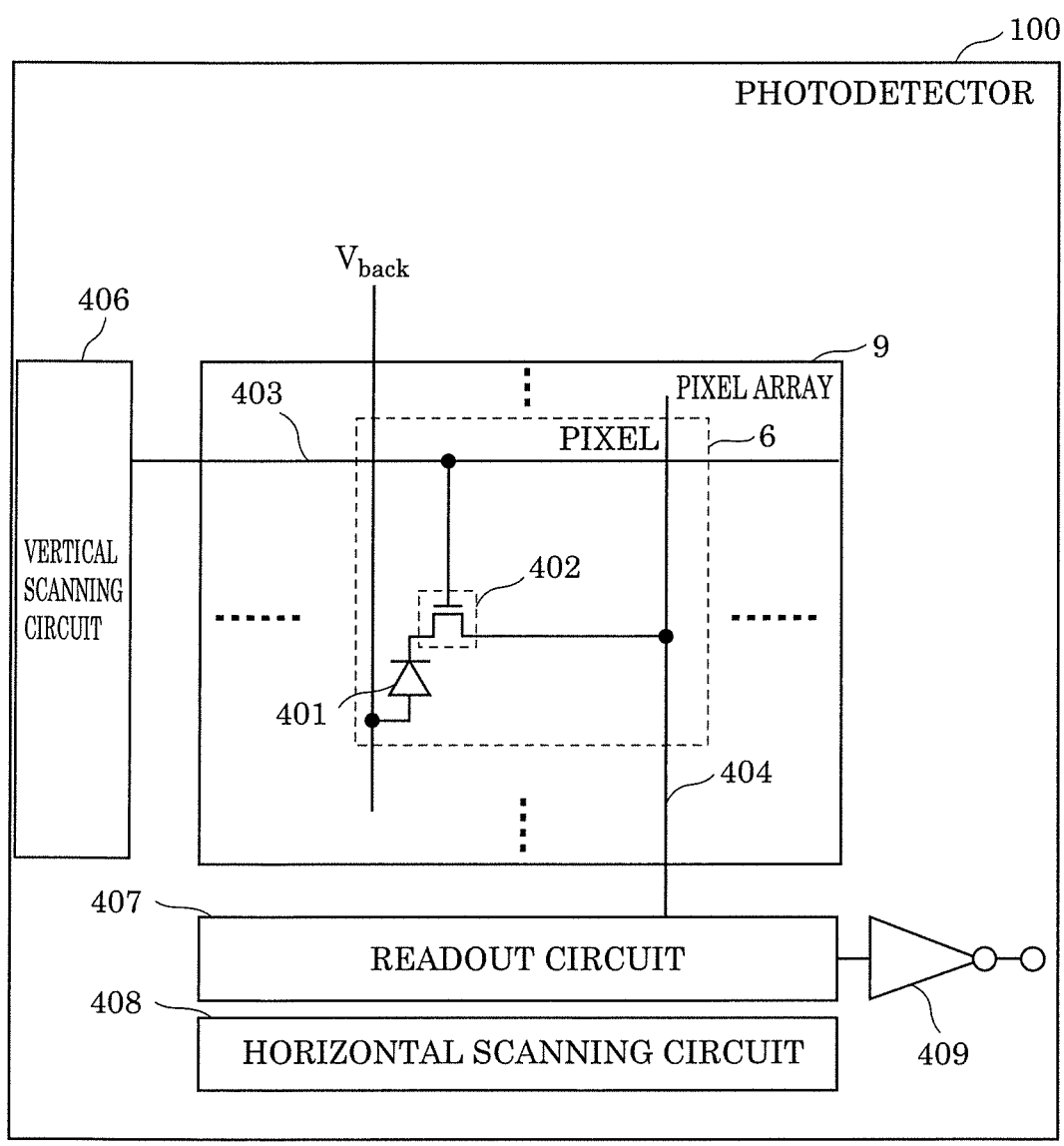
FIG. 5 illustrates an example of a circuit configuration of the photodetector according to Embodiment 1 of the present disclosure.

Note that each of FIG. 1 and FIG. 2 illustrates, among structural components included in photodetector 100, pixel 6 that includes first semiconductor layer 101, isolation region 103, first well 104 (circuit region), second well 105 (circuit region), isolation transistor 201, first line 203, and a row signal line that is included in readout circuit 407 (see FIG. 5). Thus, some of the structural components of photodetector 100 are omitted from FIG. 1 and FIG. 2. For example, some of the structural components, such as a line connected to a gate of isolation transistor 201, are omitted from FIG. 1. Note that some of the structural components of the photodetector according to the present disclosure may also be omitted from the other drawings described below.

Photodetector 100 according to Embodiment 1 is a photodetector sensor that includes an APD (avalanche photodiode). Photodetector 100 includes: semiconductor substrate 600 including epitaxial layer 1 and semiconductor substrate layer 3; and line layer 2. To be more specific, photodetector 100 includes: epitaxial layer 1 that is of a second conductivity type; line layer 2 disposed on first main surface S1 of semiconductor substrate 600 (or more specifically, epitaxial layer 1); and semiconductor substrate layer 3 disposed on a backside of semiconductor substrate 600. In the present specification, a semiconductor substrate refers to a combination of an epitaxial layer and a semiconductor substrate layer, which is a growth substrate for growing the epitaxial layer.

Photodetector 100 further includes: a circuit region where isolation transistor 201 is disposed; and readout circuit 407 (see FIG. 5) that is connected to a drain of isolation transistor 201 and reads a first charge included in a charge generated through photoelectric conversion between first semiconductor layer 101 and second semiconductor layer 102.

Epitaxial layer 1 includes: at least one first semiconductor layer 101 that is of a first conductivity type; second semiconductor layer 102 that is of the second conductivity type; first well 104 that is of the first conductivity type; second well 105 that is of the second conductivity type; isolation region 103 that is of the second conductivity type and interposed between first semiconductor layer 101 and first well 104; and isolation transistor 201 that is of the first conductivity type and disposed in second well 105.

The circuit region includes, for example, first well 104 of the first conductivity type and second well 105 of the second conductivity type. Isolation transistor 201 is of the first conductivity type, for example.

This configuration enhances the photosensitivity of photodetector 100. Moreover, this configuration also enhances flexibility in designing a circuit included in photodetector 100.

First semiconductor layer 101 is of the first conductivity type and included in semiconductor substrate 600 and closer to first main surface S1 than to second main surface S3. First contact 202 is disposed on first semiconductor layer 101. First contact 202 is an electrode for electrically connecting first semiconductor layer 101 to, for example, isolation transistor 201.

Second semiconductor layer 102 is included in semiconductor substrate 600 and interposed between first semiconductor layer 101 and semiconductor substrate layer 3. Second semiconductor layer 102 is of the second conductivity type that is opposite to the first conductivity type. Second semiconductor layer 102 causes avalanche multiplication to the charge generated through photoelectric conversion between second semiconductor layer 102 and first semiconductor layer 101.

First well 104 is disposed alongside first semiconductor layer 101 in a direction parallel to first main surface S1 of semiconductor substrate 600. First well 104 is a circuit region where circuits including at least one isolation transistor 201 are disposed.

Line layer 2 includes: first contact 202 that is an electrode disposed on first main surface S1 of first semiconductor layer 101; and first line 203 that is a metal line for electrically connecting first contact 202 to a source of isolation transistor 201.

Semiconductor substrate layer 3 is a growth substrate used for forming epitaxial layer 1. Semiconductor substrate layer 3 has: growth surface S2 for forming epitaxial layer 1; and second main surface S3 opposed to growth surface S2. Second contact 204 is disposed as a backside electrode on second main surface S3, which is a backside of semiconductor substrate layer 3 as well as a backside of semiconductor substrate 600. Upon the application of backside bias $V_{back}$ to semiconductor substrate layer 3, a voltage of growth surface S2 of epitaxial layer 1 is fixed to $V_{back}$ via semiconductor substrate layer 3.

Note that second well 105 is electrically connected to a ground. Note also that the transistor according to Embodiment 1 may be a metal oxide semiconductor field effect transistor (MOSFET) or a bipolar transistor, and is not intended to be limiting.

Multiplication region 301, which is roughly parallel to first main surface S1 of epitaxial layer 1, is interposed between first semiconductor layer 101 and second semiconductor layer 102.

Multiplication region 301 causes avalanche multiplication to multiply the charge generated by photoelectrically converting received light (indicated by "hv" in FIG. 2).

An electric field intensity of multiplication region 301 is $3*10^5$ V/cm to $5*10^5$ V/cm. Each of impurity concentrations of first semiconductor layer 101 and second semiconductor layer 102 is $10^{16}$ cm$^{-3}$ to $10^{20}$ cm$^{-3}$, for example. An impurity concentration of epitaxial layer 1 is $10^{14}$ cm$^{-3}$ to $10^{16}$ cm$^{-3}$, for example.

In this case, an amount of potential change in a depth direction of multiplication region 301 is 20 V, for example.

Note that the received light (that is, the incident light) is indicated by "hv" in the drawings of the present specification.

A second charge, which is a charge carrier of the second conductivity type generated through photoelectric conversion in photoelectric conversion layer 302 laminated below multiplication region 301, drifts to reach multiplication region 301. Then, the number of carriers remains the same or increases up to hundred-thousand-fold through avalanche multiplication. At this time, the first charge, which is a charge carrier of the first conductivity type generated through photoelectric conversion and avalanche multiplication, is accumulated in first semiconductor layer 101. The second charge generated through photoelectric conversion and avalanche multiplication is drifted to second contact 204 and discharged outside photodetector 100. To be more specific, the second charge, which is included in the charge generated through photoelectric conversion between first semiconductor layer 101 and second semiconductor layer 102 and opposite in polarity to the first charge, flows outside semiconductor substrate layer 3 via second contact 204.

Here, second contact 204 may be disposed on a whole surface of second main surface S3. Second contact 204 is made of a conductive material and disposed on the semiconductor layer (second semiconductor layer 102) of the second conductivity type or on the backside (i.e., second main surface S3). In particular, semiconductor substrate layer 3, which is the growth substrate for growing epitaxial layer 1, may be used as second contact 204. Moreover, second contact 204 may be made through carrier-density adjustment by, for example, impurity diffusion or ion implantation performed on the semiconductor layer of the second conductivity type.

Furthermore, the case where a second contact is disposed on the first main surface of the semiconductor substrate and a voltage is applied to the second contact via the semiconductor substrate is also included in the present disclosure.

Thus, the second charge that is not used as a signal is discharged outside photodetector 100 in a short time. On this account, temporal fluctuations and spatial non-uniformity in voltage of photodetector 100 can be reduced. This enhances the photodetection efficiency.

Upon activation of isolation transistor 201 that reads the charge generated through photoelectric conversion in semiconductor substrate 600 (or more specifically, first semiconductor layer 101 and second semiconductor layer 102), the first charge accumulated in first semiconductor layer 101 is transferred to readout circuit 407 (see FIG. 5) and processed as a signal. As a result of this, photodetector 100 detects the incident light.

Here, the first conductivity type may refer to a positive conductivity type (that is, P-type) and the second conductivity type may refer to a negative conductivity type (that is, N-type). Conversely, the first conductivity type may be a negative conductivity type and the second conductivity type may be a positive conductivity type. In other words, the first charge may be an electron and the second charge may be a positive hole.

An ionization rate of an electron is higher than that of a positive hole. Thus, the electron easily causes avalanche multiplication. For this reason, the aforementioned configuration enhances the photosensitivity of photodetector 100.

Here, charges generated through photoelectric conversion in isolation region 103, first well 104, and second well 105, and in a lower part of second well 105 do not contribute to the photosensitivity. Thus, isolation region 103, first well 104, and second well 105 may be small in size, and multiplication region 301 may be large in size.

In particular, a contact (or more specifically, first contact 202) or a shallow trench isolation (STI) is not disposed on isolation region 103 of photodetector 100 according to Embodiment 1. In addition, isolation region 103 is depleted and has an indefinite potential. To be more specific, no STI is included in the region where first semiconductor layer 101 and isolation region 103 are disposed.

This can reduce a width of isolation region 103 and thus increases an aperture ratio of photodetector 100.

In particular, a width of a depleted layer of multiplication region 301 in a vertical direction (a direction perpendicular to first main surface S) may be greater than a width of a depleted layer of isolation region 103 in a horizontal direction (the direction parallel to first main surface S) (that is, about half of a width of isolation region 103). This configuration easily reduces electric field concentration in an end part of multiplication region 301 and thus easily achieves a uniform electric field intensity. Thus, a region for avalanche multiplication can be increased so that the photosensitivity is easily enhanced.

For example, the width of isolation region 103 is 0.1 μm to 1 μm, and an impurity concentration of isolation region 103 is $10^{15}$ cm$^{-3}$ to $10^{18}$ cm$^{-3}$. A potential of isolation region 103 is determined depending on a potential of first semiconductor layer 101, a potential of first well 104, and the backside bias $V_{back}$.

If potential difference V between first semiconductor layer 101 and isolation region 103 is small, the number of saturated electrons is small. This easily develops charge leakage to an adjacent pixel. In contrast, if potential difference V between first semiconductor layer 101 and isolation region 103 is large, an electric field generated on a device surface (first main surface S1, for example) becomes large. This may unfortunately increase a dark current and a dark count rate. For this reason, the potential difference between first semiconductor layer 101 and isolation region 103 may be within a range from about 0.1 V to about 10 V.

A light incident surface according to Embodiment 1 is first main surface S1 of epitaxial layer 1.

This eliminates the need for performing a special process, such as backside treatment, and thus reduces cost. In particular, light of a long wavelength, such as near-infrared light, has a low optical absorption coefficient and attenuates only after approaching semiconductor substrate layer 3. On this account, the photosensitivity changes little regardless of whether photoelectric conversion layer 302 is disposed away from or near first main surface S1 of epitaxial layer 1. For example, an absorption coefficient of silicon (Si) for absorbing light with a wavelength of 940 nm having an ultrasmall solar spectral intensity in a near-infrared region is 1%/μm. Thus, even if photoelectric conversion layer 302 is disposed at a depth of 1 μm below first main surface S1, the photosensitivity decreases by 1%.

Here, an optical waveguide may be provided on multiplication region 301 in line layer 2, and a microlens may also be provided on line layer 2. This can enhance a light collection efficiency.

First semiconductor layer 101 is connected to the source of isolation transistor 201 by first line 203 passing across isolation region 103. The drain of isolation transistor 201 is connected to readout circuit 407 (see FIG. 5). A plurality of pixel circuits connected (such as isolation transistor 201) are disposed in the same well (second well 105, for example). This reduces an area of the circuit region in size and enhances the aperture ratio. Each of FIG. 1 and FIG. 2 illustrates an example in which the drain of isolation transistor 201 is connected to the row signal line.

Next, the potential of the first charge is described with reference to FIG. 3 and FIG. 4.

Figure 3:
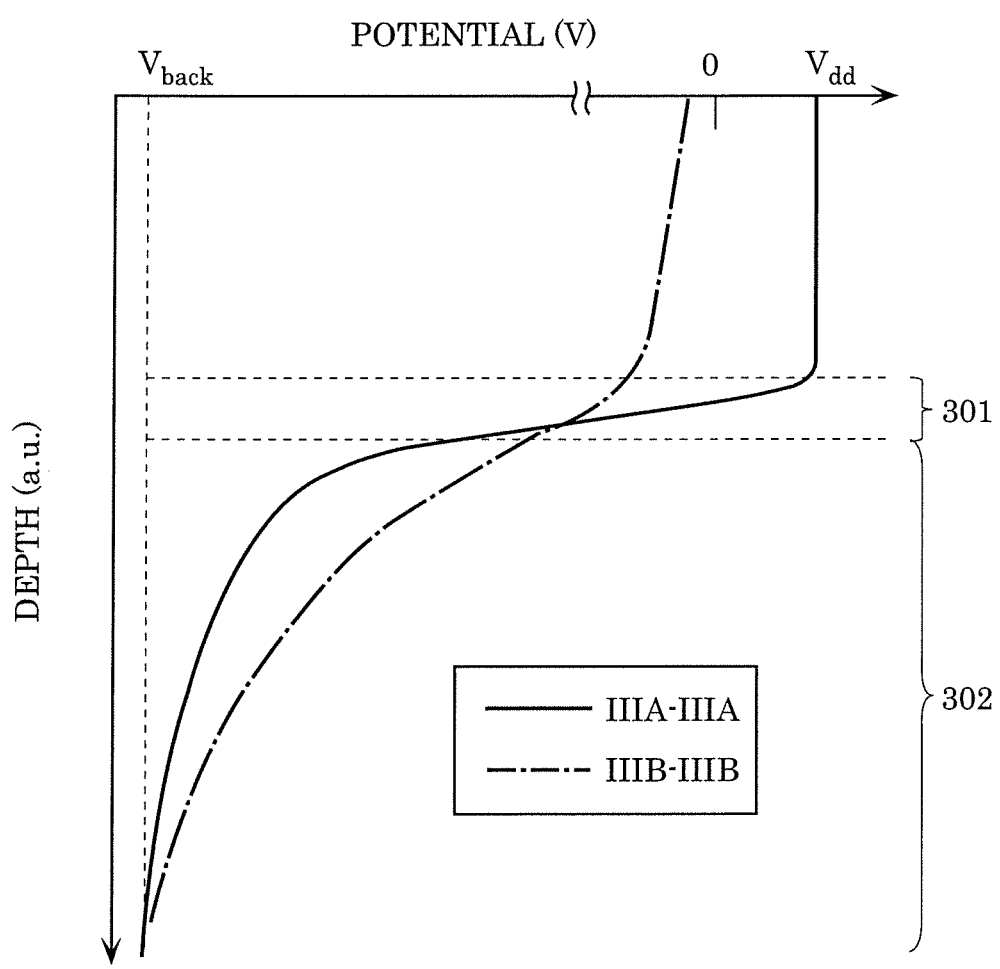
FIG. 3 illustrates potentials of the photodetector along line IIIA-IIIA and line IIIB-IIIB of FIG. 2, according to Embodiment 1 of the present disclosure.

FIG. 3 illustrates potentials of photodetector 100 along line IIIA-IIIA and line IIIB-IIIB of FIG. 2, according to Embodiment 1 of the present disclosure. FIG. 4 illustrates a potential of photodetector 100 along line IIIC-IIIC of FIG. 2, according to Embodiment 1 of the present disclosure.

A solid line illustrated in FIG. 3 indicates the potential along line IIIA-IIIA of FIG. 2, or more specifically, the potential of first semiconductor layer 101, multiplication region 301, and photoelectric conversion layer 302.

Upon activation of isolation transistor 201, first semiconductor layer 101 is connected to readout circuit 407 (see FIG. 5). Thus, a voltage of first semiconductor layer 101 is fixed at power voltage $V_{dd}$ of readout circuit 407 (see FIG. 5). A voltage of growth surface S2 of epitaxial layer 1 is fixed at voltage $V_{back}$ via semiconductor substrate layer 3.

Photoelectric conversion layer 302 may be depleted and have a potential gradient by which the charge is drifted to multiplication region 301.

If depleted and having a thickness of 5 μm, for example, photoelectric conversion layer 302 has a potential change of 20 V. If depleted and having a thickness of 15 μm, for example, photoelectric conversion layer 302 has a potential change of about 40 V.

Hereinafter, a voltage difference between first contact 202 and second contact 204 when a threshold voltage causing avalanche multiplication is applied to multiplication region 301 is referred to as an "avalanche breakdown voltage" in the present specification. In this case, if the thickness of photoelectric conversion layer 302 is 5 μm, the avalanche breakdown voltage is 40V, for example.

As illustrated in FIG. 3, the potentials along line IIIA-IIIA and line IIIB-IIIB approach $V_{back}$ with depth. In contrast, the potentials along line IIIA-IIIA and line IIIB-IIIB increase as first main surface S1 approaches. The potential along line IIIA-IIIA approaches $V_{dd}$. The potential along line IIIB-IIIB may be depleted and indefinite on first main surface S1.

Figure 4:
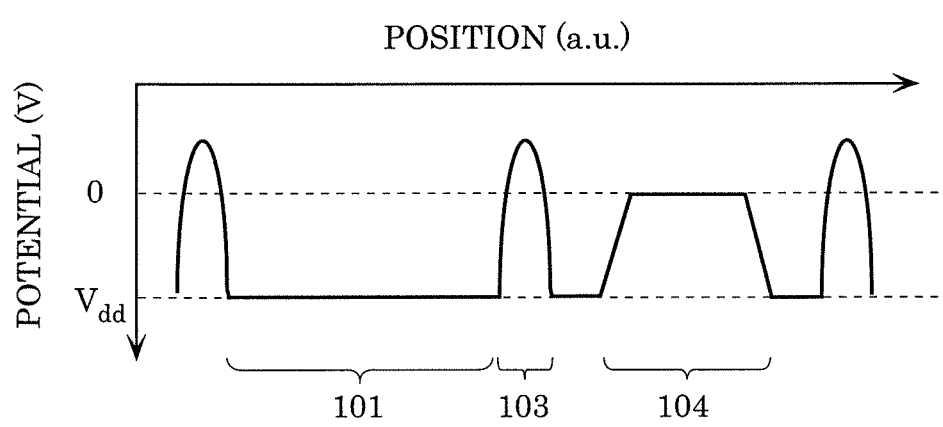
FIG. 4 illustrates a potential of the photodetector along line IIIC-IIIC of FIG. 2, according to Embodiment 1 of the present disclosure.

As illustrated in FIG. 4, first semiconductor layer 101 is biased at $V_{dd}$ and first well 104 is also biased at $V_{dd}$. Here, isolation region 103 is depleted and indefinite in potential. Thus, first semiconductor layer 101 and first well 104 are electrically separated. A potential difference between first semiconductor layer 101 and isolation region 103 may be $V_{dd}$ to 10 V.

For photodetector 100 having the configuration described above, isolation region 103 can be miniaturized and multiplication region 301 can be increased in size. This enhances the photosensitivity.

For example, suppose that a contact is disposed without depleting isolation region 103 as disclosed in U.S. Unexamined Patent Application Publication No. 2016/0163906. In this case, to maintain the electrical separation and also reduce the electric field in a direction roughly parallel to epitaxial layer 1 (that is, the direction parallel to first main surface S1), a separation width of at least 1 μm is typically required in the direction parallel to first main surface S1.

In contrast, isolation region 103 included in photodetector 100 according to Embodiment 1 is depleted. The depletion of isolation region 103 achieves the effect of reducing the electric field between first semiconductor layer 101 and isolation region 103. For this reason, the separation width can be reduced to 0.1 μm to 1 μm. In other words, photodetector 100 can be downsized.

Next, a circuit configuration of photodetector 100 according to Embodiment 1 is described with reference to FIG. 5.

FIG. 5 illustrates an example of the circuit configuration of photodetector 100 according to Embodiment 1 of the present disclosure. In the example illustrated in FIG. 5, readout circuit 407 is connected to vertical signal line 404, horizontal scanning circuit 408, and buffer amplifier 409. Although FIG. 5 illustrates only one set of APD 401 and transfer transistor 402, this set may be arranged in rows and columns to form an array.

As illustrated in FIG. 5, photodetector 100 includes APD 401, transfer transistor 402, horizontal signal line 403, vertical signal line 404, vertical scanning circuit 406, readout circuit 407, horizontal scanning circuit 408, and buffer amplifier 409.

APD 401 includes first semiconductor layer 101, multiplication region 301, and photoelectric conversion layer 302 that are illustrated in FIG. 2.

Upon activation of transfer transistor 402 of a row selected by vertical scanning circuit 406, the first charge, which is a signal charge photoelectrically converted and accumulated by APD 401, is transferred to readout circuit 407 via row signal line 205 and vertical signal line 404 illustrated in FIG. 1. Transfer transistor 402 includes isolation transistor 201 illustrated in FIG. 2, for example. The first charge transferred to readout circuit 407 is outputted via buffer amplifier 409 to a signal processing circuit (not shown) disposed downstream. After the signal processing circuit performs signal processing, such as white balance, the first charge is transferred to a display (not shown) and a memory (not shown), for example. Then, an image is created from the first charge, for example.

Backside bias $V_{back}$ may be switched between voltage Va (−20 V, for example) that is greater than or equal to the avalanche breakdown voltage and voltage Vn (−10 V, for example) that is smaller than or equal to the avalanche breakdown voltage. A circuit capable of selectively applying this voltage to APD 401 may be provided.

In this case, Vn is applied before imaging if a subject of imaging has high illumination, and Va is applied before imaging if the subject of imaging has low illumination. This enables imaging to be performed in accordance with the illumination condition, which ranges from an extremely dark condition where one to several photons enters single APD 401 to a condition where at least 10000 photons enters single APD 401 so that a typical camera can perform imaging.

Moreover, the voltage to be applied may be switched between Va and Vn for each frame. Then, image synthesis can create video with a wide dynamic range.

As described above, photodetector 100 according to Embodiment 1 includes: semiconductor substrate 600 that has first main surface S1 and second main surface S3 opposed to first main surface S1; first semiconductor layer 101 that is of the first conductivity type, and is included in semiconductor substrate 600 and closer to first main surface S1 than to second main surface S3; second semiconductor layer 102 that is of the second conductivity type different from the first conductivity type, and is included in semiconductor substrate 600 and interposed between first semiconductor layer 101 and second main surface S3; and multiplication region 301 that is included in first semiconductor layer 101 and second semiconductor layer 102, and causes, avalanche multiplication to the charge generated in semiconductor substrate 600 through photoelectric conversion. Moreover, photodetector 100 includes: a circuit region (or more specifically, first well 104 and second well 105) that is disposed alongside first semiconductor layer 101 in the direction parallel to first main surface S1; at least one isolation transistor that is disposed in the circuit region; isolation region 103 that is interposed between first semiconductor layer 101 and the circuit region; at least one first contact 202 that is disposed on first semiconductor layer 101; first line 203 that connects first contact 202 to a source of isolation transistor 201; and readout circuit 407 that is connected to a drain of isolation transistor 201 and reads a first charge included in the charge generated between first semiconductor layer 101 and second semiconductor layer 102 through photoelectric conversion.

With this configuration, first semiconductor layer 101 and isolation region 103 are electrically separated from each other by isolation region 103. This maintains the photosensitivity of photodetector 100 and also achieves miniaturization of photodetector 100. Thus, the aperture ratio of photodetector 100 is increased.

Modification

Figure 6:
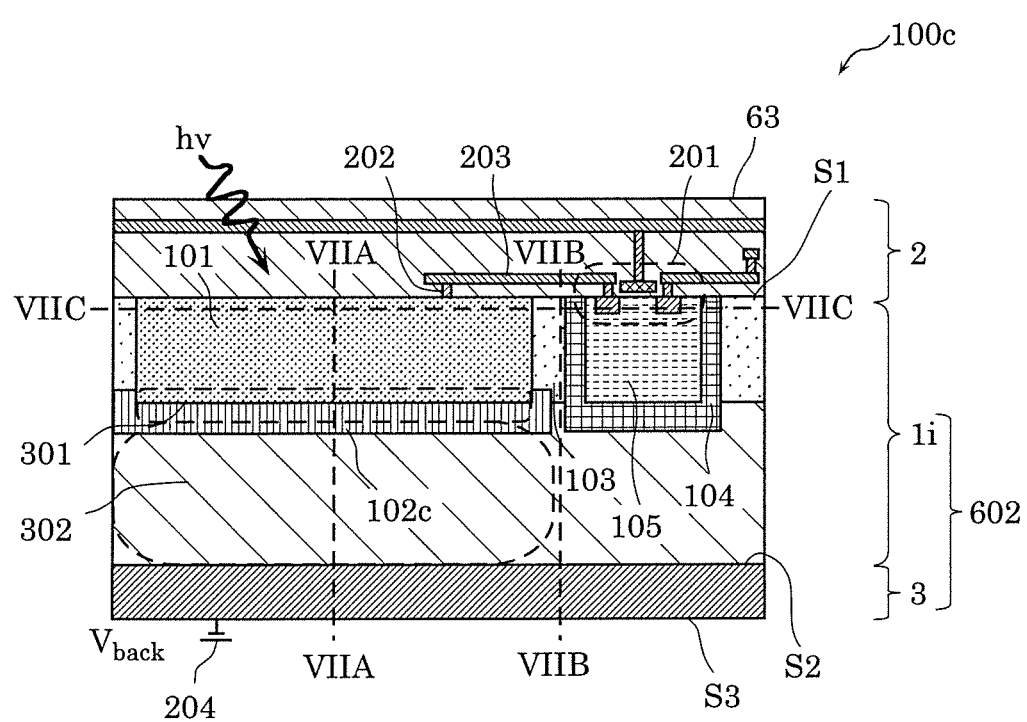
FIG. 6 is a cross-sectional view illustrating a photodetector according to a modification of Embodiment 1 of the present disclosure.

FIG. 6 is a cross-sectional view illustrating a photodetector according to Modification 1 of Embodiment 1 of the present disclosure.

Photodetector 100c according to this modification includes pixel 63 having epitaxial layer 1i that is different from the epitaxial layer included in photodetector 100. More specifically, epitaxial layer 1i is different in size from epitaxial layer 1 as seen in a plan view of second semiconductor layer 102c. Even more specifically, photodetector 100c according to this modification is different in width of second semiconductor layer 102c from photodetector 100 as seen in a cross-sectional view of second semiconductor layer 102c. To be more specific, photodetector 100c according to this modification is different from photodetector 100 in the width of second semiconductor layer 102c in the direction parallel to first main surface S1.

For example, second semiconductor layer 102c has the same shape as first semiconductor layer 101 in plan view or has a larger area than first semiconductor layer 101 in plan view. Moreover, second semiconductor layer 102c may be shared by a plurality of pixels 63.

With this configuration, the electric field becomes more uniform in the direction roughly parallel to first main surface S1 of semiconductor substrate 602, and multiplication region 301 is further increased in size. To be more specific, second semiconductor layer 102c is larger than first semiconductor layer 101. This further increases the aperture ratio of photodetector 100c, which may result in a higher photosensitivity.

Figure 7:
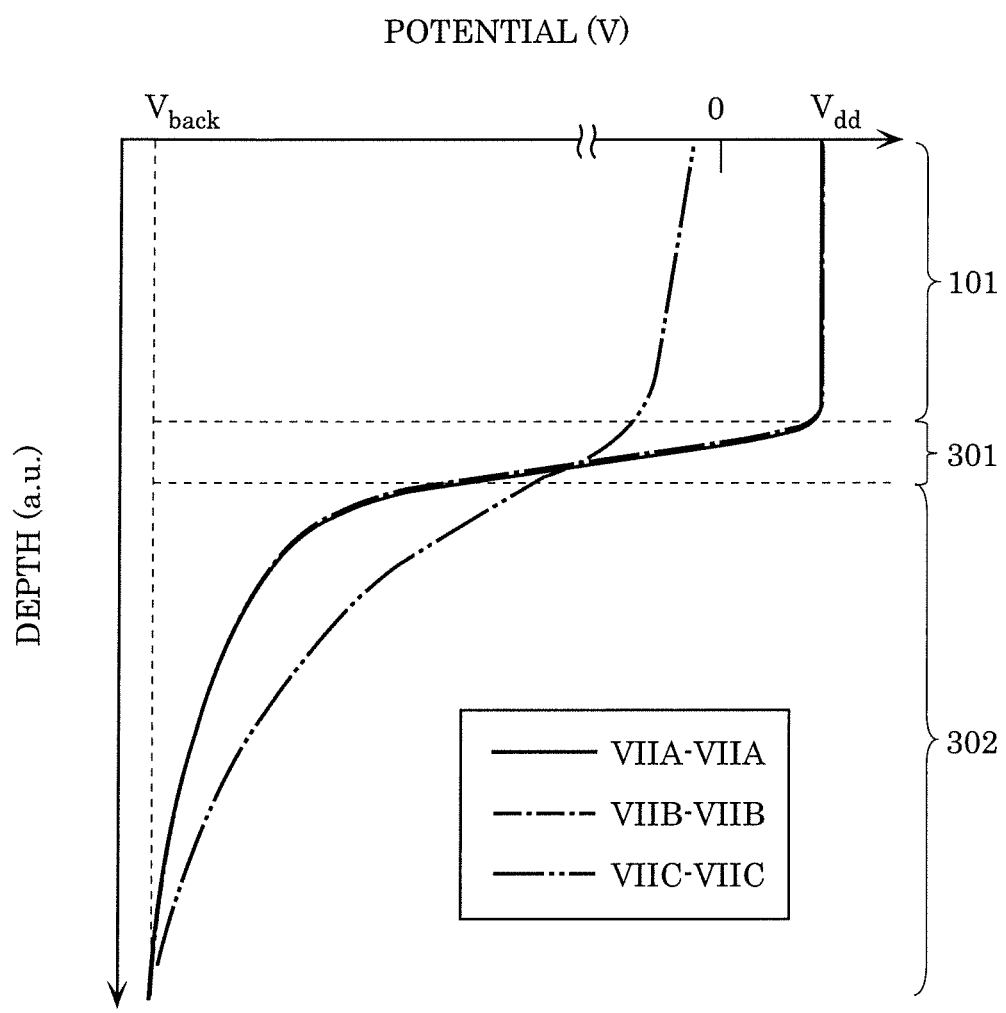
FIG. 7 illustrates potentials of the photodetector along line VIIA-VIIA, line VIIB-VIIB, and line VIIC-VIIC of FIG. 6, according to the modification of Embodiment 1 of the present disclosure.

FIG. 7 illustrates potentials of photodetector 100c along line VIIA-VIIA, line VIIB-VIIB, and line VIIC-VIIC of FIG. 6.

As can be seen from FIG. 7, a manner of variation in the potential of first semiconductor layer 101 stays about the same along the direction parallel to first main surface S1. This allows the electric field to be more uniform in the direction roughly parallel to first main surface S1 of semiconductor substrate 602 and also allows multiplication region 301 to be larger. To be more specific, second semiconductor layer 102c is larger than first semiconductor layer 101. This further increases the aperture ratio of photodetector 100c, which may result in a higher photosensitivity.

Embodiment 2

Figure 8:
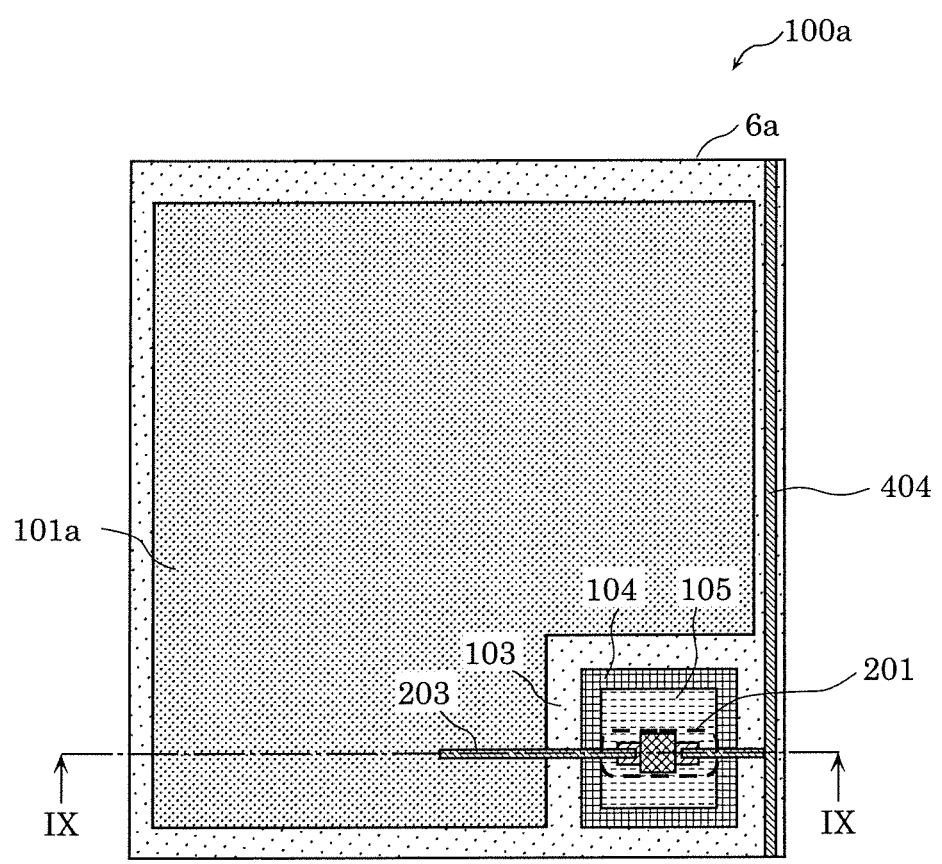
FIG. 8 is a plan view of a photodetector according to Embodiment 2 of the present disclosure.
Figure 9:
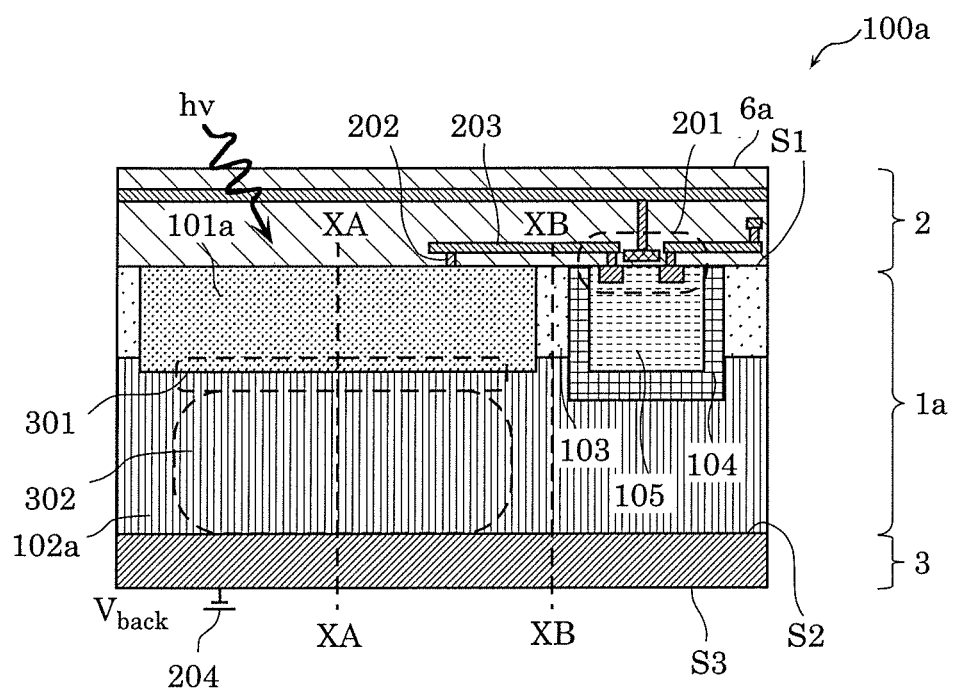
FIG. 9 is a cross-sectional view illustrating the photodetector along line IX-IX of FIG. 8, according to Embodiment 2 of the present disclosure.

A configuration of a photodetector according to Embodiment 2 is next described, with reference to FIG. 8 and FIG. 9.

In the following description on the photodetector according to Embodiment 2, components that are substantially the same as those included in the photodetector according to Embodiment 1 are assigned the same reference marks as used in Embodiment 1, and descriptions on these components may be partially omitted or simplified.

A peripheral circuit configuration of the photodetector according to Embodiment 2 may be similar to the circuit configuration of photodetector 100 according to Embodiment 1 as illustrated in FIG. 5 for example, and is thus omitted from the description.

FIG. 8 is a plan view of photodetector 100a according to Embodiment 2 of the present disclosure. FIG. 9 is a cross-sectional view illustrating photodetector 100a along line IX-IX of FIG. 8, according to Embodiment 2 of the present disclosure.

Second semiconductor layer 102a of pixel 6a included in photodetector 100a according to Embodiment 2 is disposed from an undersurface of first semiconductor layer 101a to growth surface S2. Second semiconductor layer 102a has a gradient of impurity concentration in a depth direction of epitaxial layer 1a.

Epitaxial layer 1a is made to have the impurity concentration that gradually increases to be higher toward growth surface S2 than toward first main surface S1. Here, this gradual increase refers to a constant or monotonic increase of the impurity concentration in the depth direction. In addition, this gradual increase also includes the cases where the impurity concentration stays constant in a certain region and where the impurity concentration increases stepwise.

A first charge generated in photoelectric conversion layer 302 through photoelectric conversion is drifted by a built-in potential to multiplication region 301 where avalanche multiplication is caused.

As illustrated in FIG. 9, second semiconductor layer 102a is disposed to entirely cover first main surface S1 of semiconductor substrate layer 3. To be more specific, second semiconductor layer 102a is disposed to cover a whole surface of the semiconductor substrate (that is, epitaxial layer 1a and semiconductor substrate layer 3) in a direction parallel to first main surface S1. In other words, second semiconductor layer 102a is disposed to entirely cover growth surface S2 of semiconductor substrate layer 3.

With this configuration, the electric field in second semiconductor layer 102a is roughly perpendicular to first main surface S1 of epitaxial layer 1a. This reduces the drift of the first charge in the horizontal direction (i.e., the direction parallel to first main surface S). Thus, the photosensitivity of photodetector 100a is enhanced. Moreover, photodetector 100a reduces color shifts.

Next, the potential of the first charge is described with reference to FIG. 10.

Figure 10:
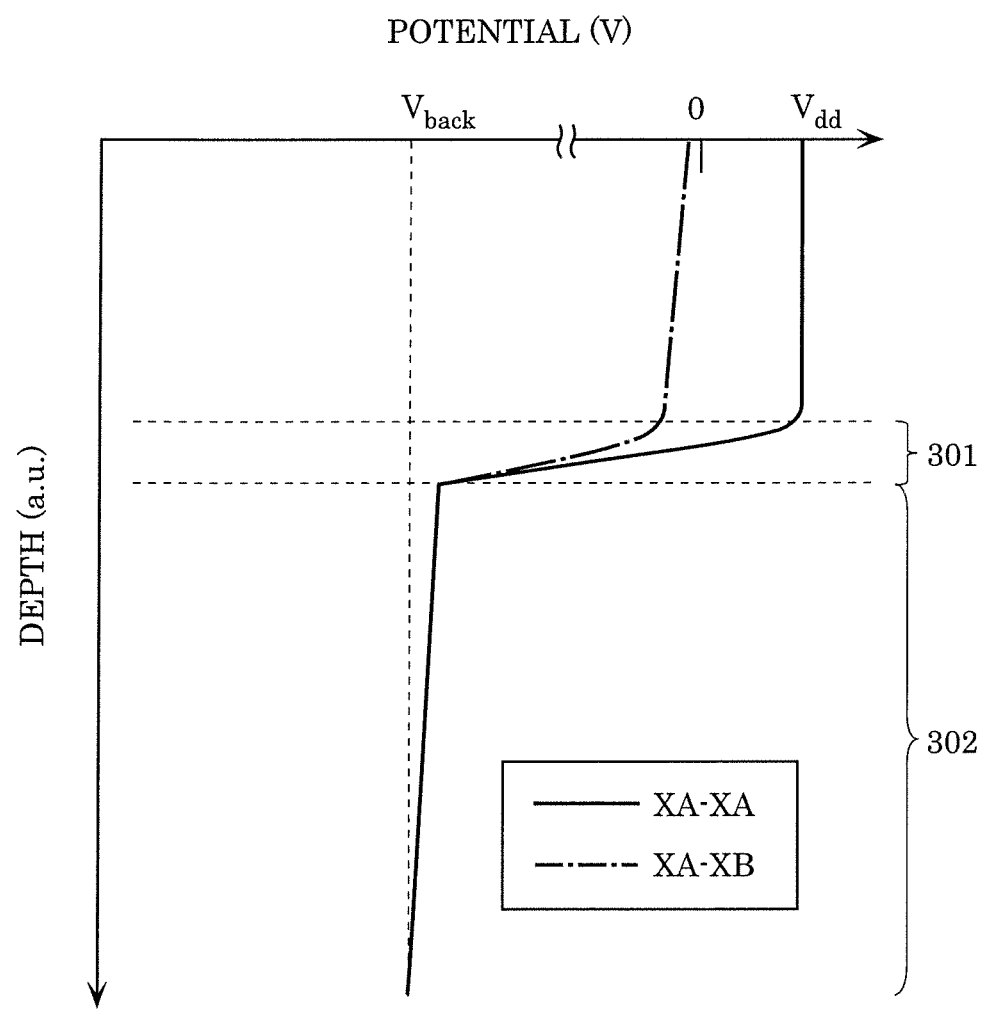
FIG. 10 illustrates potentials of the photodetector along line XA-XA and line XB-XB of FIG. 9, according to Embodiment 2 of the present disclosure.

FIG. 10 illustrates potentials of photodetector 100a along line XA-XA and line XB-XB of FIG. 9, according to Embodiment 2 of the present disclosure. A solid line illustrated in FIG. 10 indicates the potential along line XA-XA of FIG. 9, or more specifically, the potential of first semiconductor layer 101a, multiplication region 301, and photoelectric conversion layer 302.

As illustrated in FIG. 10, the potential gradient of the first charge in photoelectric conversion layer 302 is based on the built-in potential. On this account, the potential varies little in both ends of photoelectric conversion layer 302 in the vertical direction.

Thus, the avalanche breakdown voltage matches a potential difference between both ends of multiplication region 301 in the vertical direction. Such potential reduces the avalanche breakdown voltage as compared to a reach-through APD, which is a conventional configuration example as disclosed in WO 2014/097519 and Japanese Unexamined Patent Application Publication No. 2015-5752.

An impurity concentration of first semiconductor layer 101a is $10^{19}$ cm$^{-3}$, for example. An impurity concentration of second semiconductor layer 102a in multiplication region 301 is $10^{16}$ cm$^{-3}$ or more, for example.

Thus, the avalanche breakdown voltage is reduced to 20 V.

The potential of the first charge in a plane roughly parallel to first main surface S1 of epitaxial layer 1 is roughly constant.

Thus, the potential of the first charge along XA-XA line is the same as that along XB-XB line, in photoelectric conversion layer 302. On this account, the impurity concentration profile (impurity concentration distribution) along XB-XB line can be controlled only by the impurity concentration profile of a region at a shallower depth than multiplication region 301. As a result, variations of the potential of isolation region 103 can be easily reduced. This enhances yield of photodetector 100a.

When pixels 6a are arranged in an array to fabricate an APD image sensor, variations in dark current and dark count rate among pixels 6a are reduced. Thus, photodetector 100a including a plurality of pixels 6a is capable of outputting an image with less unevenness.

In particular, a width of a depleted layer of multiplication region 301 in a vertical direction (a direction perpendicular to first main surface S) may be greater than a width of a depleted layer of isolation region 103 in a horizontal direction (the direction parallel to first main surface S) (that is, about half of a width of isolation region 103). This configuration easily reduces electric field concentration in an end part of multiplication region 301 and thus easily achieves a uniform electric field intensity. Thus, a region for avalanche multiplication can be increased so that the photosensitivity is easily enhanced.

Next, an impurity concentration of photodetector 100a is described with reference to FIG. 11 and FIG. 12.

Figure 11:
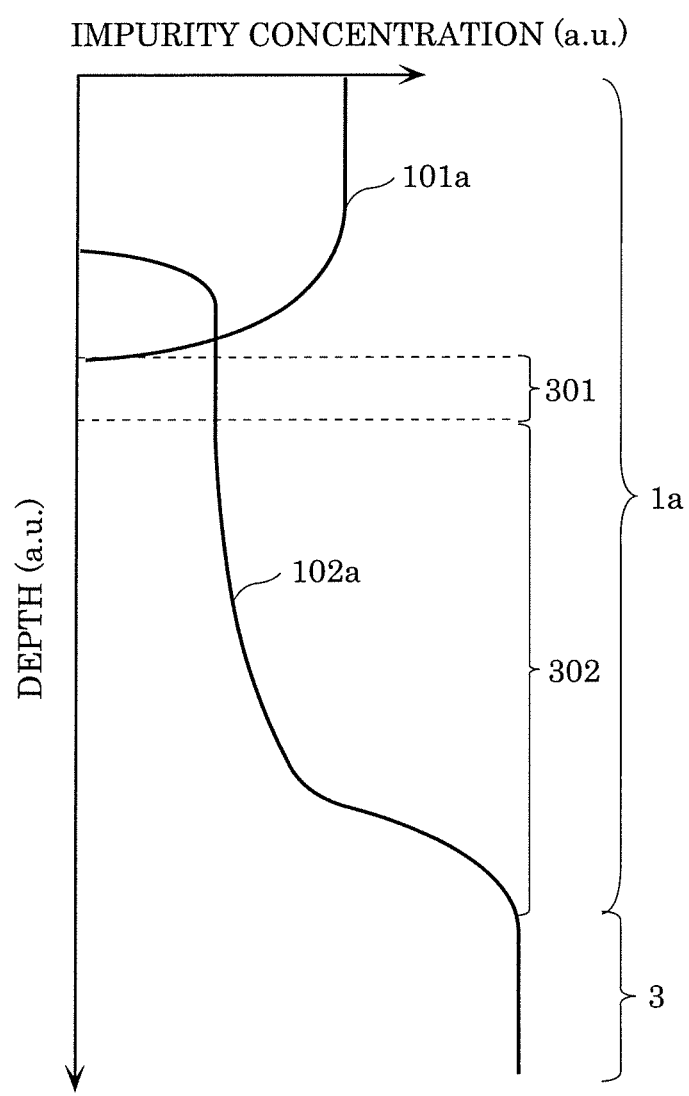
FIG. 11 illustrates an impurity concentration profile of the photodetector along line XA-XA of FIG. 9, according to Embodiment 2 of the present disclosure.

FIG. 11 illustrates the impurity concentration profile of photodetector 100a along line XA-XA of FIG. 9, according to Embodiment 2 of the present disclosure.

First semiconductor layer 101a has a higher impurity concentration near first main surface S1 so that first main S1 is not depleted. Then, the impurity concentration decreases with depth in multiplication region 301. A p-n junction is formed between first semiconductor layer 101a and second semiconductor layer 102a.

The impurity concentration gradually increases with depth in second semiconductor layer 102a.

This allows the first charge to drift from photoelectric conversion layer 302 to multiplication region 301.

For such an impurity concentration profile, the impurity concentration of first semiconductor layer 101a may be greater than that of second semiconductor layer 102a and, in addition, second semiconductor layer 102a may be shallower than first semiconductor layer 101a. To be more specific, an interface between first semiconductor layer 101a and second semiconductor layer 102a is closer to second main surface S3 than a part of a top surface of second semiconductor layer 102a is.

In a region including the interface between first semiconductor layer 101a and second semiconductor layer 102a, first semiconductor layer 101a has a greater impurity concentration than second semiconductor layer 102a.

Moreover, a gradient of the impurity concentration of second semiconductor layer 102a in multiplication region 301 may be smaller than that of second semiconductor layer 102a in photoelectric conversion layer 302. To be more specific, the gradient of the impurity concentration of second semiconductor layer 102a is steeper toward second main surface S3 that is a backside of semiconductor substrate layer 3 than toward first main surface S1 that is a frontside of epitaxial layer 1a.

This configuration allows the avalanche breakdown voltage to be less dependent on the concentration or depth of first semiconductor layer 101a. Thus, variations in the avalanche breakdown voltage are reduced, which in turn reduces the variations in the photosensitivity of photodetector 100a.

The gradient of the impurity concentration of second semiconductor layer 102a may be greater in a deeper region of epitaxial layer 1a and may be smaller in a shallower region of epitaxial layer 1a. To be more specific, the gradient of the impurity concentration of second semiconductor layer 102a is steeper toward second main surface S3 that is the backside of semiconductor substrate layer 3 than toward first main surface S1 that is the frontside of epitaxial layer 1a.

This allows the first charge generated in a deeper region of photoelectric conversion layer 302 to drift faster, and allows the first charge generated in a shallower region of photoelectric conversion layer 302 to drift slower. Thus, variations in response time can be reduced. Moreover, color shifts can be further reduced.

The impurity concentration distribution of second semiconductor layer 102a may be roughly constant in the direction parallel to first main surface S1 of epitaxial layer 1a.

This configuration further stabilizes the potential of isolation region 103.

Figure 12:
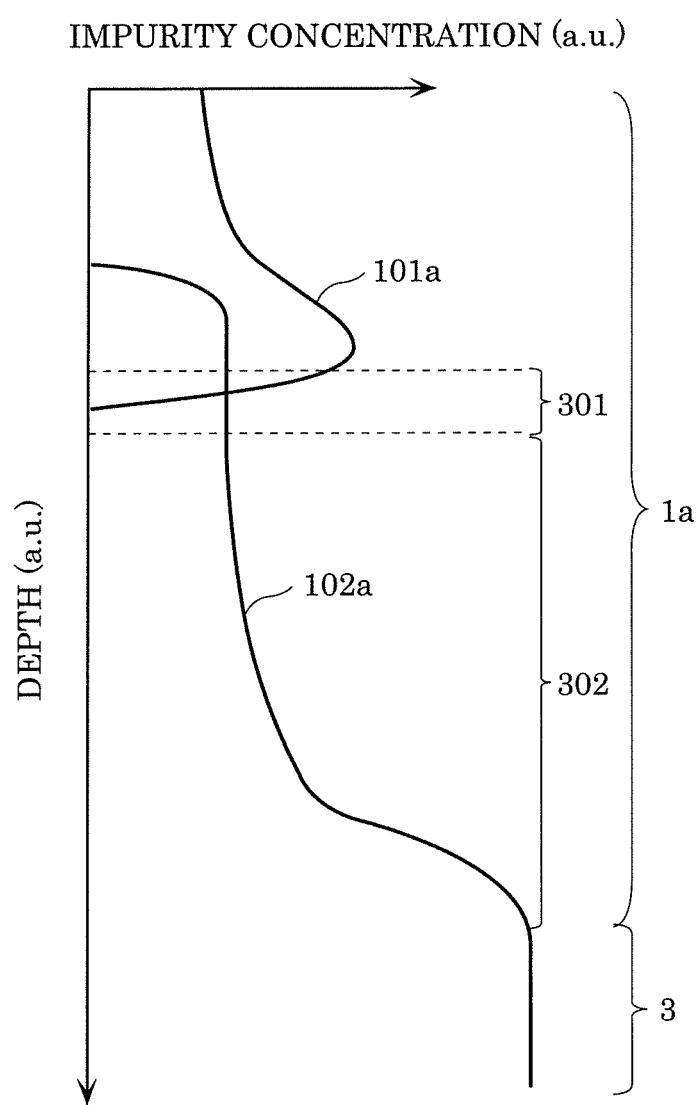
FIG. 12 illustrates an impurity concentration profile of the photodetector along line XA-XA of FIG. 9, according to a modification of Embodiment 2 of the present disclosure.

FIG. 12 illustrates an impurity concentration profile of photodetector 100a along line XA-XA of FIG. 9, according to a modification of Embodiment 2 of the present disclosure.

Unlike the impurity concentration distribution illustrated in FIG. 11, the impurity concentration of first semiconductor layer 101a in the impurity concentration distribution illustrated in FIG. 12 once increases with depth from a top surface of epitaxial layer 1a and then decreases with depth. In this way, first semiconductor layer 101a includes a region where the impurity concentration increases with depth.

This can keep the charge generated in first main surface S1 of epitaxial layer 1a from thermally diffusing into multiplication region 301. More specifically, such impurity concentration distribution can further reduce a dark current and a dark count rate.

Figures 13, 14:
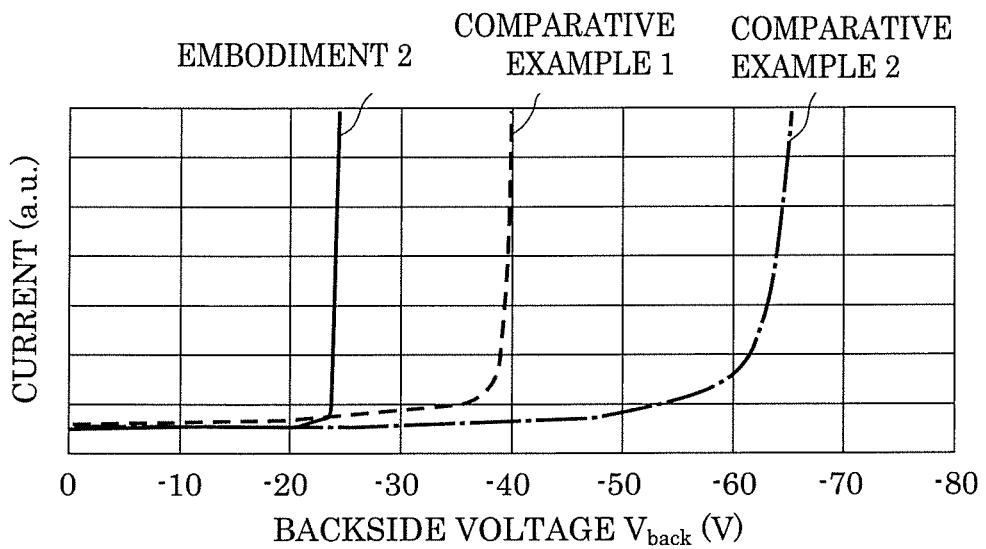
FIG. 13 illustrates an example of current-voltage characteristics of the photodetector according to Embodiment 2 of the present disclosure.
FIG. 14 illustrates an example of effects of reducing variations in avalanche breakdown voltage achieved by the photodetector according to Embodiment 2 of the present disclosure.

The following describes current-voltage characteristics of photodetector 100a including pixels 6a arranged in an array, with reference to FIG. 13 and FIG. 14.

FIG. 13 illustrates an example of the current-voltage characteristics of photodetector 100a according to Embodiment 2 of the present disclosure. FIG. 14 illustrates an example of effects of reducing variations in the avalanche breakdown voltage achieved by photodetector 100a according to Embodiment 2 of the present disclosure.

As illustrated in FIG. 14, the avalanche breakdown voltage of photodetector 100a according to Embodiment 2 is independent of a thickness of photoelectric conversion layer 302. The avalanche breakdown voltage is 24 V, for example.

Moreover, FIG. 14 illustrates comparative examples of the avalanche breakdown voltage in a reach-through APD having a configuration disclosed in WO 2014/097519 or Japanese Unexamined Patent Application Publication No. 2015-5752. As illustrated, if photoelectric conversion layer 302 has a thickness of 5 μm (indicated as comparative example 1 in FIG. 13), the avalanche breakdown voltage is 37 V. If photoelectric conversion layer 302 has a thickness of 15 μm (indicated as comparative example 2 in FIG. 13), the avalanche breakdown voltage is 64 V.

As can be seen, the avalanche breakdown voltage in photodetector 100a according to Embodiment 2 can be reduced.

Regardless of whether the thickness of photoelectric conversion layer 302 is 5 μm or 15 μm, the avalanche breakdown voltage is 24 V and a standard deviation of the avalanche breakdown voltage is 0.15 V according to Embodiment 2. In contrast, if the thickness of photoelectric conversion layer 302 included in the reach-through APD having the configuration disclosed in WO 2014/097519 or Japanese Unexamined Patent Application Publication No. 2015-5752 is 5 μm, the avalanche breakdown voltage is 37 V and the standard deviation of the avalanche breakdown voltage is 0.62 V. Moreover, if the thickness of this photoelectric conversion layer 302 is 15 μm in this configuration, the avalanche breakdown voltage is 64 V and the standard deviation of the avalanche breakdown voltage is 4.7 V.

In this way, variations in the avalanche breakdown voltage in photodetector 100a according to Embodiment 2 can be reduced. Thus, variations in the photosensitivity among the plurality of pixels 6a arranged in the array can be reduced. This enhances yield of photodetector 100a according to Embodiment 2. Moreover, the cost of fabricating photodetector 100a according to Embodiment 2 can be reduced.

Here, first well 104 is of the first conductivity type and may have a lower impurity concentration than first semiconductor layer 101a at an interface between first well 104 and first semiconductor layer 101a.

With this configuration, an electric field and a current generated in first well 104 can be reduced. Thus, power consumed to activate photodetector 100a is reduced.

First well 104 is disposed further toward second main surface S3 than first semiconductor layer 101a is.

This configuration can reduce the electric field generated in first well 104. Thus, power consumption is further reduced.

First well 104 may have a shallow region made of arsenic and a deep region made of phosphorus. Phosphorus has a higher thermal diffusion coefficient than arsenic, and thus is diffused by a heat treatment. Then, the concentration in first well 104 decreases at an interface between second semiconductor layer 102a and first well 104, which results in a decrease in electric field intensity. This reduces the current passing through first well 104 and thus reduces power consumption.

Modifications of Epitaxial Layer and Semiconductor Layer

The following describes modifications of the epitaxial layer and the semiconductor layer included in photodetector 100a according to Embodiment 2, with reference to FIG. 15 to FIG. 22.

Modification 1

Figure 15:
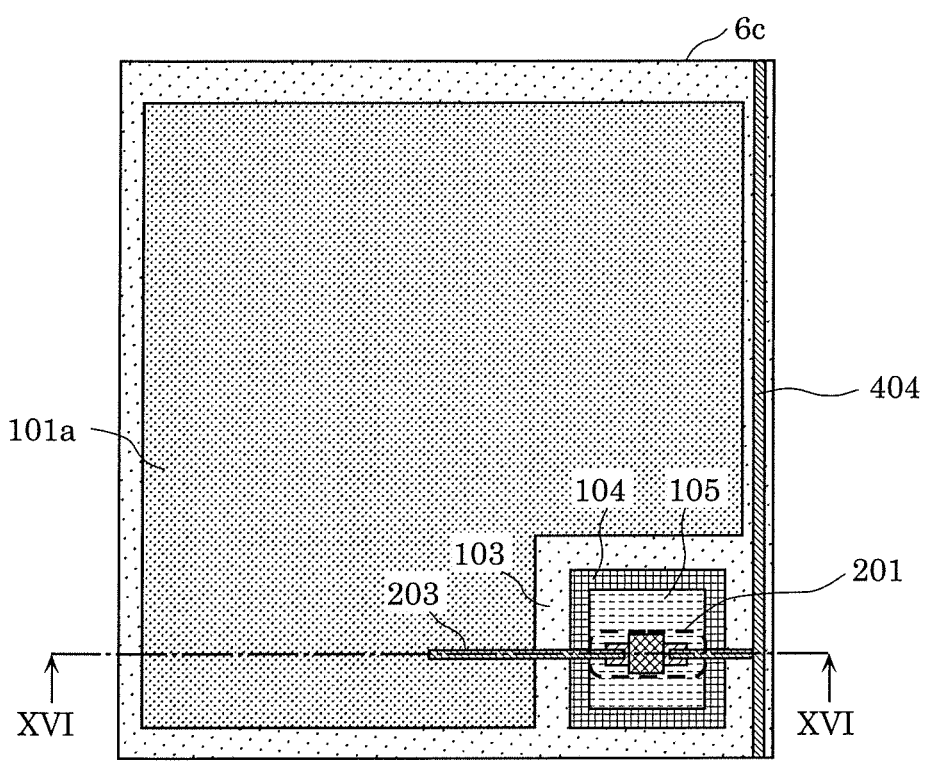
FIG. 15 is a plan view of a photodetector according to Modification 1 of Embodiment 2 of the present disclosure.
Figure 16:
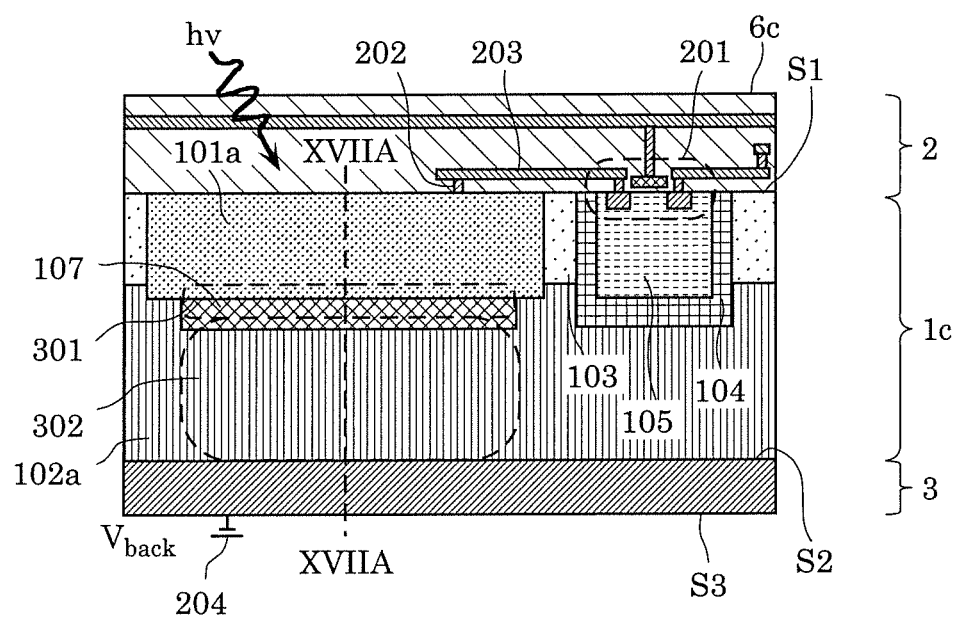
FIG. 16 is a cross-sectional view of the photodetector along line XVI-XVI of FIG. 15, according to Modification 1 of Embodiment 2 of the present disclosure.
Figure 17:
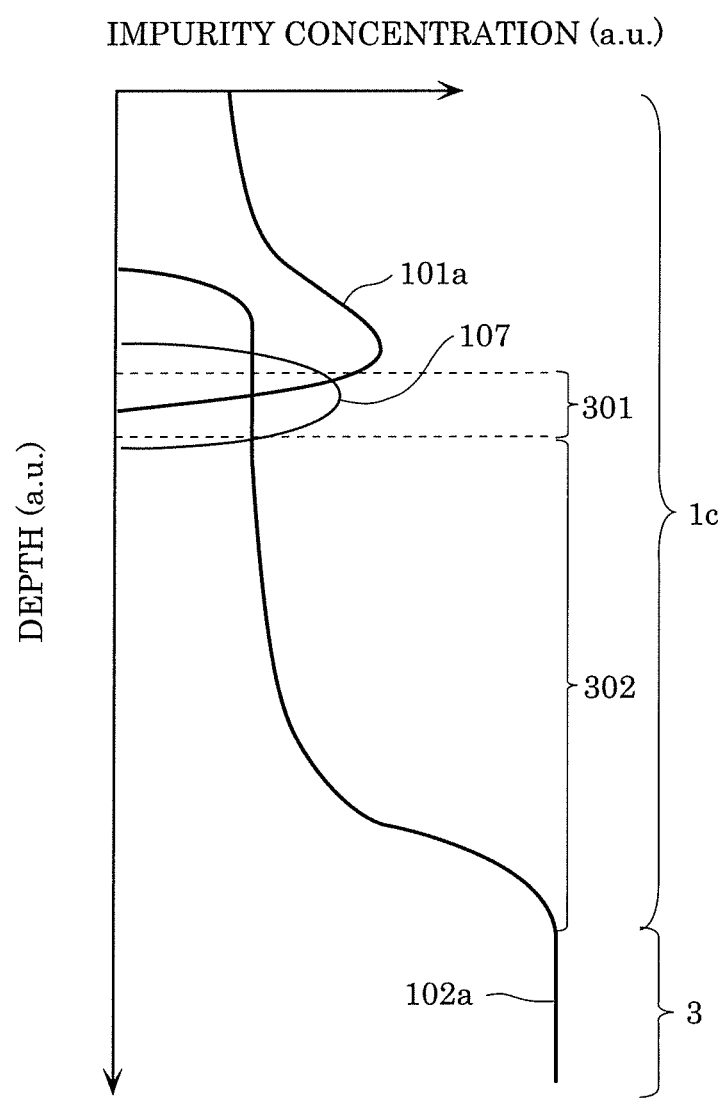
FIG. 17 illustrates an impurity concentration profile of the photodetector along line XVIIA-XVIIA of FIG. 16, according to Modification 1 of Embodiment 2 of the present disclosure.

FIG. 15 is a plan view of photodetector 100a according to Modification 1 of Embodiment 2 of the present disclosure. FIG. 16 is a cross-sectional view of photodetector 100a along line XVI-XVI of FIG. 15, according to Modification 1 of Embodiment 2 of the present disclosure. FIG. 17 illustrates an impurity concentration profile of photodetector 100a along line XVIIA-XVIIA of FIG. 16, according to Modification 1 of Embodiment 2 of the present disclosure.

As illustrated in FIG. 16, epitaxial layer 1c of pixel 6c according to Modification 1 of Embodiment 2 includes fourth semiconductor layer 107 in addition to the configuration of pixel 6a of photodetector 100a according to Embodiment 2.

Fourth semiconductor layer 107 is interposed between first semiconductor layer 101a and second semiconductor layer 102a. Moreover, fourth semiconductor layer 107 is of the second conductivity type.

As illustrated in FIG. 17, fourth semiconductor layer 107 in multiplication region 301 has a higher impurity concentration than second semiconductor layer 102a. In this case, fourth semiconductor layer 107 may be depleted.

With this configuration, an electric field generated in multiplication region 301 is large. Thus, the avalanche breakdown voltage is further reduced.

Modification 2

Figure 18:
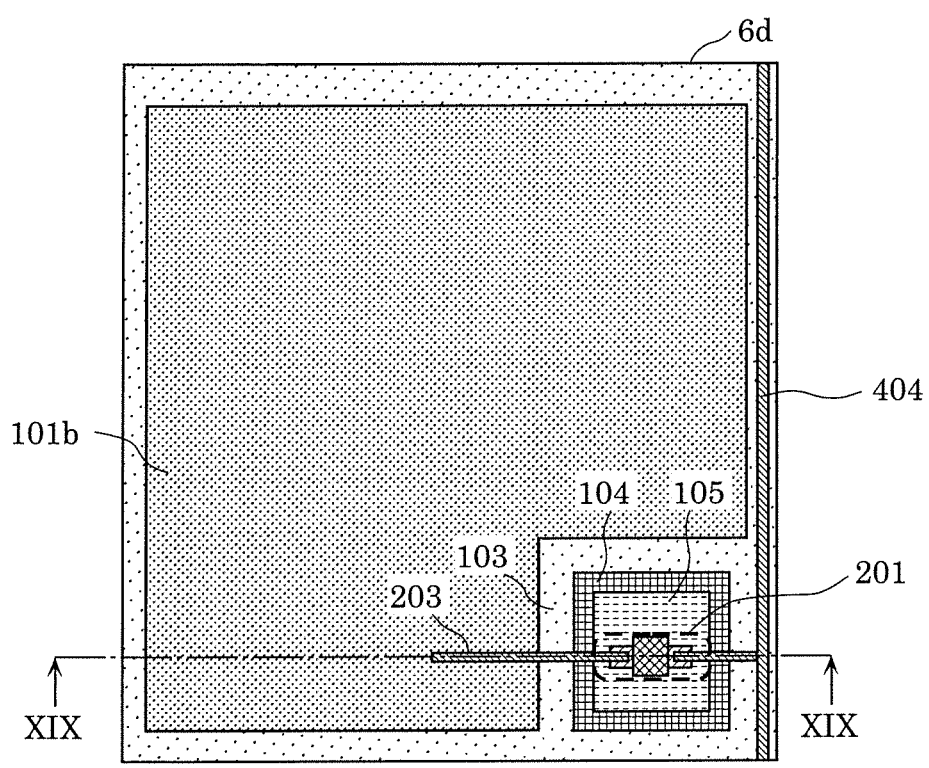
FIG. 18 is a plan view of a photodetector according to Modification 2 of Embodiment 2 of the present disclosure.
Figure 19:
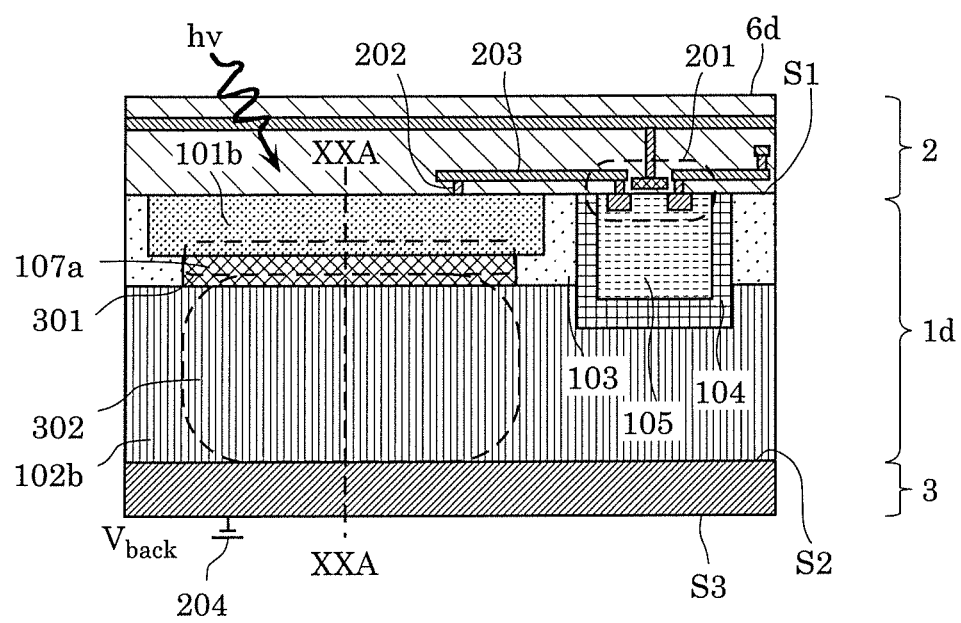
FIG. 19 is a cross-sectional view of the photodetector along line XIX-XIX of FIG. 18, according to Modification 2 of Embodiment 2 of the present disclosure.
Figure 20:
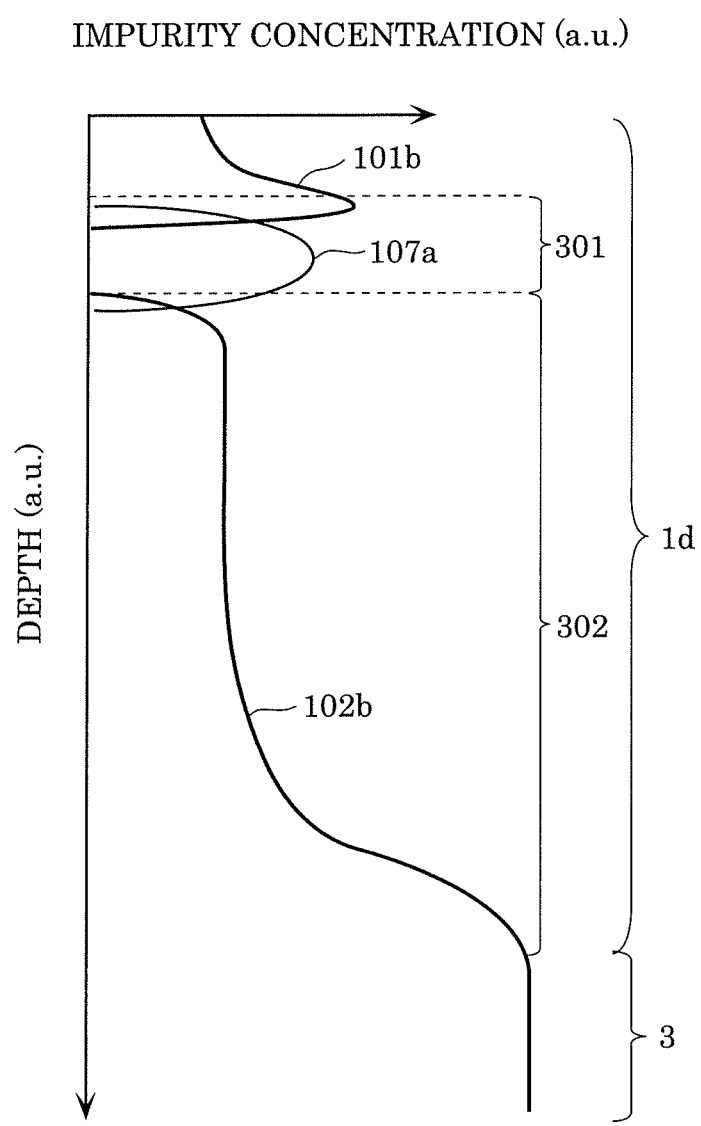
FIG. 20 illustrates an impurity concentration profile of the photodetector along line XXA-XXA of FIG. 19, according to Modification 2 of Embodiment 2 of the present disclosure.

FIG. 18 is a plan view of photodetector 100a according to Modification 2 of Embodiment 2 of the present disclosure. FIG. 19 is a cross-sectional view of photodetector 100a along line XIX-XIX of FIG. 18, according to Modification 2 of Embodiment 2 of the present disclosure. FIG. 20 illustrates an impurity concentration profile of photodetector 100a along line XXA-XXA of FIG. 19, according to Modification 2 of Embodiment 2 of the present disclosure.

As illustrated in FIG. 19, pixel 6d of photodetector 100a according to Modification 2 of Embodiment 2 includes fourth semiconductor layer 107a, similar to pixel 6c according to Modification 1.

Fourth semiconductor layer 107a and isolation region 103 are disposed below first semiconductor layer 101b. Second semiconductor layer 102b is disposed below fourth semiconductor layer 107a and isolation region 103. More specifically, epitaxial layer 1d of pixel 6d includes first semiconductor layer 101b and second semiconductor layer 102b that are not in direct contact with each other.

As illustrated in FIG. 20, fourth semiconductor layer 107a in multiplication region 301 has a higher impurity concentration than second semiconductor layer 102b.

With this configuration, an electric field generated in multiplication region 301 is also large. Thus, the avalanche breakdown voltage is further reduced.

Modification 3

Figure 21:
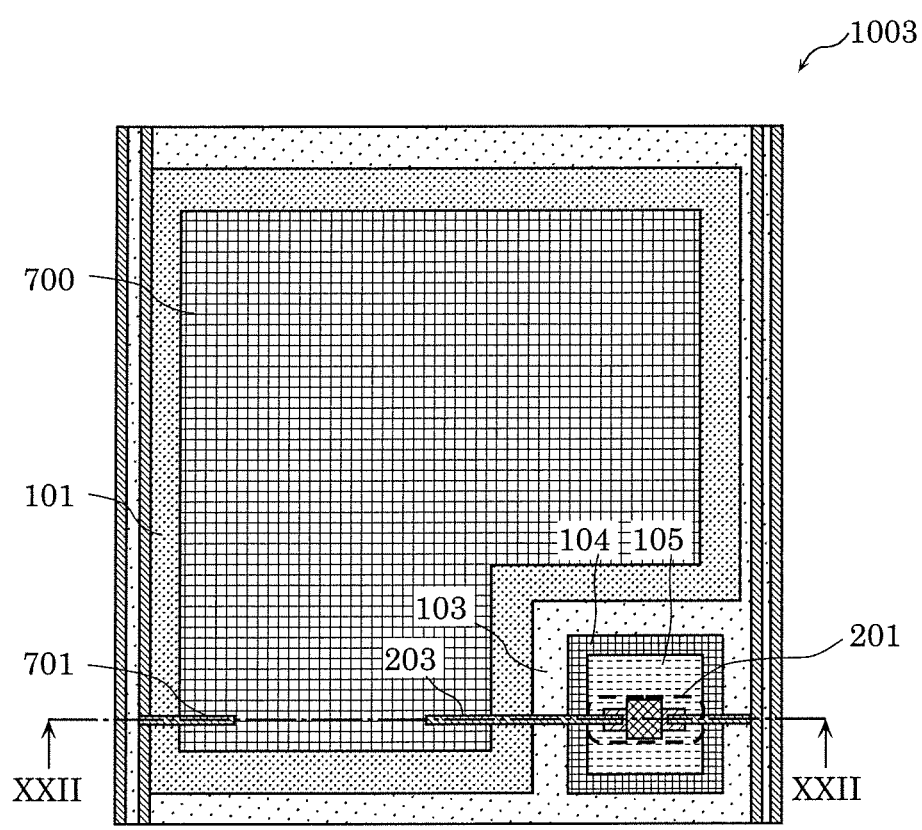
FIG. 21 is a plan view of a photodetector according to Modification 3 of Embodiment 2 of the present disclosure.
Figure 22:
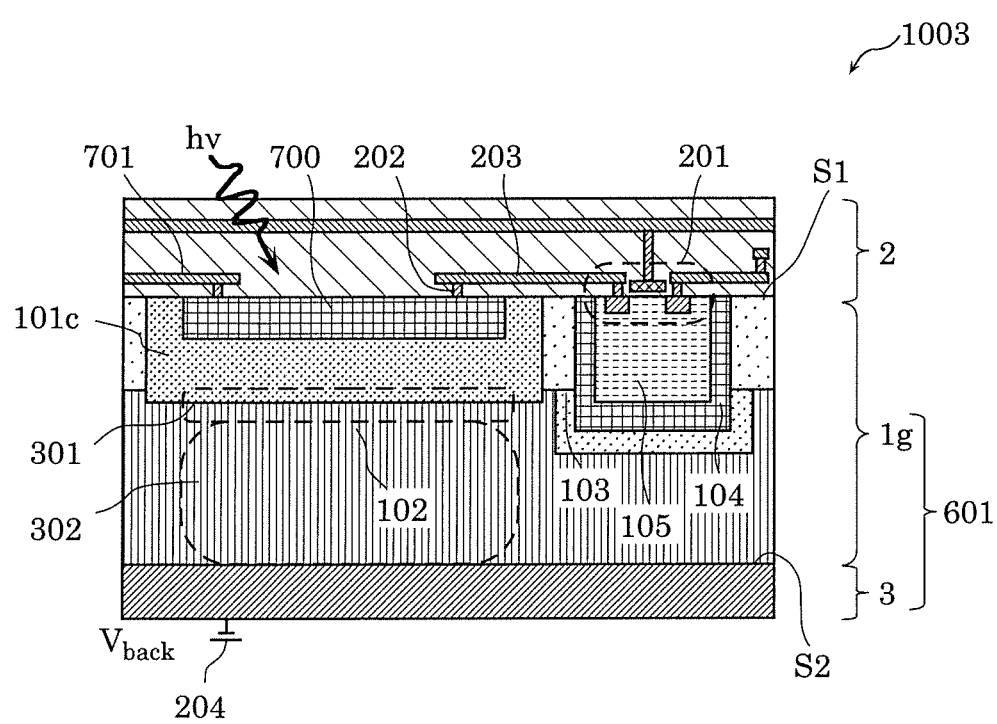
FIG. 22 is a cross-sectional view of the photodetector along line XXII-XXII of FIG. 21, according to Modification 3 of Embodiment 2 of the present disclosure.

FIG. 21 is a plan view of the photodetector according to Modification 3 of Embodiment 2 of the present disclosure. FIG. 22 is a cross-sectional view of the photodetector along line XXII-XXII of FIG. 21, according to Modification 3 of Embodiment 2 of the present disclosure.

Photodetector 1003 includes second conductivity layer 700 in first semiconductor layer 101*c* of epitaxial layer 1*g*. Second conductivity layer 700 is different in conductivity type from first semiconductor layer 101*c*. To be more specific, photodetector 1003 includes second conductivity layer 700, which is of the second conductivity type, in first semiconductor layer 101*c* that is closer to first main surface S1 than multiplication region 301 in semiconductor substrate 601. Even more specifically, first semiconductor layer 101*c* includes second conductivity layer 700 that is in contact with first main surface S1 of semiconductor substrate 601.

Second conductivity layer 700 is connected to contact 701 (electrode) and is applied with a voltage via contact 701. Second conductivity layer 700 is applied with a voltage lower than a voltage applied to first semiconductor layer 101*c*. In other words, second conductivity layer 700 and first semiconductor layer 101*c* are reversely biased with respect to each other. Here, a reverse bias that causes no breakdown is applied to second conductivity layer 700 and first semiconductor layer 101*c*. As a result, a charge generated due to a defect in first main surface S1 is discharged from contact 701 to outside semiconductor substrate 601. Thus, a dark current and a dark count rate (DCR) that may result in noise can be reduced.

Pixel Array

The following describes a layout of a pixel array having a plurality of pixels included in the photodetector according to the present disclosure, with reference to FIG. 23 to FIG. 35. In FIG. 23 to FIG. 35, structural components included in the pixel array, such as the first semiconductor layer, the isolation transistor, and the vertical signal line, are illustrated. However, some of the structural components included in the pixel array are omitted from the illustration. Each of pixel arrays in FIG. 23 to FIG. 35 may adopt any of pixels 6, 63, 6*a*, 6*c*, and 6*d* described above. Thus, the pixel arrays illustrated in FIG. 23 to FIG. 35 may be adopted into photodetector 100 according to Embodiment 1, photodetector 100*a* according to Embodiment 2, or any modification of Embodiments 1 and 2.

Figure 34:
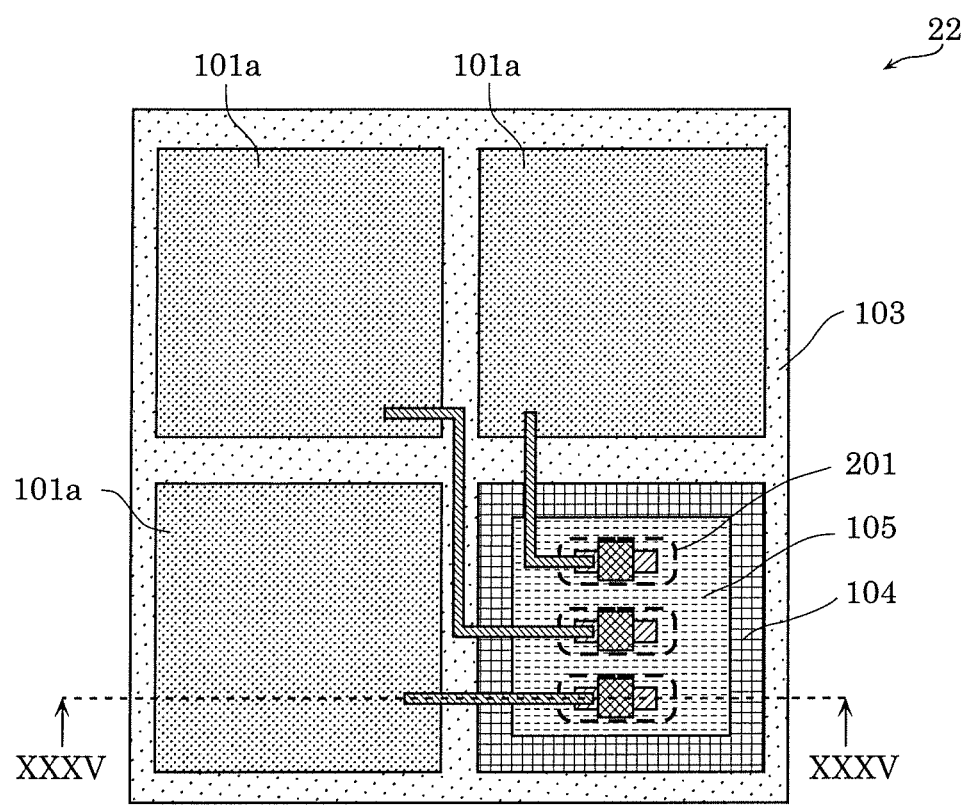
FIG. 34 illustrates Example 12 of pixel layout of the photodetector according to the present disclosure.
Figure 35:
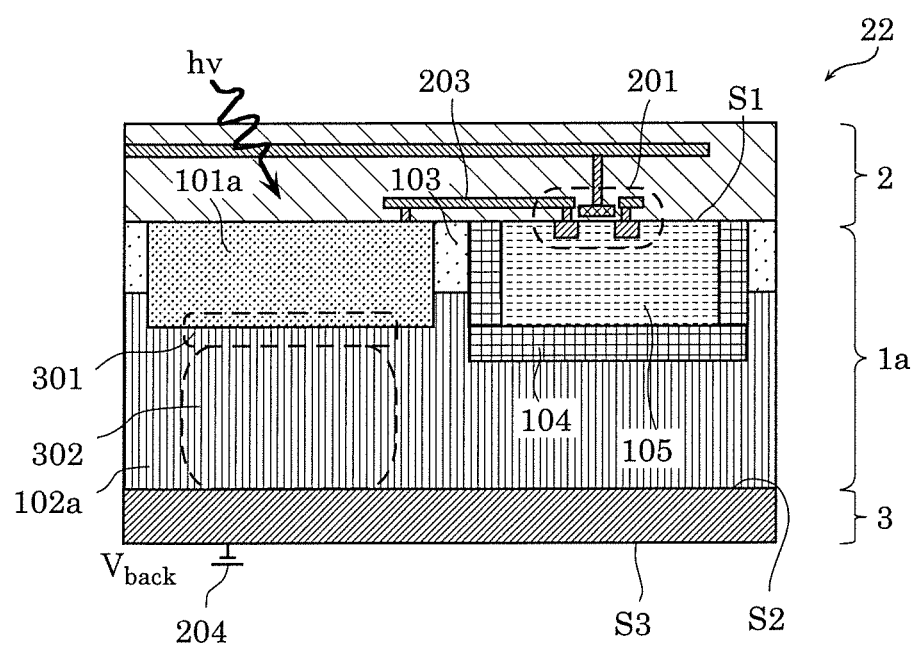
FIG. 35 is a cross-sectional view of Example 12 of pixel layout of the photodetector along line XXXV-XXXV of FIG. 34, according to the present disclosure.

Structural components having substantially the same function may be assigned the same reference mark in FIG. 23 to FIG. 35. For example, although having different shapes in the respective pixel arrays, all the first semiconductor layers are assigned the same reference mark "101". Similarly, the other structural components, such as the isolation transistor and the vertical signal line, are assigned the respective same reference marks. In FIG. 34 and FIG. 35, the first semiconductor layer is indicated as semiconductor layer 101*a*.

Example 1

Figure 23:
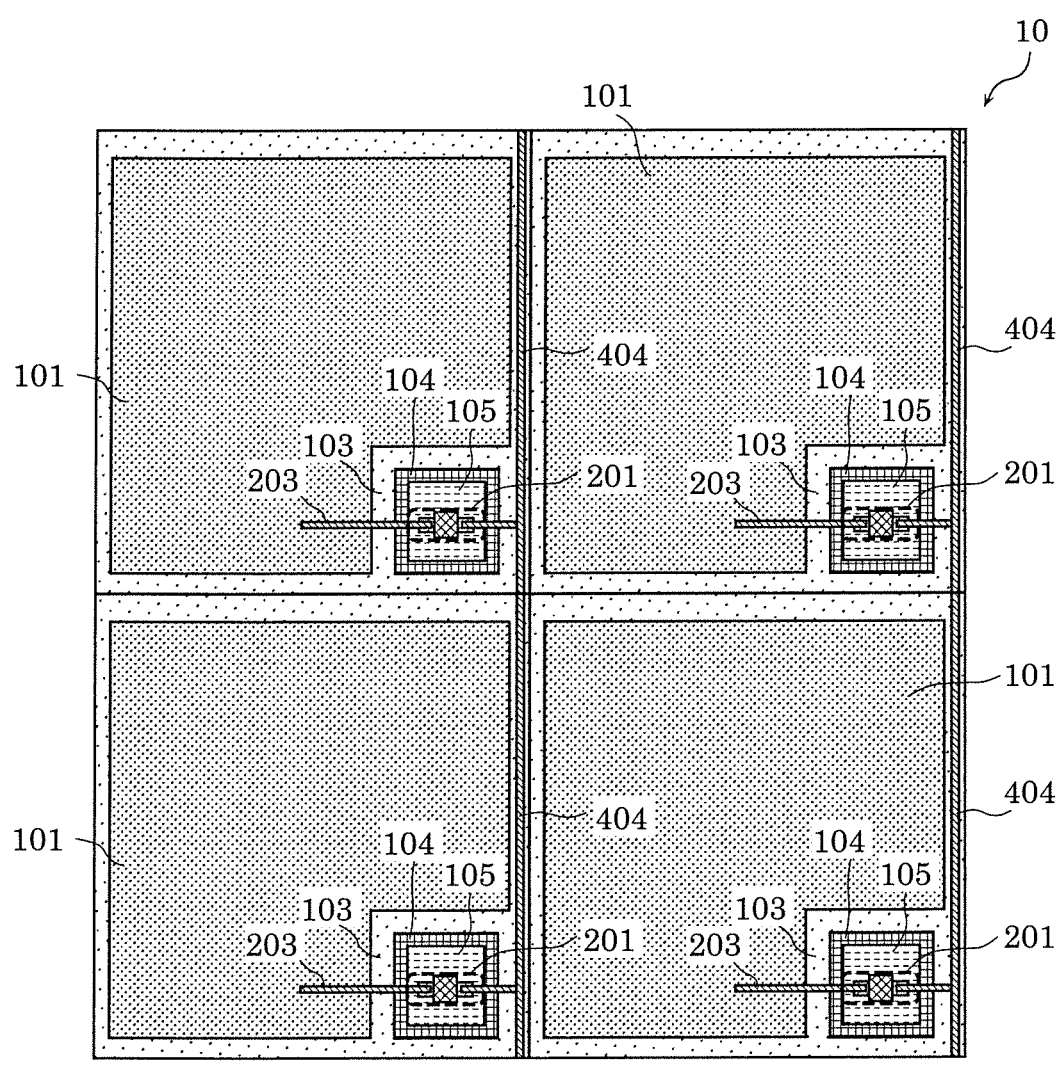
FIG. 23 illustrates Example 1 of pixel layout of the photodetector according to the present disclosure.

FIG. 23 is a plan view illustrating Example 1 of pixel layout of the photodetector according to the present disclosure.

Pixel array 10 illustrated in FIG. 23 includes at least two for each of first semiconductor layer 101, first well 104, second well 105, and isolation transistor 201. Each second well 105 includes one isolation transistor 201.

First semiconductor layers 101 adjacent to each other are separated by isolation region 103. Isolation region 103 is depleted.

Here, a potential of isolation region 103 between the adjacent first semiconductor layers 101 may roughly match a potential of isolation region 103 between first semiconductor layer 101 and first well 104.

Moreover, a width between the adjacent first semiconductor layers 101 may roughly match a width between first semiconductor layer 101 and first well 104. In particular, fabricating first semiconductor layer 101 and first well 104 using a single mask reduces a misalignment between first semiconductor layer 101 and first well 104. This reduces variations in dark current among the pixels.

Example 2

Figure 24:
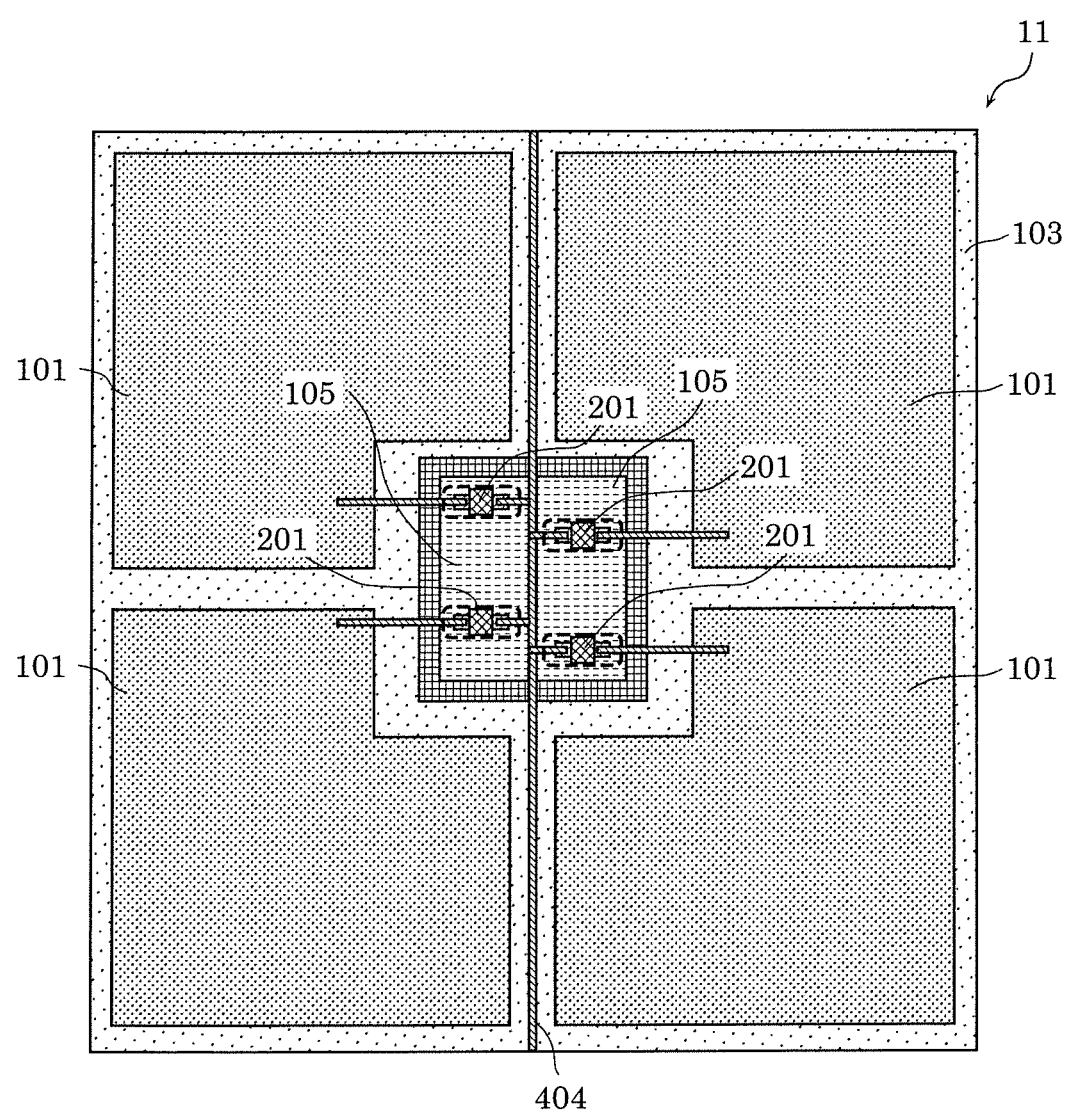
FIG. 24 illustrates Example 2 of pixel layout of the photodetector according to the present disclosure.

FIG. 24 illustrates Example 2 of pixel layout of the photodetector according to the present disclosure.

Pixel array 11 illustrated in FIG. 24 includes four isolation transistors 201 each connected to a corresponding one of four different first semiconductor layers 101. Four isolation transistors 201 are disposed in the same second well 105.

With this configuration, an area of second well 105 can be reduced, which allows an area of first semiconductor layer 101 to be increased. This increases the aperture ratio, and also enhances the photosensitivity.

Example 3

Figure 25:
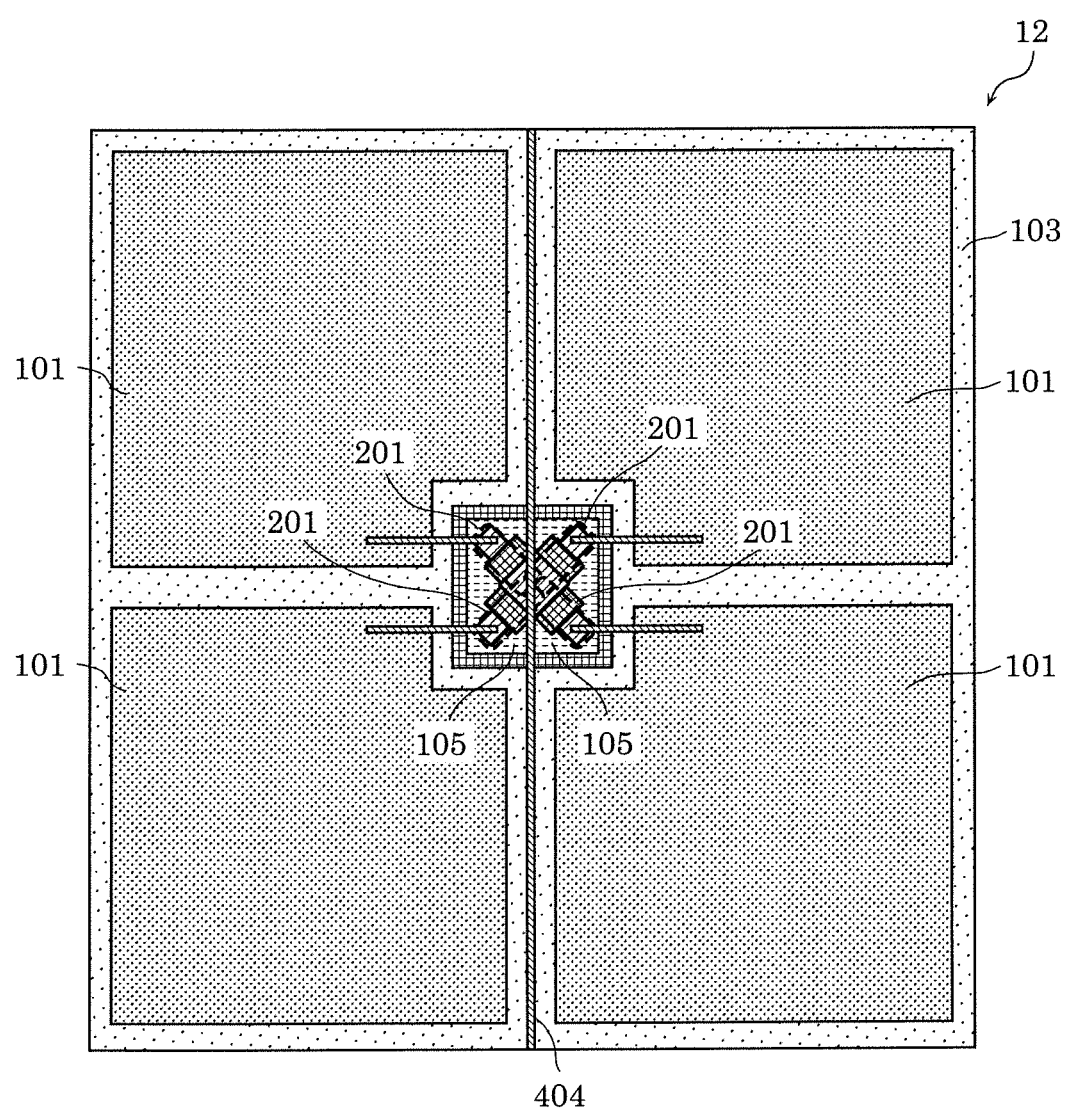
FIG. 25 illustrates Example 3 of pixel layout of the photodetector according to the present disclosure.

FIG. 25 illustrates Example 3 of pixel layout of the photodetector according to the present disclosure.

Pixel array 12 illustrated in FIG. 25 includes four isolation transistors 201 each connected to a corresponding one of four different first semiconductor layers 101. Four isolation transistors 201 share a drain. In this way, at least two isolation transistors 201 share a drain connected to readout circuit 407 (see FIG. 5, for example).

With this configuration, an area of second well 105 can be further reduced, which allows an area of first semiconductor layer 101 to be further increased. This further increases the aperture ratio, and also further enhances the photosensitivity.

Example 4

Figure 26:
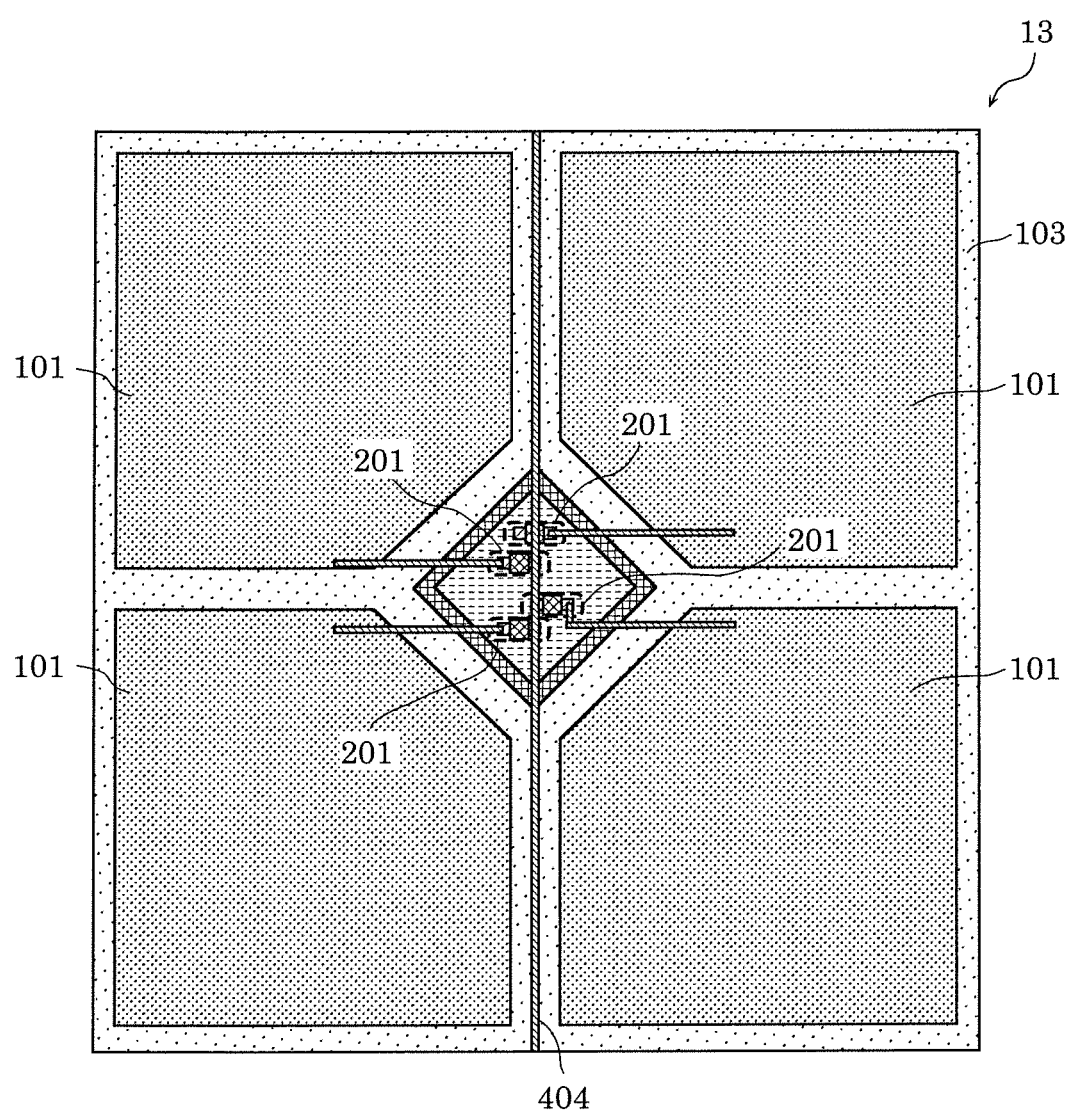
FIG. 26 illustrates Example 4 of pixel layout of the photodetector according to the present disclosure.

FIG. 26 illustrates Example 4 of pixel layout of the photodetector according to the present disclosure.

Pixel array 13 illustrated in FIG. 26 includes first semiconductor layer 101 that is a pentagon in plan view.

With this configuration, the shape of a resist used for fabricating first semiconductor layer 101 is stabilized as compared to the shape of first semiconductor layer 101 having six corners in plan view as described in Example 3, for example. In this case, a shape error caused in fabricating first semiconductor layer 101 is reduced. This further reduces variations in the photosensitivity.

Example 5

Figure 27:
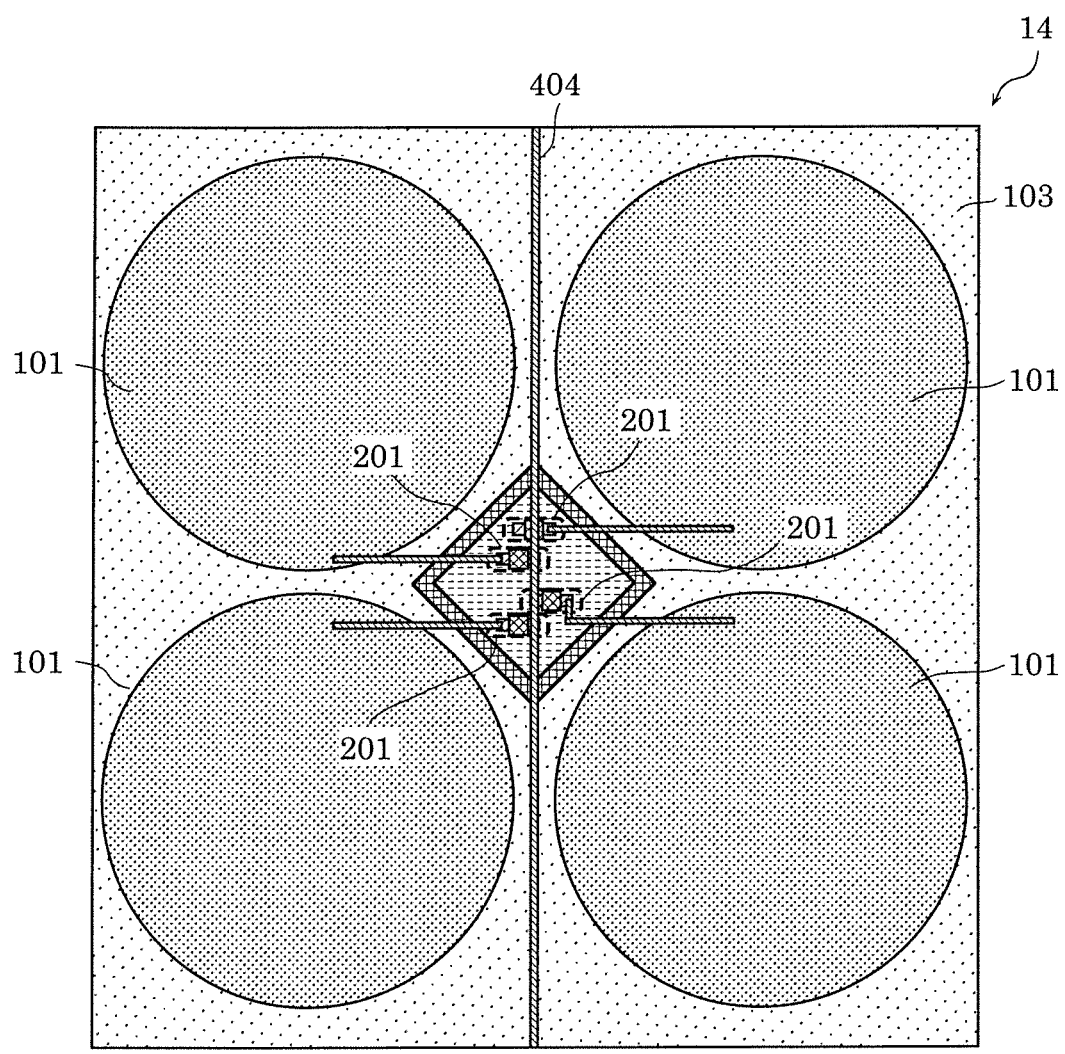
FIG. 27 illustrates Example 5 of pixel layout of the photodetector according to the present disclosure.

FIG. 27 illustrates Example 5 of pixel layout of the photodetector according to the present disclosure.

Pixel array 14 illustrated in FIG. 27 includes first semiconductor layer 101 that is circular in plan view.

This reduces electric field concentration in an end part of first semiconductor layer 101 and thus prevents edge breakdown.

Note that the shape of first semiconductor layer 101 in plan view is not limited to a square, a pentagon, and a circle described above. The shape of first semiconductor layer 101 in plan view may be an oval or a triangle, for example.

Example 6

Figure 28:
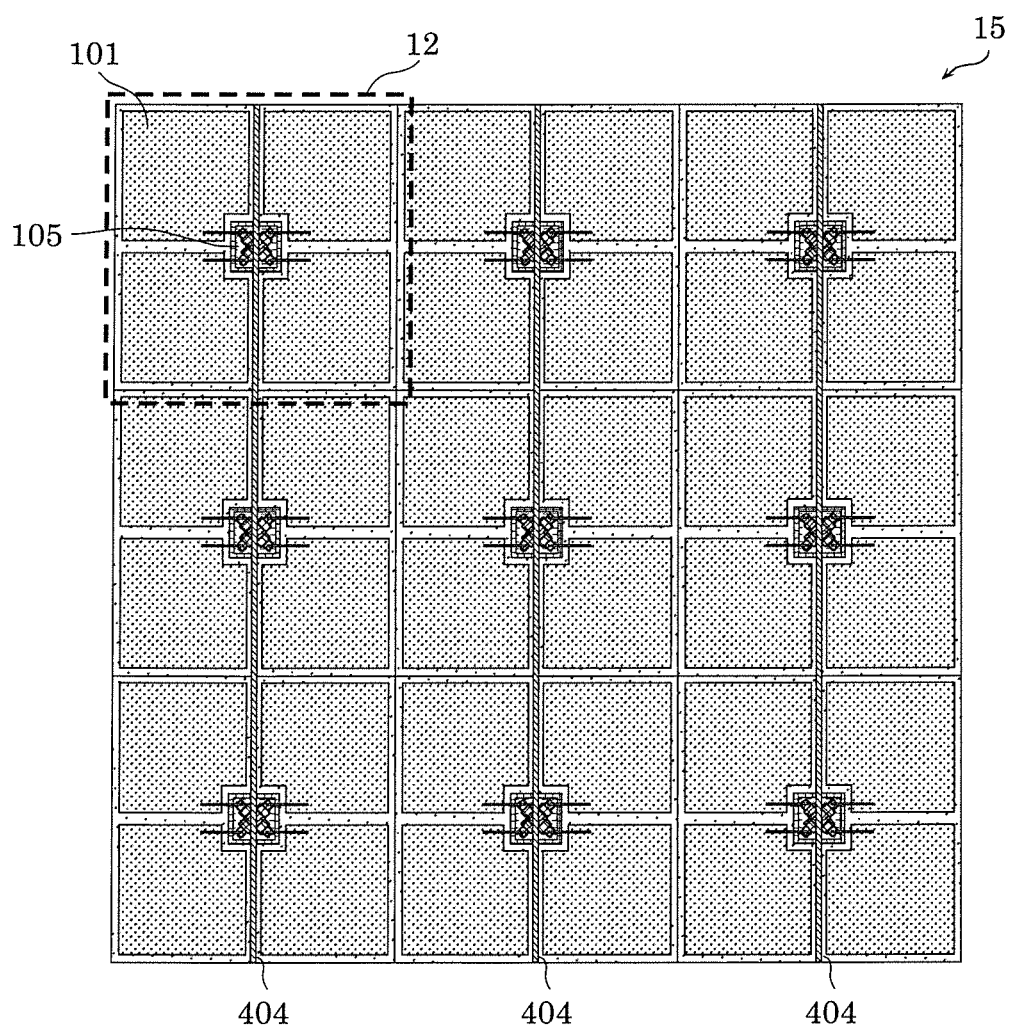
FIG. 28 illustrates Example 6 of pixel layout of the photodetector according to the present disclosure.

FIG. 28 illustrates Example 6 of pixel layout of the photodetector according to the present disclosure.

Pixel array 15 illustrated in FIG. 28 includes nine pixel arrays 12. Pixel array 12 is illustrated in FIG. 25. To be more specific, pixel array 15 includes pixels arranged in a 6-by-6 matrix.

With this configuration, two first semiconductor layers 101 are interposed between second wells 105. In this case, vertical signal line 404 is disposed for every two pixels. Thus, incident light reflection caused by the lines can be reduced. This enhances the photosensitivity.

Example 7

Figure 29:
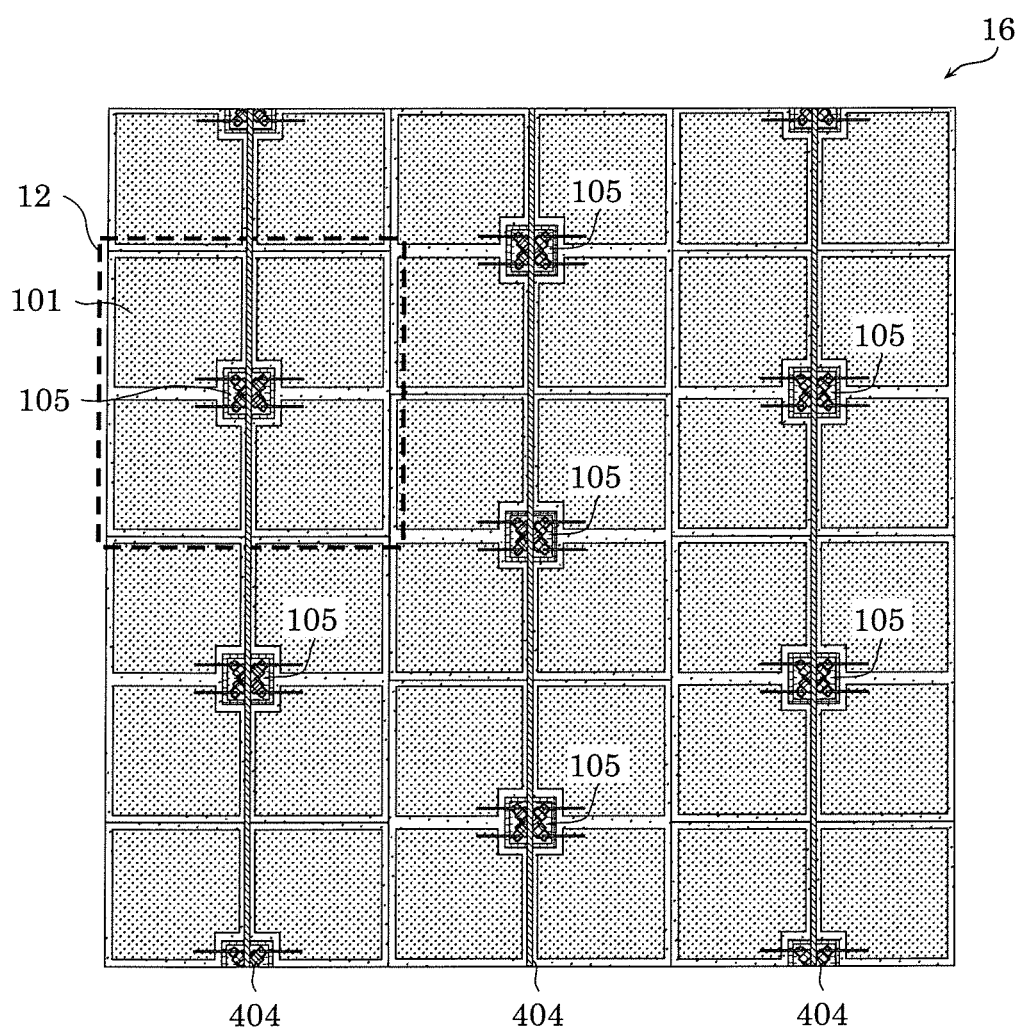
FIG. 29 illustrates Example 7 of pixel layout of the photodetector according to the present disclosure.

FIG. 29 illustrates Example 7 of pixel layout of the photodetector according to the present disclosure.

Pixel array 16 illustrated in FIG. 29 includes seven pixel arrays 12. Pixel array 12 is illustrated in FIG. 25. Moreover, pixel array 16 includes four pairs of adjacent pixels among four pixels of pixel array 12. To be more specific, pixel array 16 includes two adjacent pixel arrays 12 that are connected to different vertical signal lines 404 and displaced with respect to each other by one pixel in an extending direction. To be more specific, a plurality of second wells 105 are in a staggered arrangement.

With this configuration, two first semiconductor layers 101 are interposed between second wells 105 as in Example 6. In this case, vertical signal line 404 is disposed for every two pixels. Thus, incident light reflection caused by the lines can be reduced. This enhances the photosensitivity. In this configuration, four pixels each without a corresponding one of lower-left, upper-right, upper-left, and lower-right corners are repeated in a row or column. Thus, a difference in the photosensitivity among rows or columns is less likely to occur.

Example 8

Figure 30:
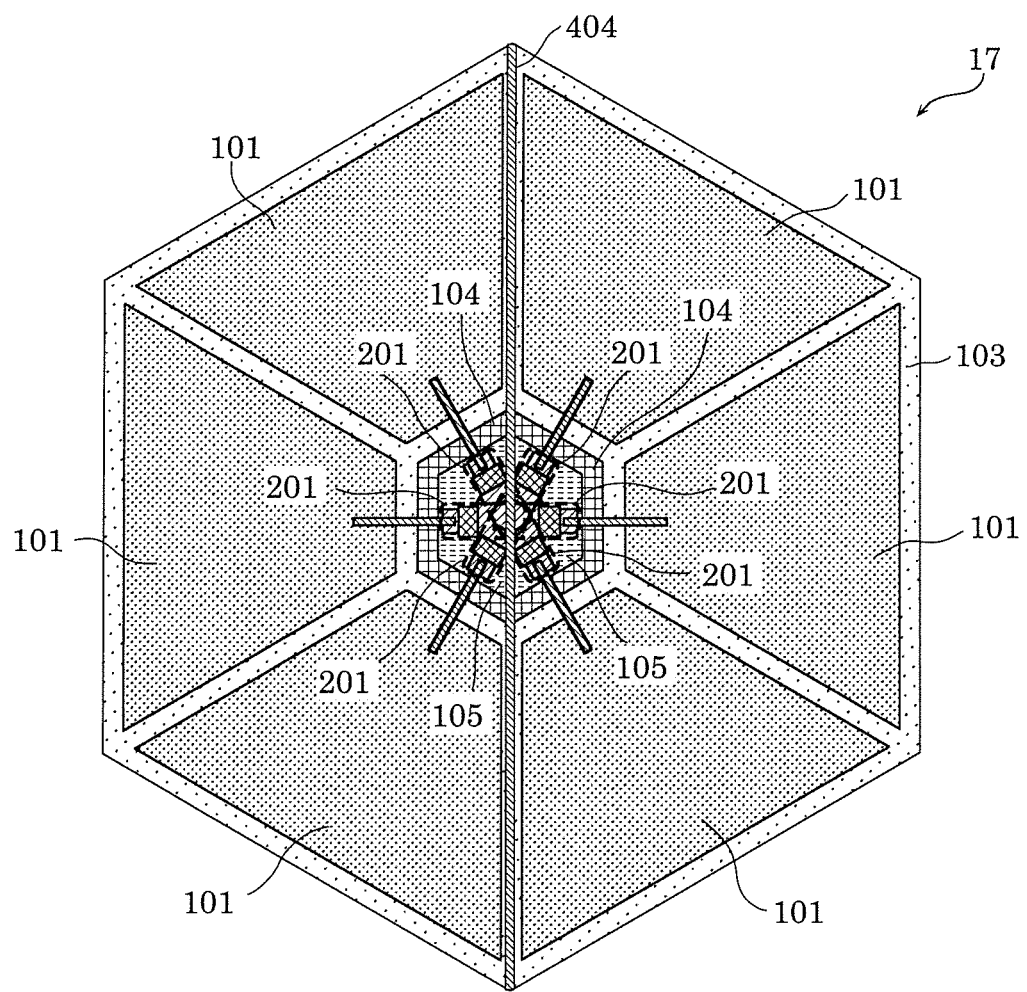
FIG. 30 illustrates Example 8 of pixel layout of the photodetector according to the present disclosure.

FIG. 30 illustrates Example 8 of pixel layout of the photodetector according to the present disclosure.

Pixel array 17 illustrated in FIG. 30 is a regular hexagon in plan view. First well 104 and second well 105, in which isolation transistor 201 is disposed, are disposed in a center of the regular hexagon. In plan view, first well 104 and second well 105 are surrounded by six first semiconductor layers 101 each of which is roughly trapezoidal. To be more specific, pixel array 17 has a so-called honeycomb structure.

In particular, six isolation transistors 201 connected to six first semiconductor layers 101 are disposed in the same second well 105. More specifically, pixel array 17 has 6-fold rotational symmetry and includes second well 105 in a rotational center of this symmetry.

In this way, the photodetector according to the present disclosure includes a plurality of first contacts 202 and a plurality of isolation transistors 201 each connected to a corresponding one of the plurality of first contacts 202. In this case, the plurality of isolation transistors 201 may be disposed in a single circuit region (including first well 104 and second well 105, for example).

With this configuration, the photodetector according to an aspect of the present disclosure is further miniaturized.

In the photodetector including the plurality of isolation transistors 201 according to the present disclosure, at least two among the plurality of isolation transistors 201 may share readout circuit 407.

With this configuration, the photodetector according to an aspect of the present disclosure is further miniaturized.

In Example 3 to Example 5 illustrated in FIG. 25 to FIG. 27, second well 105 is disposed in a rotational center of 4-fold rotational symmetry.

As in these examples, the pixel array according to the present disclosure has a repetition cycle of an N-polygon having an M-fold rotational symmetry. The pixel array includes N first semiconductor layers to have the M-fold rotational symmetry within the N-polygon. First well 104 and second well 105 are disposed around a rotational center of the symmetry of the N-polygon. Here, N is a positive integer not less than 3 and M is a positive integer not less than 2. For example, N=M=4 for pixel arrays 11 to 14 whereas N=M=6 for pixel array 17.

As described, N first semiconductor layers 101 may be disposed in the N-polygon (N is a positive integer not less than 3) having the M-fold rotational symmetry (M is a positive integer not less than 2) to have the M-fold rotational symmetry, in plan view. In this case, the circuit region (first well 104 and second well 105) may be disposed in the rotational center of the N-polygon having the rotational symmetry and N isolation transistors 201 may be disposed in this circuit region.

With this configuration, each of the pixels included in the photodetector according to the present disclosure is capable of maintaining the symmetrical shape in plan view. This reduces distortion of an image generated based on the charge read via readout circuit 407, for example. In particular, an increase in the number N increases the number of isolation transistors 201 to be disposed in the same first well 104 and second well 105. On this account, N may be a larger number.

In terms of symmetry, N may be equal to M and a regular polygon may be repeated. Here, among regular polygons that can fill an infinite plane, a regular hexagon has the greatest number of sides. A honeycomb structure having the repetition of a regular hexagon (N=M=6) may be more beneficial.

Example 9

Figure 31:
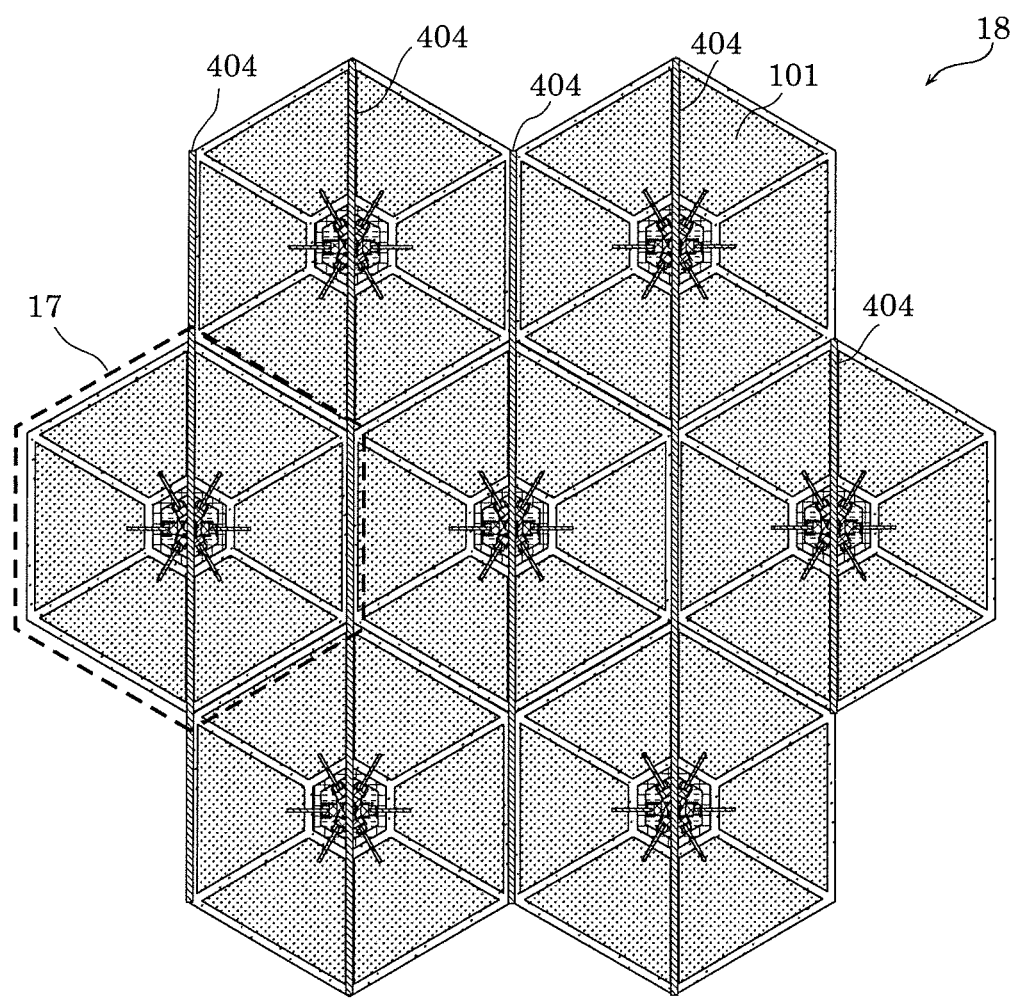
FIG. 31 illustrates Example 9 of pixel layout of the photodetector according to the present disclosure.

FIG. 31 illustrates Example 9 of pixel layout of the photodetector according to the present disclosure.

Pixel array 18 illustrated in FIG. 31 includes seven pixel arrays 17.

With this configuration, each of the pixels included in the photodetector according to the present disclosure is capable of maintaining the symmetrical shape. This reduces distortion of an image generated based on the charge read via readout circuit 407, for example. Moreover, this configuration of pixel array 18 allows the pixels to be arranged more densely. Thus, the photodetector is further miniaturized.

Example 10

Figure 32:
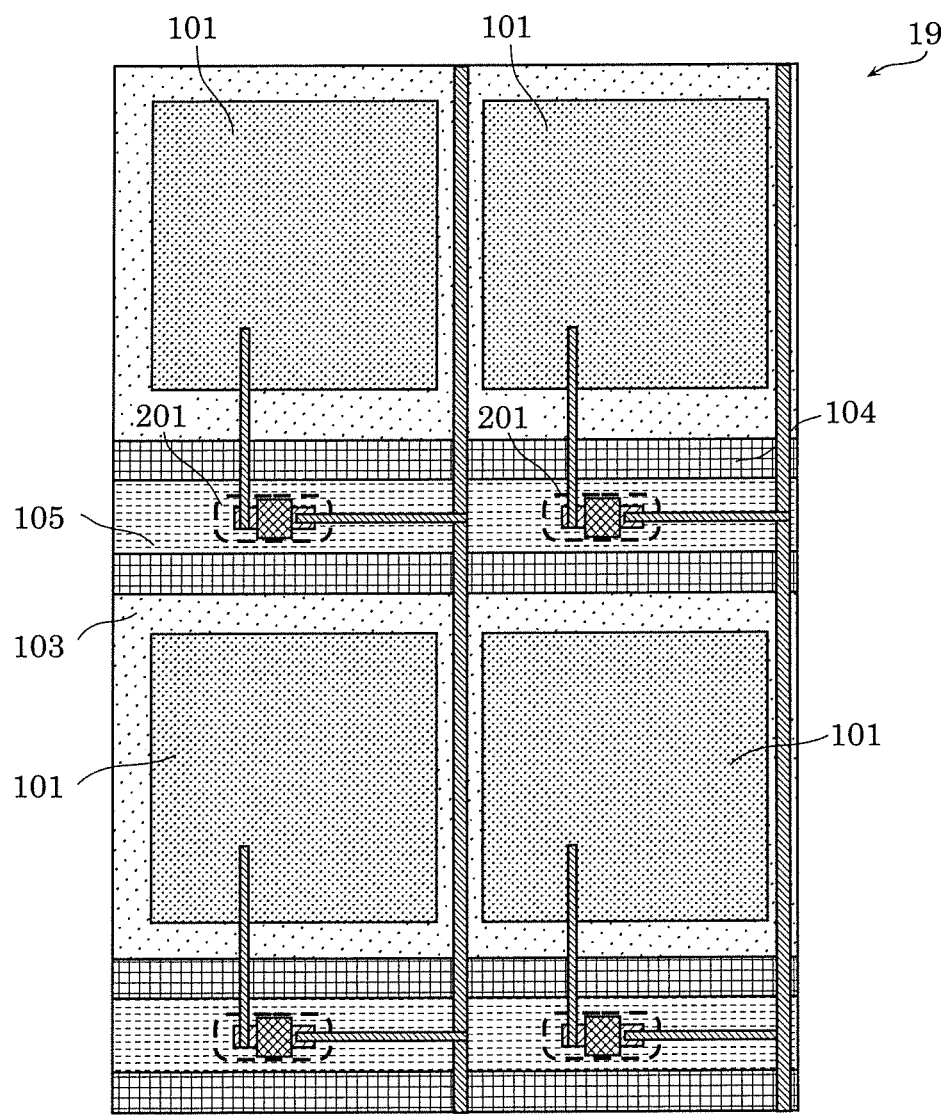
FIG. 32 illustrates Example 10 of pixel layout of the photodetector according to the present disclosure.

FIG. 32 illustrates Example 10 of pixel layout of the photodetector according to the present disclosure.

Pixel array 19 illustrated in FIG. 32 includes first well 104 and second well 105 each of which is in the form of a line.

Second well 105 includes a plurality of isolation transistors 201. Such linear side-by-side arrangement of first well 104 and second well 105 reduces areas of first well 104, second well 105, and isolation region 103. This configuration may allow an area of first semiconductor layer 101 to be increased in plan view. Thus, the configuration of pixel array 19 further increases the aperture ratio, which results in a higher photosensitivity.

Example 11

Figure 33:
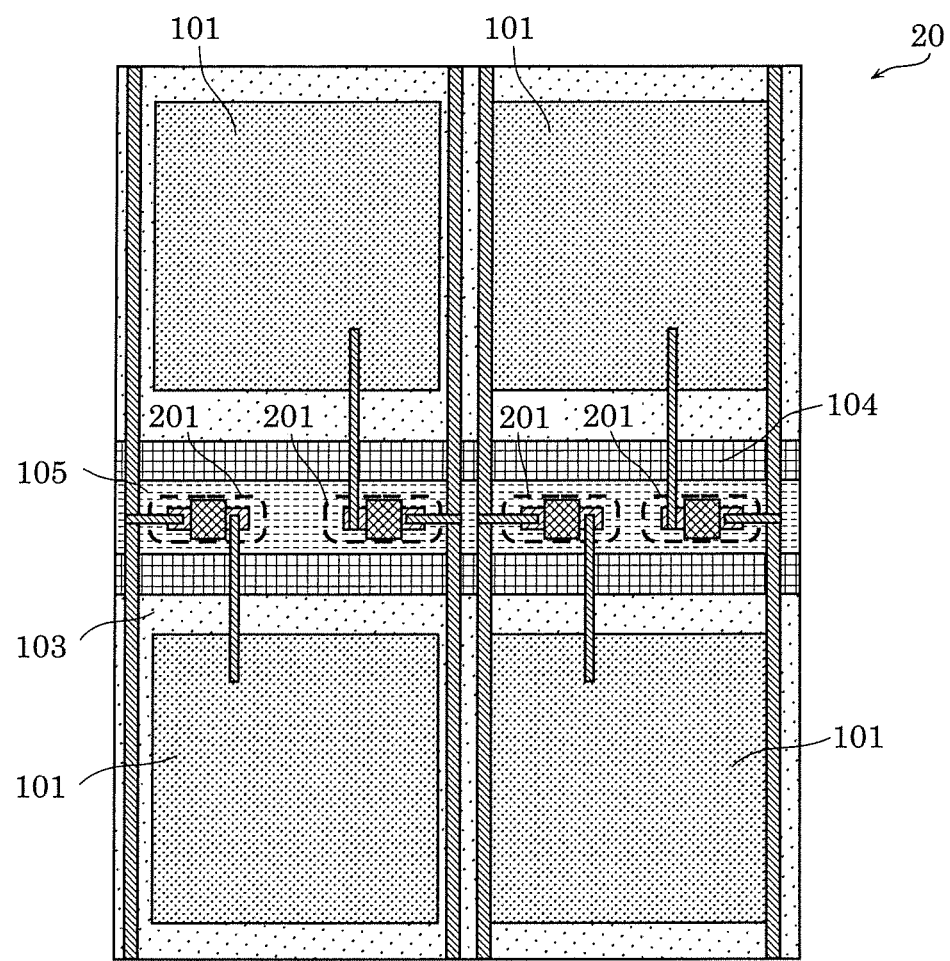
FIG. 33 illustrates Example 11 of pixel layout of the photodetector according to the present disclosure.

FIG. 33 illustrates Example 11 of pixel layout of the photodetector according to the present disclosure.

Pixel array 20 illustrated in FIG. 33 includes first well 104 and second well 105 each of which is in the form of a line. Second well 105 includes a plurality of isolation transistors 201. In particular, isolation transistors 201 connected to first well 104 and second well 105 and to first semiconductor layers 101 of rows adjacent vertically as viewed in the diagram are disposed in the same second well 105. Such linear side-by-side arrangement of first well 104 and second well 105 may reduce areas of first well 104, second well 105, and isolation region 103. This configuration may thus increase an area of first semiconductor layer 101 in plan view. Thus, the configuration of pixel array 20 further increases the aperture ratio, which results in a higher photosensitivity.

Example 12

FIG. 34 illustrates Example 12 of pixel layout of the photodetector according to the present disclosure. FIG. 35 is a cross-sectional view of Example 12 of pixel layout of the photodetector along line XXXV-XXXV of FIG. 34, according to the present disclosure.

Pixel array 22 illustrated in FIG. 34 and FIG. 35 includes three pixels and a set of first well 104 and second well 105, in a 2-by-2 array.

With this configuration, the pixel array includes an enormous number of pixels. Thus, the photosensitivity less easily decreases even if an area for a circuit has to be large and areas of first well 104 and second well 105 are irreducible. In particular, a device that executes signal processing to complement a signal in the region including first well 104 and second well 105 and outputs the signal as an image may be disposed in the region including first well 104 and second well 105.

Modification 1 of Circuit Configuration

Figure 36:
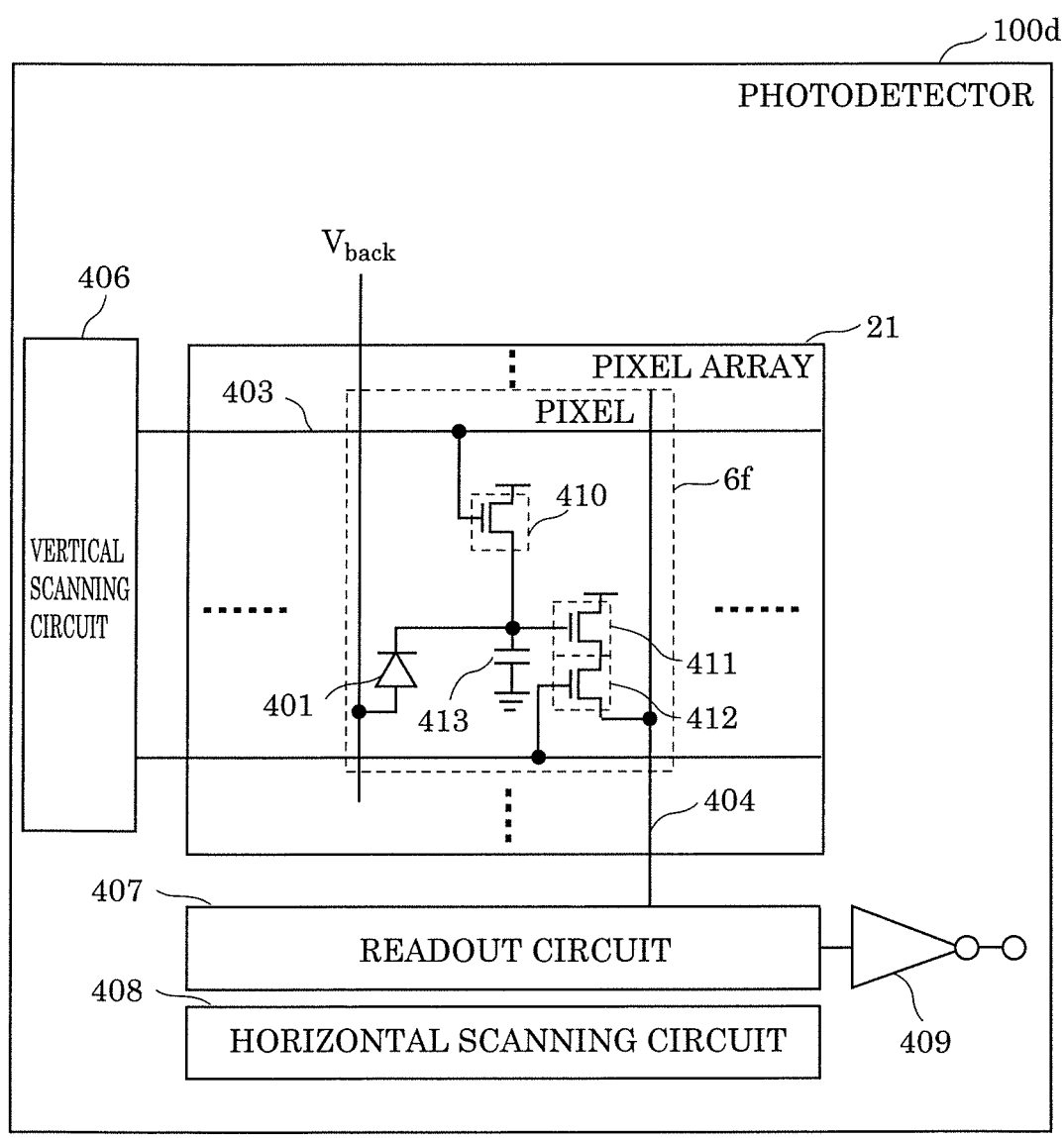
FIG. 36 illustrates Modification 1 of a circuit configuration of the photodetector according to the present disclosure.
Figure 37:
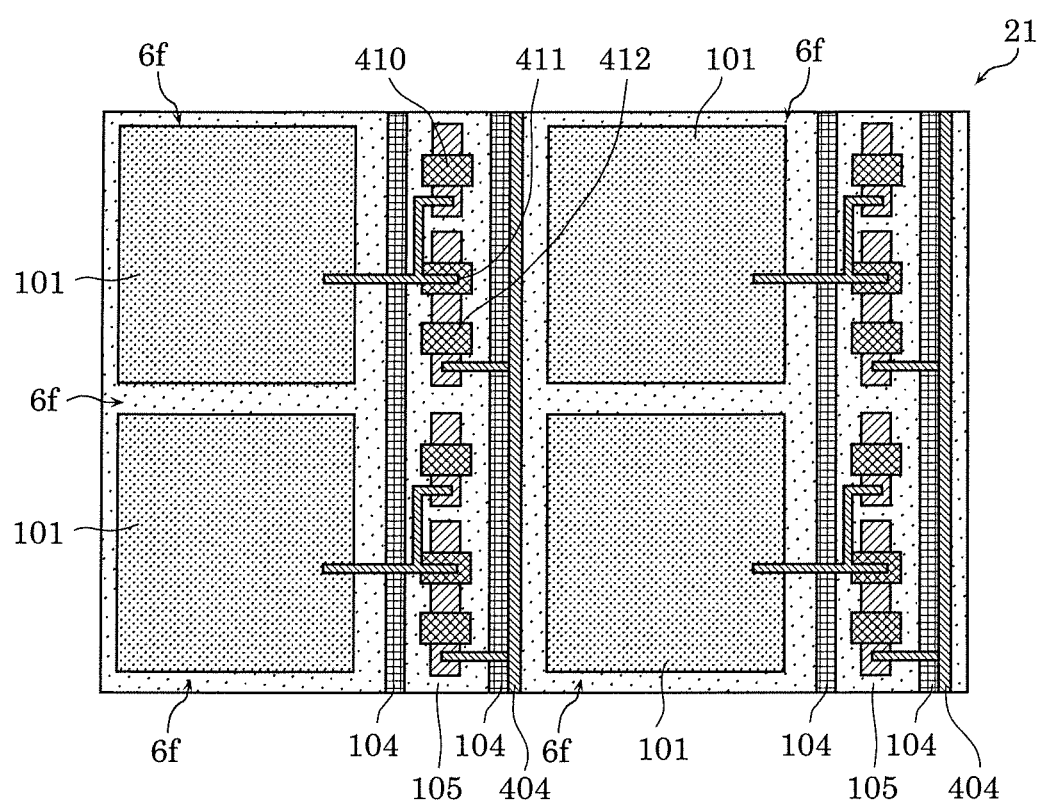
FIG. 37 is a plan view illustrating an example of a pixel array in the circuit configuration of the photodetector according to Modification 1 of the present disclosure.
Figure 38:
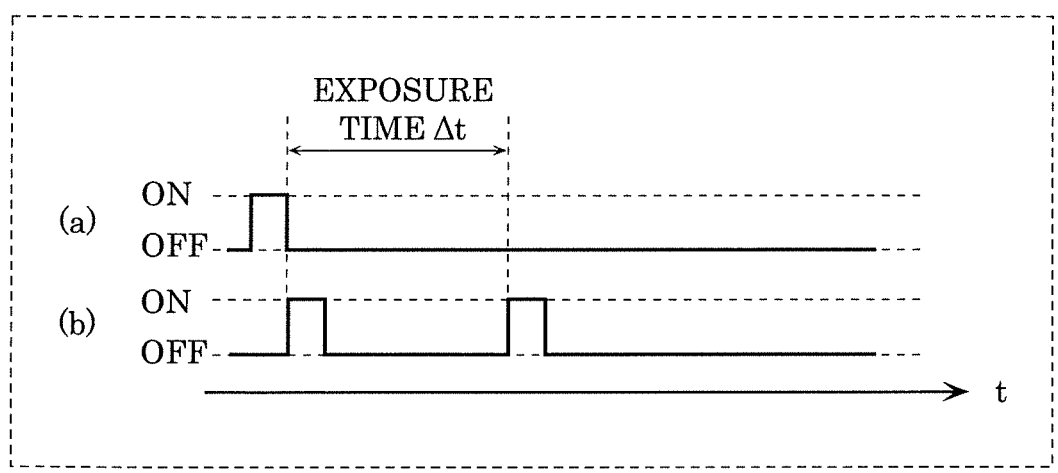
FIG. 38 illustrates an example of a drive sequence for the circuit configuration of the photodetector according to Modification 1 of the present disclosure.

The following describes Modification 1 of a circuit configuration of a photodetector according to an aspect of the present disclosure, with reference to FIG. 36 to FIG. 38.

In FIG. 5 illustrating the circuit configuration of photodetector 100, pixel array 9 is connected to vertical scanning circuit 406, horizontal scanning circuit 408, readout circuit 407, and buffer amplifier 409. However, the circuit configuration of the photodetector according to the present disclosure is not particularly limited to the one illustrated in FIG. 5.

FIG. 36 illustrates Modification 1 of a circuit configuration of photodetector 100d according to the present disclosure. FIG. 37 is a plan view illustrating an example of pixel array 23 having pixel 6f in the circuit configuration of photodetector 100d according to Modification 1 of the present disclosure. FIG. 38 illustrates an example of a drive sequence for the circuit configuration of photodetector 100d according to Modification 1 of the present disclosure.

Note that the circuit configurations illustrated in FIG. 36 to FIG. 38 may be adopted to photodetector 100 according to Embodiment 1, photodetector 100a according to Embodiment 2, or any modification of Embodiments 1 and 2.

Structural components having the same function may be assigned the same reference mark in FIG. 36 and FIG. 37 for the purpose of illustration. For example, although having a shape different from the shape of first semiconductor layer 101 included in photodetector 100 according to Embodiment 1, the first semiconductor layer is assigned the reference mark "101". Similarly, the other structural components, such as the first well and the second well, may be assigned the respective same reference marks. Moreover, pixel arrays 10 to 20 and 22 illustrated in FIG. 23 to FIG. 35 are adopted as pixel array 21 of photodetector 100d.

Here, (a) in FIG. 38 illustrates temporal fluctuations in the gate voltage of 6 reset transistor 410 whereas (b) in FIG. 38 illustrates temporal fluctuations in the gate voltage of selection transistor 412.

As illustrated in FIG. 36 and FIG. 37, the circuit configuration of photodetector 100d according to Modification 1 includes: readout circuit 407; reset transistor 410 that resets the APD; source follower transistor 411 that amplifies the first charge; selection transistor 412 that transfers a signal of a selected row to vertical signal line 404; and floating diffusion capacitor 413. Here, source follower transistor 411 corresponds to isolation transistor 201.

As illustrated in FIG. 37, reset transistor 410, source follower transistor 411, and selection transistor 412 are disposed in second well 105 in plan view.

As illustrated in FIG. 37, a source of reset transistor 410 is connected to a gate of source follower transistor 411 via a line. A source of source follower transistor 411 also serves as a drain of selection transistor 412. A source of selection transistor 412 is connected to vertical signal line 404.

With this configuration, a signal based on the first charge is amplified in pixel 6f. This reduces an effect of a circuit noise caused downstream.

Note that the source of source follower transistor 411 may not serve as the drain of selection transistor 412.

FIG. 38 illustrates an example of a method for driving readout circuit 407.

First, reset transistor 410 is activated, and first semiconductor layer 101 is reset to $V_{dd}$.

Following this, reset transistor 410 is deactivated, and selection transistor 412 is activated. Then, the potential of the APD is read via source follower transistor 411. The signal read at this time is stored into a circuit (not shown), such as a memory, that is disposed downstream.

After a lapse of exposure time Δt since the deactivation of reset transistor 410, selection transistor 412 is activated. Then, the potential of the APD is read via source follower transistor 411 to obtain a difference between this signal and the signal immediately after the reset.

This eliminates a background noise superimposed on the signal.

Modification 2 of Circuit Configuration

The following describes Modification 2 of the circuit configuration of a photodetector according to an aspect of the present disclosure, with reference to FIG. 39 to FIG. 42.

In FIG. 5 illustrating the circuit configuration of photodetector 100, pixel array 9 is connected to vertical scanning circuit 406, horizontal scanning circuit 408, readout circuit 407, and buffer amplifier 409. However, the circuit configuration of the photodetector according to the present disclosure is not particularly limited to the one illustrated in FIG. 5.

Figure 39:
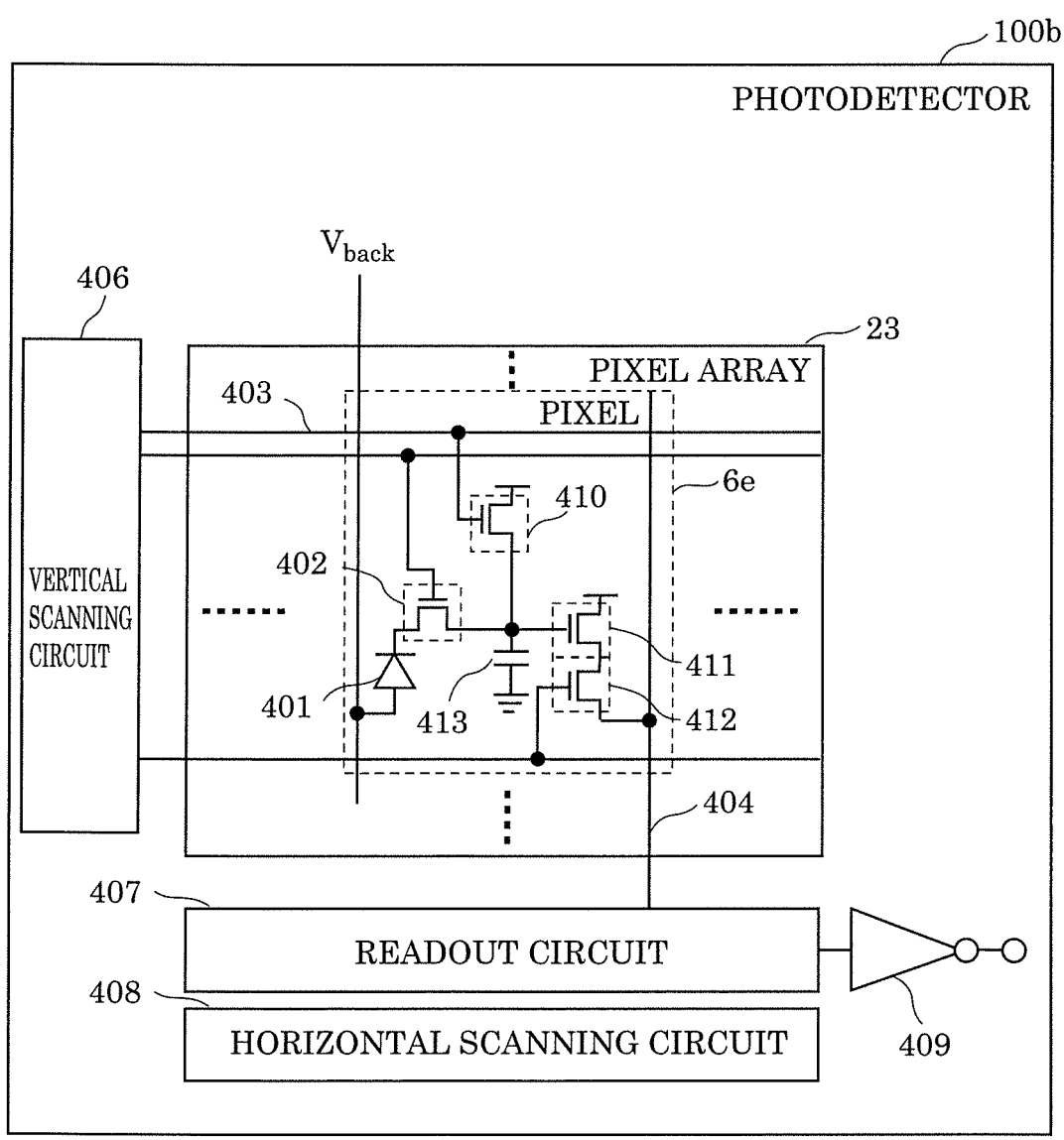
FIG. 39 illustrates Modification 2 of a circuit configuration of the photodetector according to the present disclosure.
Figure 40:
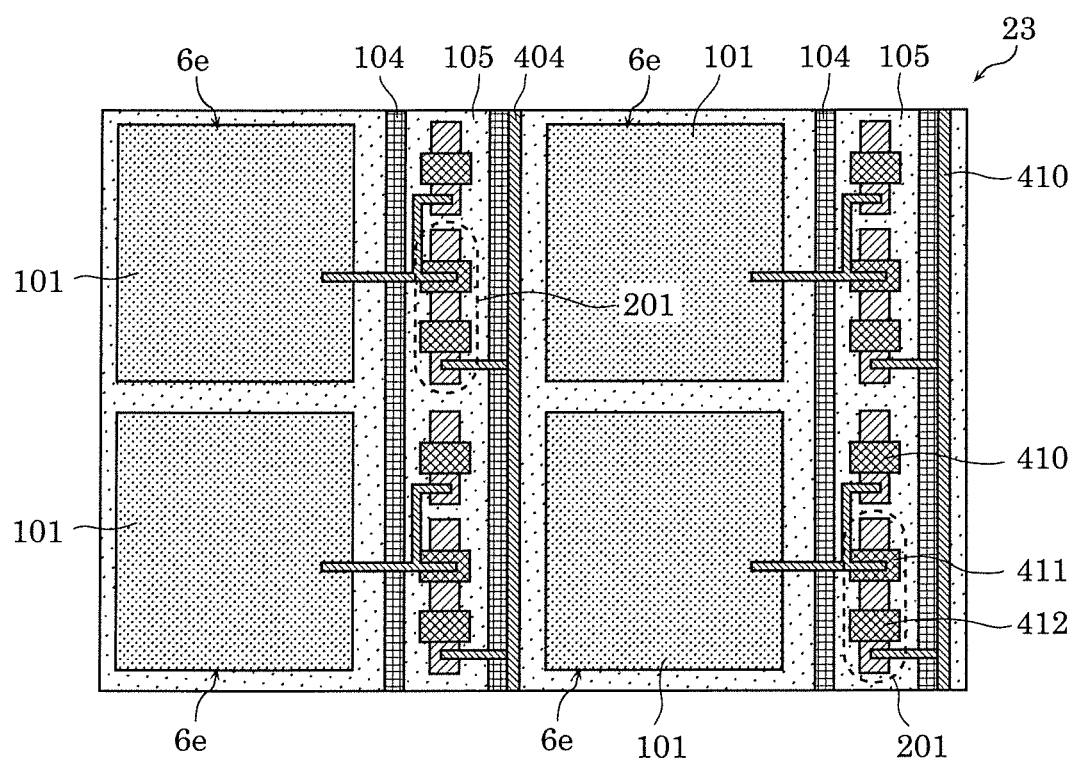
FIG. 40 is a plan view illustrating an example of a pixel array in the circuit configuration of the photodetector according to Modification 2 of the present disclosure.
Figure 41:
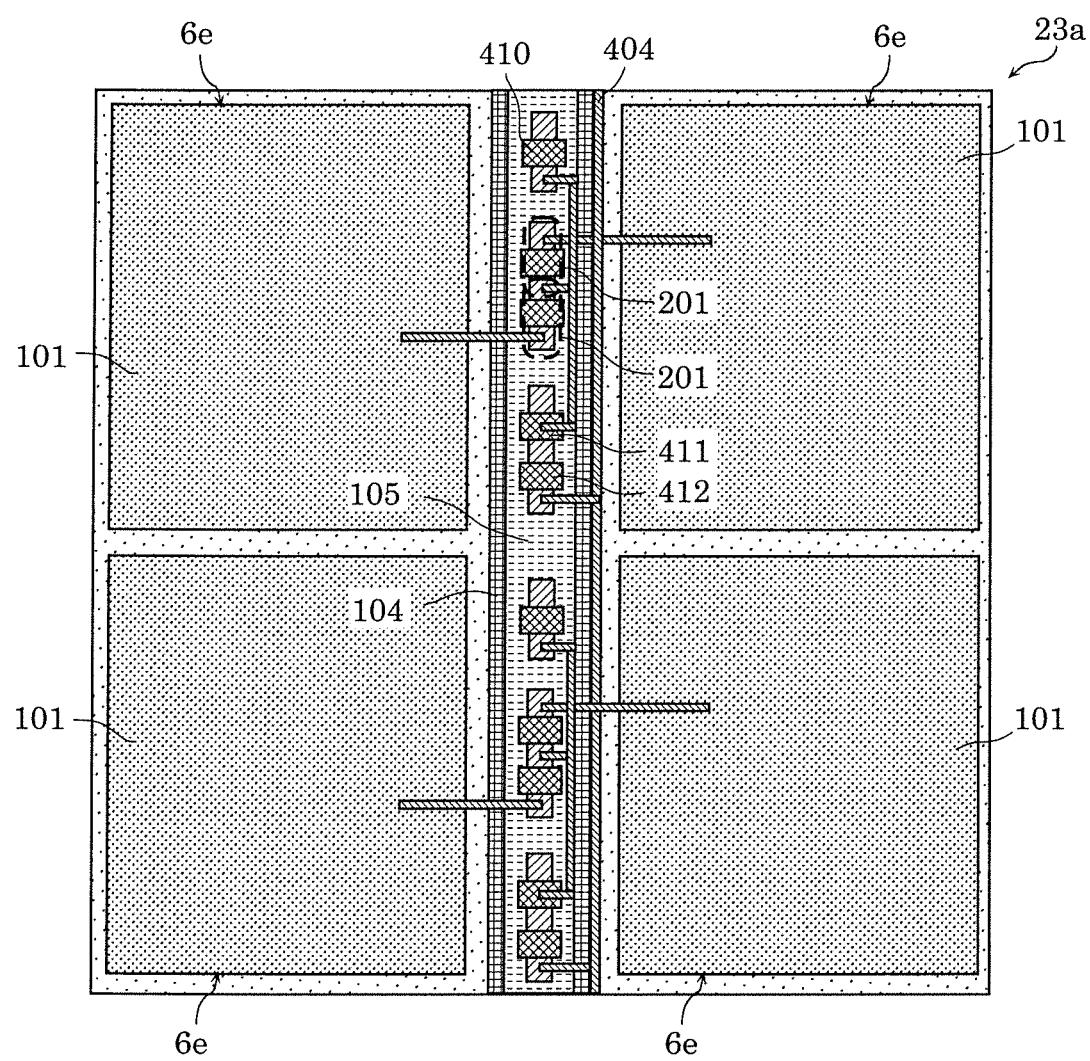
FIG. 41 is a plan view illustrating another example of the pixel array in the circuit configuration of the photodetector according to Modification 2 of the present disclosure.
Figure 42:
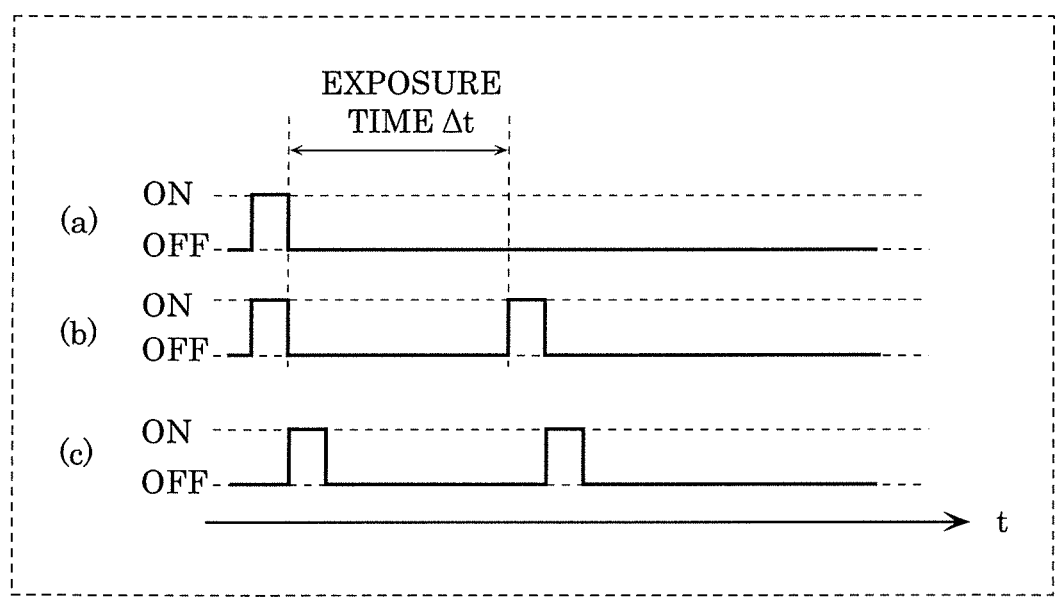
FIG. 42 illustrates an example of a drive sequence for the circuit configuration of the photodetector according to Modification 2 of the present disclosure.

FIG. 39 illustrates Modification 2 of a circuit configuration of photodetector 100b according to the present disclosure. FIG. 40 is a plan view illustrating an example of pixel array 23 including pixel 6e in the circuit configuration of photodetector 100b according to Modification 2 of the present disclosure. FIG. 41 is a plan view illustrating another example as pixel array 23a in the circuit configuration of photodetector 100b according to Modification 2 of the present disclosure. FIG. 42 illustrates an example of a drive sequence for the circuit configuration of photodetector 100b according to Modification 2 of the present disclosure.

Here, (a) in FIG. 42 illustrates temporal fluctuations in the gate voltage of reset transistor 410. Moreover, (b) in FIG. 42 illustrates temporal fluctuations in the gate voltage of transfer transistor 402, and (c) in FIG. 42 illustrates temporal fluctuations in the gate voltage of selection transistor 412.

Note that the circuit configurations illustrated in FIG. 39 to FIG. 42 may be adopted to photodetector 100 according to Embodiment 1, photodetector 100a according to Embodiment 2, or any modification of Embodiments 1 and 2.

Structural components having the same function may be assigned the same reference mark in FIG. 40 and FIG. 41 for the purpose of illustration. For example, although having a shape different from the shape of first semiconductor layer 101 included in photodetector 100 according to Embodiment 1, the first semiconductor layer is assigned the reference mark "101". Similarly, the other structural components, such as the first well and the second well, may be assigned the respective same reference marks. Moreover, pixel arrays 10 to 20 and 22 illustrated in FIG. 23 to FIG. 35 are adopted as pixel array 23 or 23a of photodetector 100b.

As illustrated in FIG. 39 and FIG. 40, the circuit configuration of photodetector 100b according to Modification 2 includes: readout circuit 407; reset transistor 410 that resets a drain of isolation transistor 201; source follower transistor 411 that amplifies the first charge; selection transistor 412 that transfers a signal of a selected row to vertical signal line 404; and floating diffusion capacitor 413.

As illustrated in FIG. 40, reset transistor 410, source follower transistor 411, and selection transistor 412 are disposed in second well 105 in plan view.

Note that isolation transistor 201 may be electrically connected to each of first semiconductor layers 101 disposed on both right and left sides in pixel array 23 as seen in FIG. 40. Alternatively, isolation transistor 201 may be electrically connected to only one of first semiconductor layers 101 disposed on both right and left sides in pixel array 23a as seen in FIG. 41.

As illustrated in FIG. 41, a drain of isolation transistor 201, a source of reset transistor 410, and a gate of source follower transistor 411 are connected to each other via lines. A source of source follower transistor 411 also serves as a drain of selection transistor 412. A source of selection transistor 412 is connected to vertical signal line 404.

With this configuration, a signal based on the first charge is amplified in pixel 6e. This reduces an effect of a circuit noise caused downstream.

Note that the source of source follower transistor 411 may not serve as the drain of selection transistor 412.

As illustrated in FIG. 40, two isolation transistors 201 share a drain. A drain of isolation transistor 201, a source of reset transistor 410, and a gate of source follower transistor 411 are connected to each other via lines. A source of source follower transistor 411 also serves as a drain of selection transistor 412. A source of selection transistor 412 is connected to vertical signal line 404.

With this configuration, a signal based on the first charge is amplified in pixel 6e. This reduces an effect of a circuit noise caused downstream.

FIG. 42 illustrates an example of a method for driving readout circuit 407, or more specifically, illustrates execution of correlated double sampling.

First, reset transistor 410 ((a) in FIG. 42) and transfer transistor 402 ((b) in FIG. 42) are activated, and first semiconductor layer 101 is reset to $V_{dd}$.

Following this, reset transistor 410 and transfer transistor 402 are deactivated, and selection transistor 412 ((c) in FIG. 42) is activated. The signal at this time is stored into a circuit (not shown), such as a memory, that is disposed downstream.

After a lapse of exposure time Δt since the deactivation of reset transistor 410 and transfer transistor 402, isolation transistor 201 is activated. As a result, the first charge accumulated in first semiconductor layer 101 is transferred to floating diffusion capacitor 413.

After this, selection transistor 412 is activated. Then, the potential of floating diffusion capacitor 413 is read via source follower transistor 411 to obtain a difference between this signal and the signal immediately after the reset.

This eliminates a background noise superimposed on the signal.

Package

Figure 43:
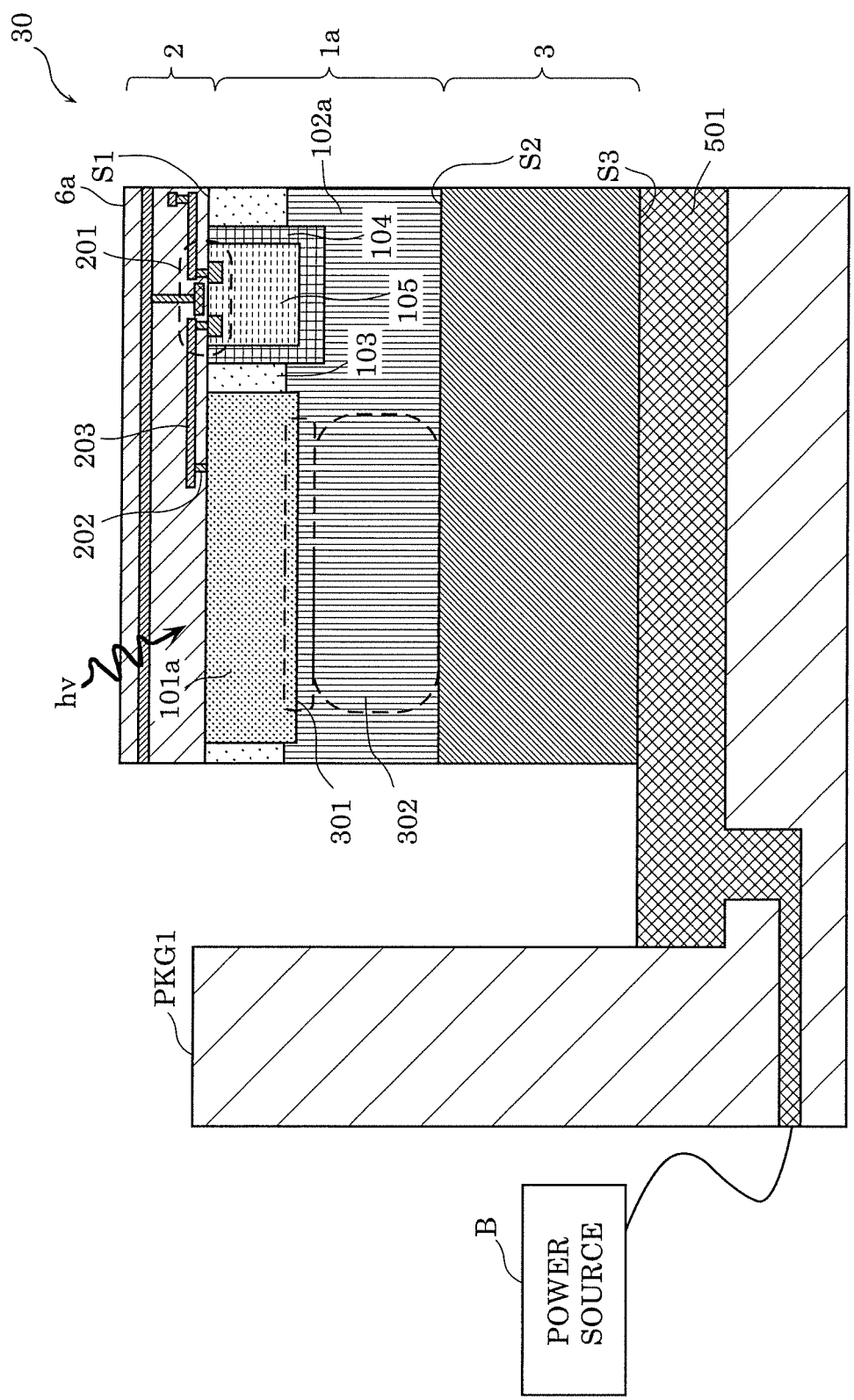
FIG. 43 is a cross-sectional view illustrating Example 1 of a package of a photodetector according to the present disclosure.
Figure 44:
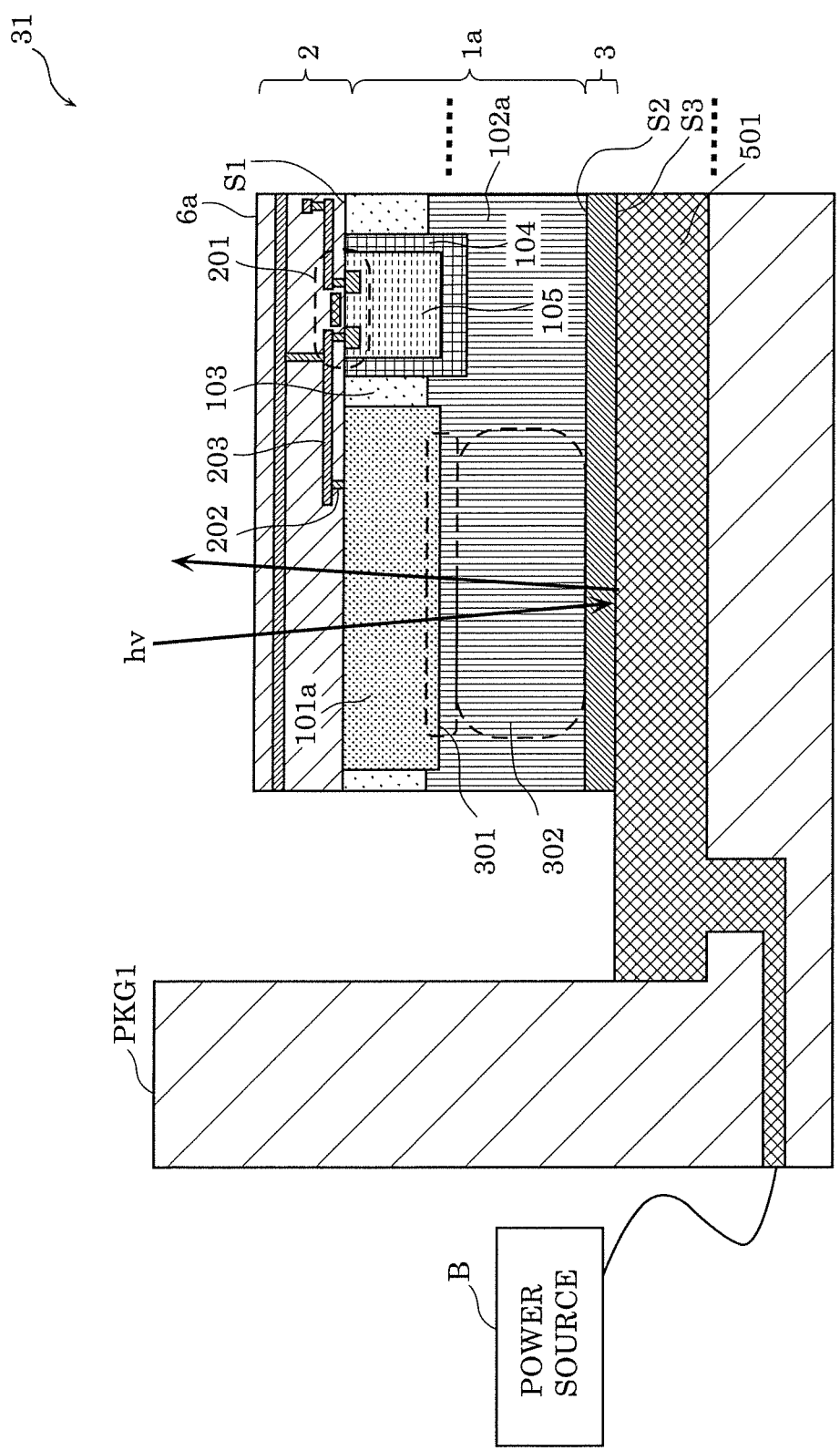
FIG. 44 is a cross-sectional view illustrating Example 2 of the package of the photodetector according to the present disclosure.
Figure 45:
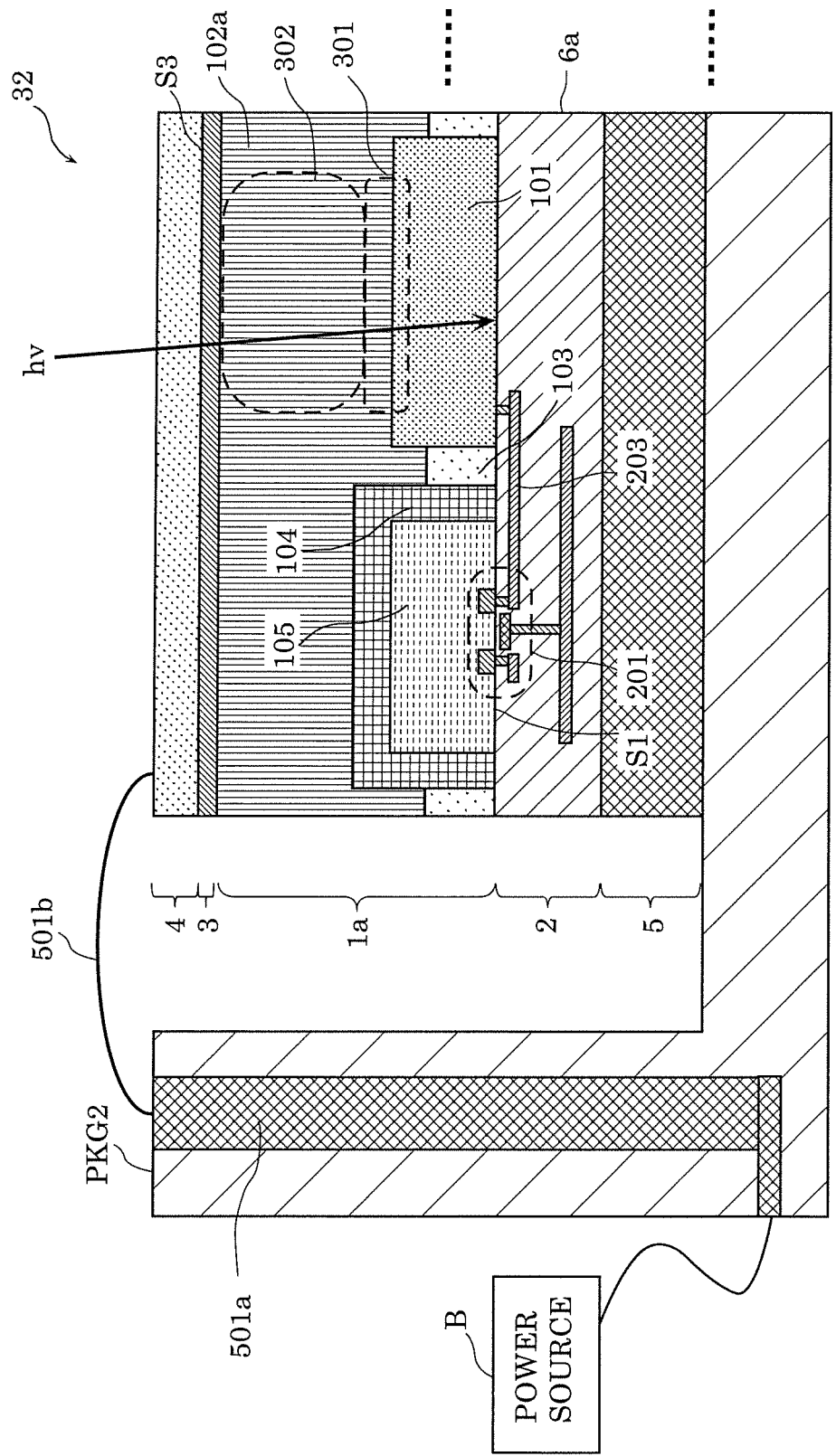
FIG. 45 is a cross-sectional view illustrating Example 3 of the package of the photodetector according to the present disclosure.

The following describes a package configuration of a photodetector according to the present disclosure, with reference to FIG. 43 to FIG. 45.

The package configuration illustrated in FIG. 43 to FIG. 45 may be adopted to photodetector 100 according to Embodiment 1, photodetector 100a according to Embodiment 2, or any modification of Embodiments 1 and 2. Each of FIG. 43 to FIG. 45 illustrates an example in which pixel 6a in FIG. 9 is disposed in a package.

Each of FIG. 43 to FIG. 45 is a cross-sectional view along line IX-IX of FIG. 8, for example.

Example 1

FIG. 43 is a cross-sectional view illustrating photodetector 30 according to Example 1 of the present disclosure.

Photodetector 30 includes pixel 6a and package PKG1.

Pixel 6a is implemented in package PKG1. Package PKG1 includes metal plate 501 that is electrically connected to power source B, such as an external utility power source.

Metal plate 501 is disposed on a molding of, for example, a resin material that is a base material of package PKG1. Metal plate 501 is connected to and in contact with second main surface S3 of semiconductor substrate layer 3. Metal plate 501 needs to be in ohmic contact with semiconductor substrate layer 3 to discharge a charge generated through avalanche multiplication. The smaller metal plate 501 is in size, the better. In particular, a contact resistance between metal plate 501 and semiconductor substrate layer 3 on package PKG1 needs to be about 0.1Ω to 10Ω. To achieve this, a metal used for fabricating metal plate 501 may be Ag, Au, Cu, Al, Ta, Pt, Ti, TiN, or Si, for example.

As illustrated in FIG. 43, photodetector 30 may have a configuration in which a voltage is applied directly to semiconductor substrate layer 3 from metal plate 501 disposed on package PKG1.

With this configuration, backside bias $V_{back}$ can be applied to a whole surface of second main surface S3 of semiconductor substrate layer 3. Thus, a uniform voltage can be applied in photodetector 30. For photodetector 30 used as an image sensor, variations in image quality can be reduced.

Example 2

FIG. 44 is a cross-sectional view illustrating photodetector 31 according to Example 2 of the present disclosure.

Photodetector 31 is different from photodetector 30 in the thickness of semiconductor substrate layer 3.

Photodetector 31 may include semiconductor substrate layer 3 that is thin, and may allow light passing through pixel 6a to be reflected off metal plate 501 of package PKG1.

As a result, the reflected light, which is the light reflected off metal plate 501, can be photoelectrically converted in first semiconductor layer 101a and second semiconductor layer 102a. A charge generated through this photoelectric conversion can also be detected as a signal. Thus, the photosensitivity of pixel 31 is further enhanced. In particular, silicon has a low absorption coefficient for absorbing near-infrared light, and thus more light passes through pixel 6a. For example, if photodetector 31 is to detect light with a peak wavelength of 940 nm and each of epitaxial layer 1a and semiconductor substrate layer 3 has a thickness of 10 μm, 80% of the incident light passes through pixel 6a without being photoelectrically converted. However, the configuration illustrated in FIG. 44 allows the light reflected off metal plate 501 to be photoelectrically converted again. This results in a 1.8-times increase in the photosensitivity.

Here, a silicon-on-insulator (SOI) substrate may be used as semiconductor substrate layer 3. In this case, each of epitaxial layer 1a and semiconductor substrate layer 3 can be reduced in thickness without any processing, such as polishing of the backside of semiconductor substrate layer 3. Thus, the backside (second main surface S3) of semiconductor substrate layer 3 has no processing damage. This reduces a noise caused from the backside of semiconductor substrate layer 3. As a result, a low-noise configuration can be achieved.

Example 3

FIG. 45 is a cross-sectional view illustrating package PKG2 of photodetector 32 according to Example 3 of the present disclosure.

Photodetector 32 includes pixel 6a and package PKG2. Package PKG2 includes metal plate 501a and metal line 501b.

Pixel 6a is disposed on a molding of, for example, a resin material that is a base material of package PKG2, so that line layer 2 is located vertically lower. To be more specific, photodetector 32 is a backside illumination (BSI) photodetector.

Transparent metal 4, which is a transparent electrode, is disposed on second main surface S3 of semiconductor substrate layer 3. For example, indium tin oxide (ITO) is used for transparent metal 4.

To reinforce pixel 6a, supporting substrate 5 is bonded underneath line layer 2. Pixel 6a is bonded to package PKG2 via supporting substrate 5. Examples used for supporting substrate 5 include, but are not particularly limited to, a metal substrate and a ceramic substrate.

Power source B is electrically connected to transparent metal 4 via metal plate 501a and metal line 501b. More specifically, backside bias $V_{back}$ is applied from power source B to transparent metal 4 via metal plate 501a and metal line 501b of package PKG2.

Examples of a material used for metal plate 501 and metal line 501b include, but are not particularly limited to, Ag, Au, Cu, Al, Ta, Pt, Ti, TiN, and Si.

Fabricating Method

Next, a method of fabricating a photodetector according to the present disclosure is described with reference to FIG. 46 to FIG. 52.

FIG. 46 to FIG. 52 are cross-sectional views illustrating the method of fabricating the photodetector according to the present disclosure.

Figure 46:
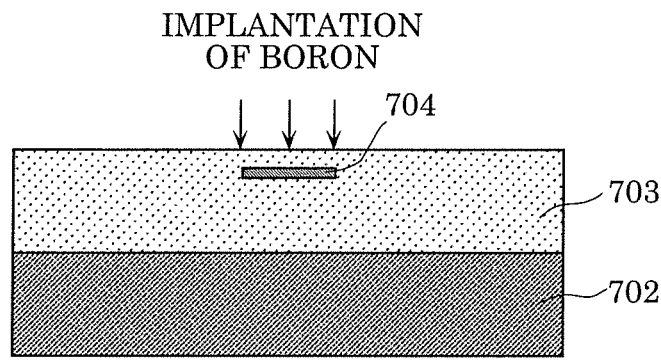
FIG. 46 is a cross-sectional view illustrating a process of fabricating a photodetector according to the present disclosure.

First, epitaxial layer 703 is formed on growth substrate 702 as illustrated in FIG. 46. Growth substrate 702 is a Si substrate of the second conductivity type, for example. On this Si substrate, epitaxial layer 703 is epitaxially grown and thus made of Si.

Next, boron is implanted into epitaxial layer 703 to form second semiconductor layer 704.

Figure 47:
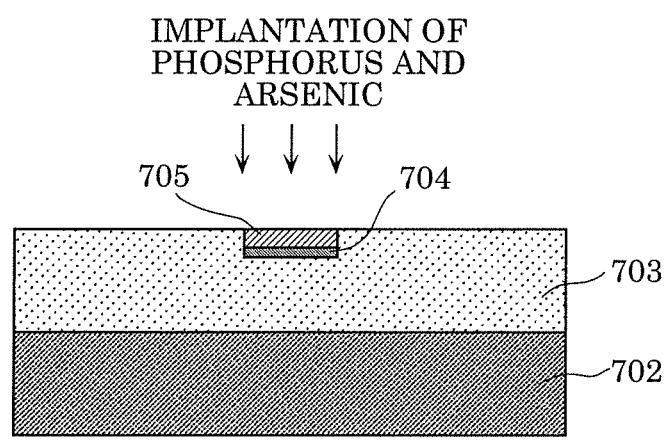
FIG. 47 is a cross-sectional view illustrating a process of fabricating the photodetector according to the present disclosure.

Following this, either one of or both phosphorus and arsenic is next implanted into epitaxial layer 703 as illustrated in FIG. 47. As a result, first semiconductor layer 705 is formed on second semiconductor layer 704.

Figure 48:
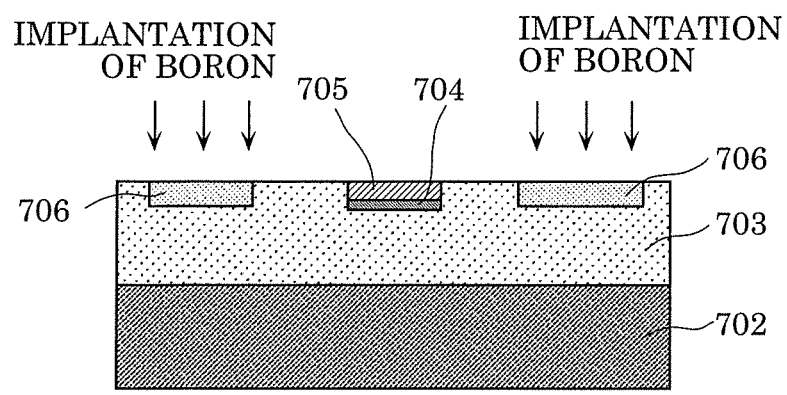
FIG. 48 is a cross-sectional view illustrating a process of fabricating the photodetector according to the present disclosure.

Next, well 706 is next formed on a top surface (located on the vertically-upper side as seen in FIG. 48) of epitaxial layer 703 to be adjacent to first semiconductor layer 705 and second semiconductor layer 704, as illustrated in FIG. 48. The pixel regions, such as first well 104 and second well 105 illustrated in FIG. 2, are formed in well 706.

Figure 49:
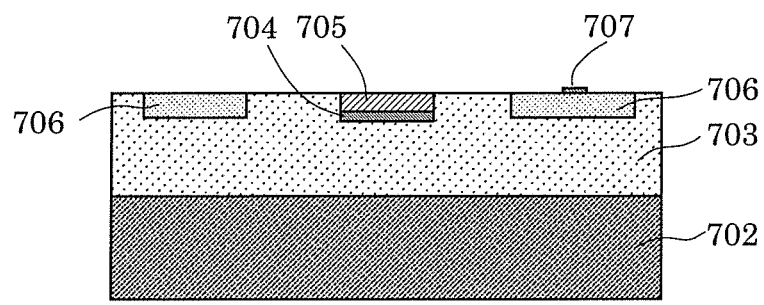
FIG. 49 is a cross-sectional view illustrating a process of fabricating the photodetector according to the present disclosure.

Following this, gate electrode 707 is formed on well 706, as illustrated in FIG. 49. Examples of a material used for gate electrode 707 include polysilicon, aluminum, and Ti.

Figure 50:
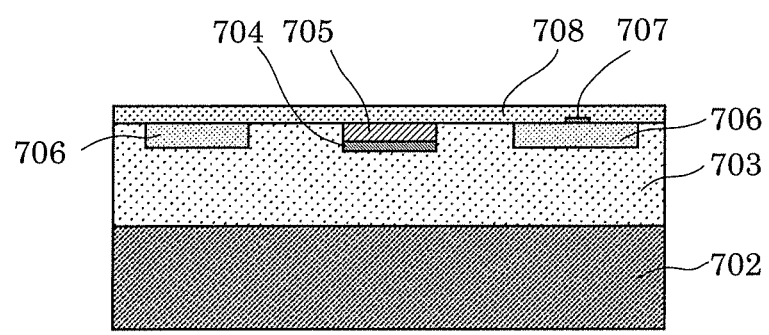
FIG. 50 is a cross-sectional view illustrating a process of fabricating the photodetector according to the present disclosure.

Next, insulating film 708 is formed on a top surface of epitaxial layer 703 as illustrated in FIG. 50. Insulating film 708 is formed by chemical vapor deposition (CVD) and chemical mechanical polishing (CMP).

Figure 51:
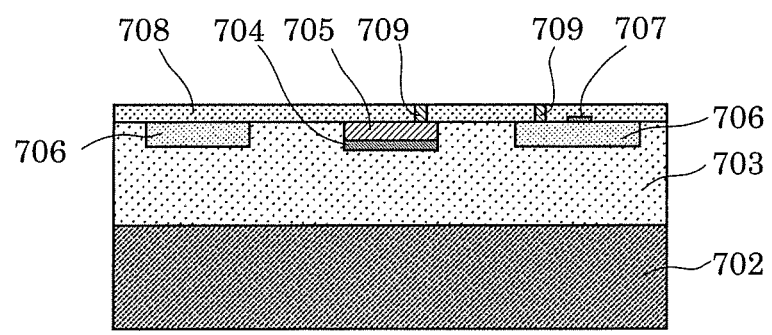
FIG. 51 is a cross-sectional view illustrating a process of fabricating the photodetector according to the present disclosure.

Following this, contact 709 (electrode) to be connected to well 706 and contact 709 to be connected to first semiconductor layer 705 are formed, as illustrated in FIG. 51. Examples of a material used for contact 709 include W, Ti, TiN, and Ni. Contacts 709 are formed by lithography, dry etching, metal CVD, and CMP, for example.

Figure 52:
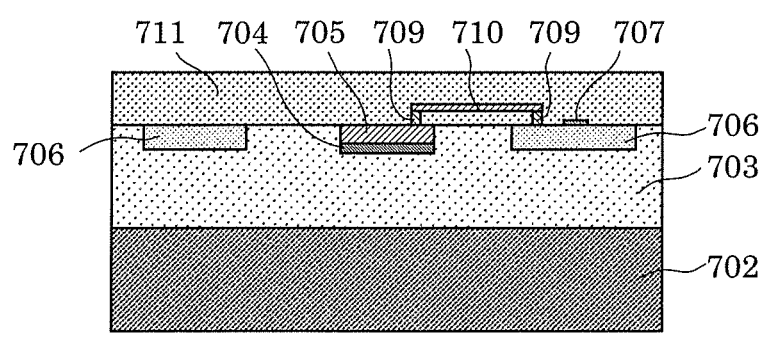
FIG. 52 is a cross-sectional view illustrating a process of fabricating the photodetector according to the present disclosure.

Next, first line 710 is formed to establish a connection between contact 709 connected to well 706 and contact 709 connected to first semiconductor layer 705, as illustrated in FIG. 52. Moreover, insulating film 711 thicker than insulating film 708 illustrated in FIG. 51 is formed. As a result, a line layer (such as line layer 2 illustrated in FIG. 2) is formed on the top surface of epitaxial layer 703.

Here, the processes of fabricating the photodetector according to the present disclosure as illustrated in FIG. 46 to FIG. 52 are achieved by typical dual damascene processing. The dual damascene processing is a film formation method that includes: CVD for forming insulating film 708 as a thin film; lithography and dry etching for forming a trench in insulating film 708 that is thin; physical vapor deposition (PDV) or CVD for forming contacts 709; Cu plating for forming first line 710; and CMP for forming insulating 711 by increasing the thickness of insulating film 708.

Embodiment 3

A configuration of a photodetector according to Embodiment 3 is next described, with reference to FIG. 53 to FIG. 56.

In the following description on the photodetector according to Embodiment 3, components that are substantially the same as those included in the photodetector according to Embodiments 1 and 2 are assigned the same reference marks as used in Embodiments 1 and 2, and descriptions on these components may be partially omitted or simplified.

Figure 53:
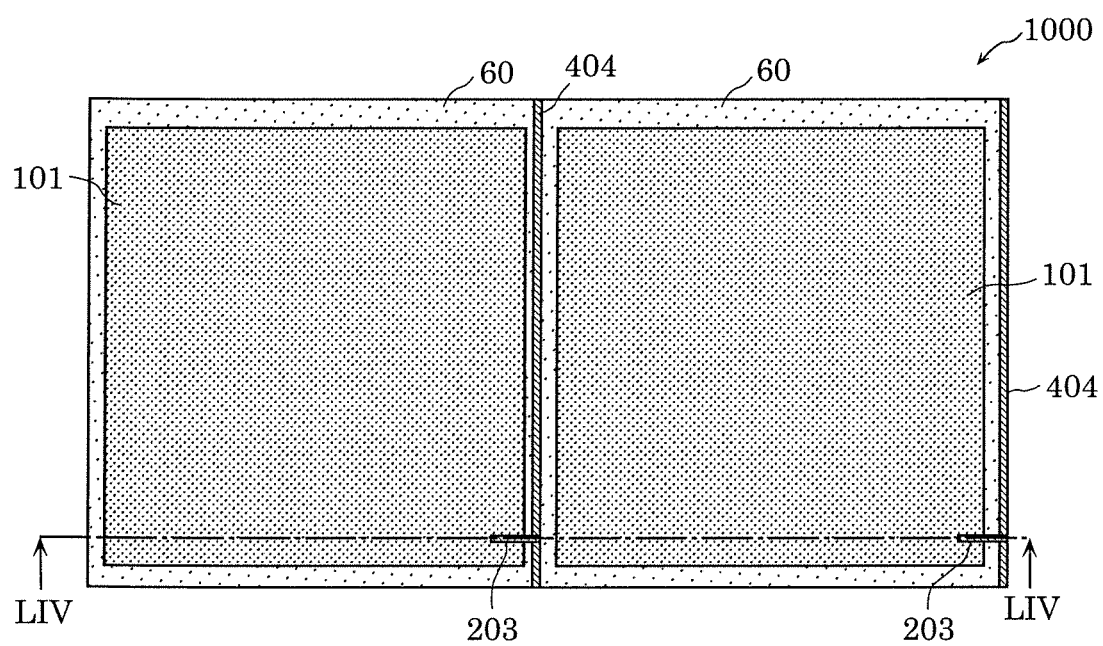
FIG. 53 is a plan view of a photodetector according to Embodiment 3 of the present disclosure.
Figure 54:
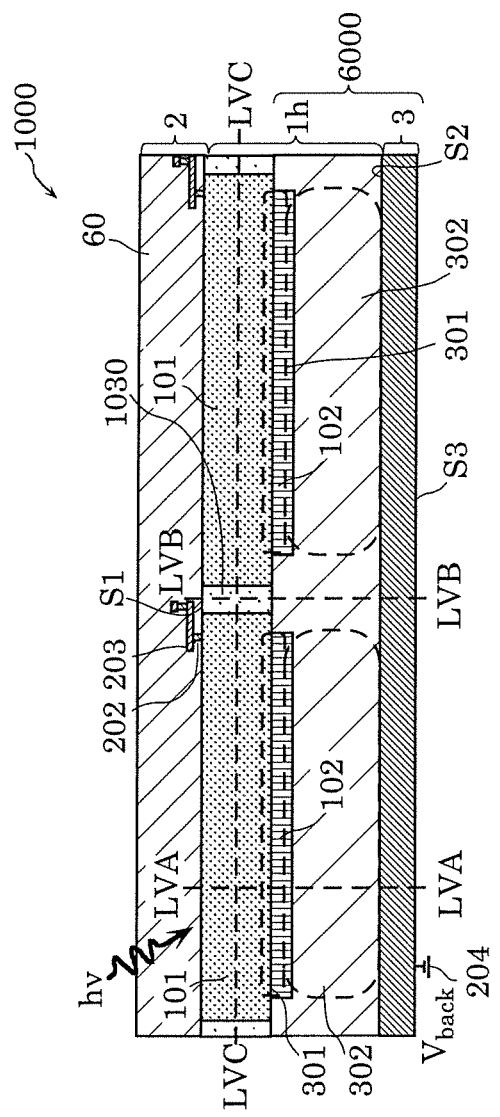
FIG. 54 is a cross-sectional view of the photodetector along line LIV-LIV of FIG. 53, according to Embodiment 3 of the present disclosure.

FIG. 53 is a plan view of photodetector 1000 according to Embodiment 3 of the present disclosure. FIG. 54 is a cross-sectional view of photodetector 1000 along line LIV-LIV of FIG. 53, according to Embodiment 3 of the present disclosure.

Note that each of FIG. 53 and FIG. 54 illustrates, among structural components included in photodetector 1000, pixel 60 that includes first semiconductor layer 101, isolation region 1030 (a first isolation region), and a row signal line that is included in first line 203. Thus, some of the structural components of photodetector 1000 are omitted from FIG. 53 and FIG. 54. For example, some of the structural components, such as a line connected to first line 203, are omitted from FIG. 53. Note that some of the structural components of the photodetector according to the present disclosure may also be omitted from the other drawings described below.

Photodetector 1000 according to Embodiment 3 is a photodetector sensor that includes an APD (avalanche photodiode). Photodetector 1000 includes: semiconductor substrate 6000 including epitaxial layer (semiconductor substrate) 1h and semiconductor substrate layer 3; and line layer 2. To be more specific, photodetector 1000 includes: epitaxial layer 1h that is of a second conductivity type; line layer 2 disposed on first main surface S1 of semiconductor substrate 6000 (or more specifically, epitaxial layer 1h); and semiconductor substrate layer 3 disposed on a backside of epitaxial layer 1h.

Semiconductor substrate 6000 includes epitaxial layer 1h and semiconductor substrate layer 3.

Epitaxial layer 1h includes: at least one first semiconductor layer 101 that is of a first conductivity type; second semiconductor layer 102 that is of the second conductivity type; multiplication region 301 that is included in first semiconductor layer 101 and second semiconductor layer 102 and causes avalanche multiplication to a charge generated in epitaxial layer 1h through photoelectric conversion; and isolation region 1030 that separates at least two multiplication regions 301.

First semiconductor layer 101 is of the first conductivity type, and is included in epitaxial layer 1h and closer to first main surface S1 than to second main surface S3. First contact 202 is disposed on first semiconductor layer 101.

Second semiconductor layer 102 is included in epitaxial layer 1h and interposed between first semiconductor layer 101 and semiconductor substrate layer 3. Second semiconductor layer 102 is of the second conductivity type that is opposite to the first conductivity type. Second semiconductor layer 102 causes avalanche multiplication to the charge generated through photoelectric conversion between second semiconductor layer 102 and first semiconductor layer 101.

Line layer 2 includes: first contact 202 that is an electrode disposed on first main surface S1 of first semiconductor layer 101; and first line 203 that is a metal line.

Semiconductor substrate layer 3 is a growth substrate used for forming epitaxial layer 1h. Semiconductor substrate layer 3 has: growth surface S2 for forming epitaxial layer 1h; and second main surface S3 opposed to growth surface S2. Second contact 204 is disposed as a backside electrode on a backside of semiconductor substrate layer 3, that is, on second main surface S3 that is a backside of semiconductor substrate 6000. Upon the application of backside bias $V_{back}$ to semiconductor substrate layer 3, a voltage of growth surface S2 of epitaxial layer 1h is fixed to $V_{back}$ via semiconductor substrate layer 3.

Multiplication region 301, which is roughly parallel to first main surface S1 of epitaxial layer 1h, is interposed between first semiconductor layer 101 and second semiconductor layer 102.

Multiplication region 301 causes avalanche multiplication to multiply the charge generated by photoelectrically converting received light (indicated by "hv" in FIG. 54).

An electric field intensity of multiplication region 301 is $3*10^5$ V/cm to $5*10^6$ V/cm. Each of impurity concentrations of first semiconductor layer 101 and second semiconductor layer 102 is $10^{16}$ cm$^{-3}$ to $10^{20}$ cm$^{-3}$, for example. An impurity concentration of epitaxial layer 1 is $10^{14}$ cm$^{-3}$ to $10^{16}$ cm$^{-3}$, for example.

In this case, an amount of potential change in a depth direction of multiplication region 301 is 20 V, for example.

Note that the light received by the photodetector according to the present disclosure (that is, the incident light) is indicated by "hv" in the drawings of the present specification.

A second charge, which is a charge carrier of the second conductivity type generated through photoelectric conversion in photoelectric conversion layer 302 laminated below multiplication region 301, drifts to reach multiplication region 301. Then, the number of carriers remains the same or increases up to hundred-thousand-fold through avalanche multiplication. At this time, the first charge, which is a charge carrier of the first conductivity type generated through photoelectric conversion and avalanche multiplication, is accumulated in first semiconductor layer 101. The second charge generated through photoelectric conversion and avalanche multiplication is drifted to second contact 204 and discharged outside photodetector 1000. To be more specific, the second charge, which is included in the charge generated through photoelectric conversion between first semiconductor layer 101 and second semiconductor layer 102 and opposite in polarity to the first charge, flows outside semiconductor substrate layer 3 via second contact 204.

Here, second contact 204 may be disposed on a whole surface of second main surface S3. Second contact 204 is made of a conductive material and disposed on the semiconductor layer (second semiconductor layer 102) of the second conductivity type or on the backside (i.e., second main surface S3).

For example, semiconductor substrate layer 3, which is the growth substrate for growing epitaxial layer 1h, may be used as second contact 204. Alternatively, second contact 204 may be made through carrier-density adjustment by, for example, impurity diffusion or ion implantation performed on the semiconductor layer of the second conductivity type.

Second contact 204 may be applied with a voltage from a contact that is not shown but disposed toward first main surface S1 of semiconductor substrate 6000, via semiconductor substrate 6000.

Thus, the second charge that is not used as a signal is discharged outside photodetector 1000 in a short time. On this account, temporal fluctuations and spatial non-uniformity in voltage of photodetector 1000 can be reduced. This enhances the photodetection efficiency.

The first charge accumulated in first semiconductor layer 101 is transferred from first semiconductor layer 101 and second semiconductor layer 102 of semiconductor substrate 6000 to readout circuit 407 (see FIG. 12, for example) via first contact 202. Then, this charge is processed as a signal. As a result of this, photodetector 1000 detects the incident light.

The configuration of readout circuit 407 is not particularly intended to be limiting. Readout circuit 407 is a current amplifier or an analog-to-digital (AD) converter circuit, for example.

Here, the first conductivity type may refer to a positive conductivity type (that is, P-type) and the second conductivity type may refer to a negative conductivity type (that is, N-type). Conversely, the first conductivity type may be a negative conductivity type and the second conductivity type may be a positive conductivity type. In other words, the first charge may be an electron and the second charge may be a positive hole.

An ionization rate of an electron is higher than that of a positive hole. Thus, the electron easily causes avalanche multiplication. For this reason, the aforementioned configuration enhances the photosensitivity of photodetector 1000.

In particular, isolation region 1030 of photodetector 1000 according to Embodiment 3 does not include a contact and/or an STI (shallow trench isolation). In addition, isolation region 1030 is depleted and has an indefinite potential. To be more specific, no STI is included in the region where first semiconductor layer 101 and isolation region 1030 are disposed.

This can reduce a width of isolation region 1030 and thus increases an aperture ratio of photodetector 1000.

The single photon avalanche diode (SPAD) disclosed in U.S. Unexamined Patent Application Publication No. 2016/0163906 or U.S. Pat. No. 9,178,100 includes the contact in the isolation region. In this case, an electric field is created and concentrated in an end of the avalanche multiplication region in the direction horizontal to the surface of the semiconductor substrate. To prevent this electric field concentration, a so-called guard ring structure is provided. With this structure, the isolation region is increased in size to reduce the electric field and thus the multiplication region is reduced in size correspondingly.

In contrast, isolation region 103 includes no STI nor contact according to the present embodiment. Thus, the electric field in the horizontal direction can be reduced without a guard ring. Having no electric field concentration allows multiplication region 301 to be increased in size, so that the photosensitivity is enhanced.

In particular, a width of a depleted layer of multiplication region 301 in a vertical direction (a direction perpendicular to first main surface S) may be greater than a width of a depleted layer of isolation region 1030 in a horizontal direction (the direction parallel to first main surface S) (that is, about half of a width of isolation region 1030). This configuration easily reduces electric field concentration in an end part of multiplication region 301 and thus easily achieves a uniform electric field intensity. Thus, a region for avalanche multiplication can be increased so that the photosensitivity is easily enhanced.

For example, the width of isolation region 1030 is 0.1 μm to 1 μm, and an impurity concentration of isolation region 1030 is $10^{15}$ cm$^{-3}$ to $10^{18}$ cm$^{-3}$. A potential of isolation region 1030 is determined depending on a potential of first semiconductor layer 101, a potential of first well 104, and the backside bias $V_{back}$.

If a potential difference between first semiconductor layer 101 and isolation region 1030 is small, the number of saturated electrons is small. This easily develops charge leakage to an adjacent pixel. In contrast, if the potential difference between first semiconductor layer 101 and isolation region 1030 is large, an electric field generated on a device surface (first main surface S1, for example) becomes large. This may unfortunately increase a dark current and a DCR (dark count rate). For this reason, the potential difference between first semiconductor layer 101 and isolation region 1030 may be about 0.1 V to about 10 V.

A light incident surface according to Embodiment 3 is first main surface S1 of epitaxial layer 1h.

This eliminates the need for performing a special process, such as backside treatment, and thus reduces cost. In particular, light of a long wavelength, such as near-infrared light, has a low optical absorption coefficient and attenuates only after approaching semiconductor substrate layer 3. On this account, the photosensitivity changes little regardless of whether photoelectric conversion layer 302 is disposed away from or near first main surface S1 of epitaxial layer 1. For example, an absorption coefficient of silicon (Si) for absorbing light with a wavelength of 940 nm having an ultrasmall solar spectral intensity in a near-infrared region is 1%/μm. Thus, even if photoelectric conversion layer 302 is disposed at a depth of 1 μm below first main surface S1, the photosensitivity decreases by 1%.

Here, an optical waveguide may be provided on multiplication region 301 in line layer 2, and a microlens may also be provided on line layer 2. This can enhance a light collection efficiency.

Next, the potential of the first charge is described with reference to FIG. 55 and FIG. 56.

Figure 55:
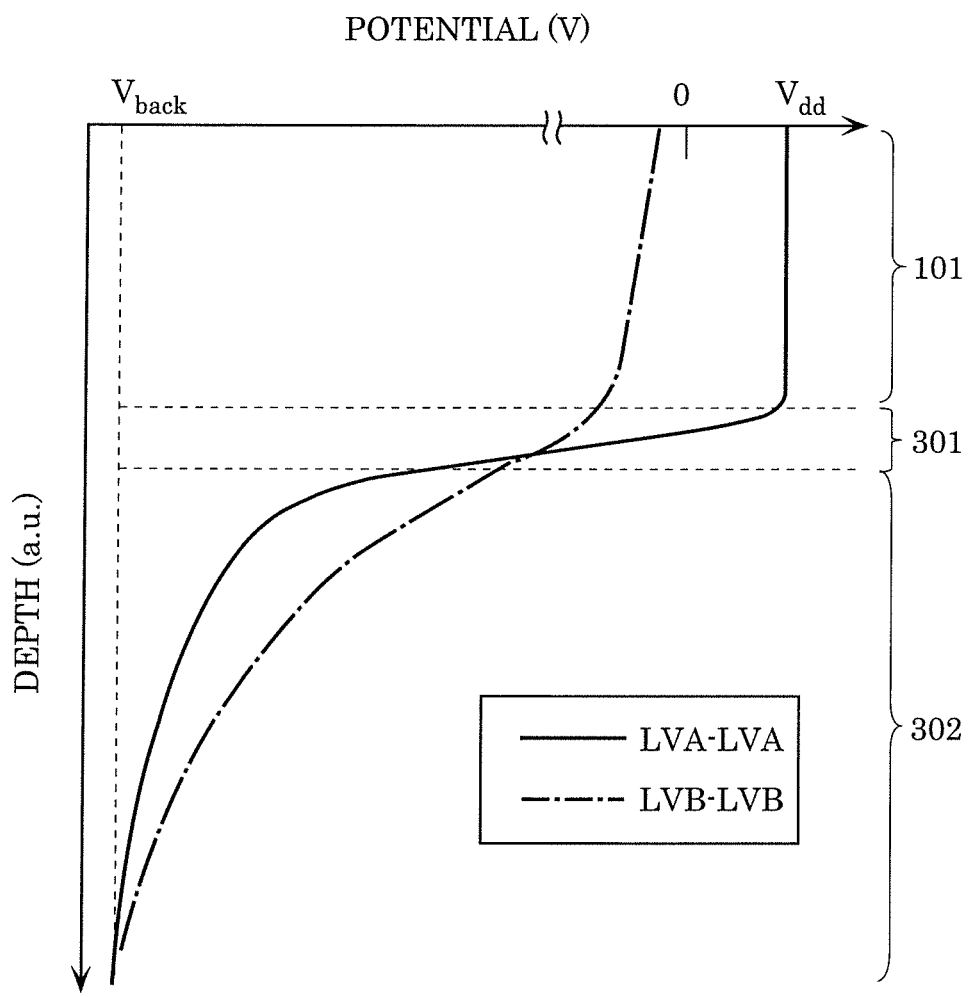
FIG. 55 illustrates potentials of the photodetector along line LVA-LVA and line LVB-LVB of FIG. 54, according to Embodiment 3 of the present disclosure.

FIG. 55 illustrates potentials of photodetector 1000 along line LVA-LVA and line LVB-LVB of FIG. 54, according to Embodiment 3 of the present disclosure. FIG. 56 illustrates a potential of photodetector 1000 along line LVC-LVC of FIG. 54, according to Embodiment 3 of the present disclosure.

A solid line illustrated in FIG. 55 indicates the potential along line LVA-LVA of FIG. 54, or more specifically, the potential of first semiconductor layer 101, multiplication region 301, and photoelectric conversion layer 302.

First semiconductor layer 101 is connected to readout circuit 407 (see FIG. 5, for example). Thus, a voltage of first semiconductor layer 101 is, at least temporarily, fixed at power voltage $V_{dd}$ of readout circuit 407. A voltage of growth surface S2 of epitaxial layer 1h is fixed at voltage $V_{back}$ via semiconductor substrate layer 3.

Photoelectric conversion layer 302 may be depleted and have a potential gradient by which the charge is drifted to multiplication region 301.

If depleted and having a thickness of 5 μm, for example, photoelectric conversion layer 302 has a potential change of about 20 V. If depleted and having a thickness of 15 μm, for example, photoelectric conversion layer 302 has a potential change of about 40 V.

Hereinafter, a voltage difference between first contact 202 and second contact 204 when a threshold voltage causing avalanche multiplication is applied to multiplication region 301 is referred to as an "avalanche breakdown voltage" in the present specification. In this case, if the thickness of photoelectric conversion layer 302 is 5 μm, the avalanche breakdown voltage is 40V, for example.

As illustrated in FIG. 55, the potentials along line LVA-LVA and line LVB-LVB approach $V_{back}$ in the depth direction, that is, with increasing depth. In contrast, the potentials along line LVA-LVA and line LVB-LVB increase as first main surface S1 approaches, that is, increase with depth. For example, the potential along line LVA-LVA approaches $V_{dd}$. Here, the potential along line LVB-LVB may be depleted and thus indefinite on first main surface S1.

Figure 56:
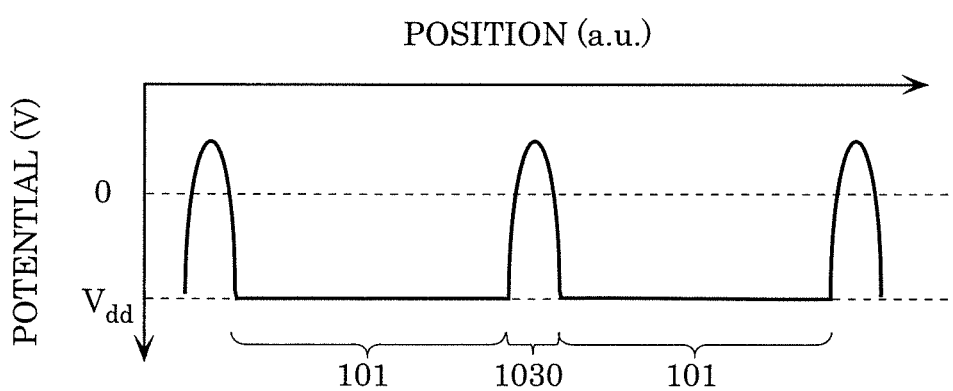
FIG. 56 illustrates a potential of the photodetector along line LVC-LVC of FIG. 54, according to Embodiment 3 of the present disclosure.

As illustrated in FIG. 56, first semiconductor layers 101 adjacent to each other are biased at $V_{dd}$. Isolation region 1030 interposed between first semiconductor layers 101 adjacent to each other is depleted and indefinite in potential. Thus, first semiconductor layers 101 adjacent to each other are electrically separated. A potential difference between first semiconductor layer 101 and isolation region 1030 may be 0.1 V to 10 V.

As described, isolation region 1030 separates two first semiconductor layers 101 adjacent to each other, or more specifically, multiplication regions 301 adjacent to each other, according to the potential. Isolation region 1030, which is depleted, has the potential greater than the voltage change in first semiconductor layer 101 caused by the charge generated through avalanche multiplication.

For photodetector 1000 having the configuration described above, isolation region 1030 can be miniaturized and multiplication region 301 can be increased in size. This enhances the photosensitivity.

For example, suppose that a contact is disposed without depleting isolation region 1030 as disclosed in U.S. Unexamined Patent Application Publication No. 2016/0163906. In this case, to maintain the electrical separation and also reduce the electric field in a direction roughly parallel to epitaxial layer 1 (that is, the direction parallel to first main surface S), a separation width of at least 1 µm is typically required in the direction parallel to first main surface S1.

In contrast, isolation region 1030 included in photodetector 1000 according to Embodiment 3 is depleted. The depletion of isolation region 1030 achieves the effect of reducing the electric field between first semiconductor layer 101 and isolation region 1030. For this reason, the separation width can be reduced to 0.1 µm to 1 µm. In other words, multiplication region 301 increased in area allows photodetector 1000 to have a higher aperture ratio. This may enhance the photosensitivity of photodetector 1000.

As described above, photodetector 1000 according to Embodiment 3 includes: semiconductor substrate 6000 that has first main surface S1 and second main surface S3 opposed to first main surface S1; first semiconductor layer 101 that is of the first conductivity type, and is included in semiconductor substrate 6000 and closer to first main surface S1 than to second main surface S3; second semiconductor layer 102 that is of the second conductivity type different from the first conductivity type, and is included in semiconductor substrate 6000 and interposed between first semiconductor layer 101 and second main surface S3; multiplication region 301 that is included in first semiconductor layer 101 and second semiconductor layer 102, and causes avalanche multiplication to the charge generated in semiconductor substrate 6000 through photoelectric conversion; and isolation region 1030 that separates at least two multiplication regions 301.

With this configuration, isolation region 1030 can be reduced in size. In other words, photodetector 1000 can be downsized.

With this configuration, the charge photo-generated in photoelectric conversion layer 302, is drifted in photoelectric conversion layer 302 and enters multiplication region 301 where avalanche multiplication is thus caused. The charge generated through photoelectric conversion is amplified by avalanche multiplication. This allows the incident light even with low intensity to be detected. More specifically, this configuration enhances the sensitivity (that is, the photosensitivity) of photodetector 1000.

Photodetector 1000 further includes second contact 204 that is disposed on second main surface S3, for example. One of the first charge and the second charge that are generated between first semiconductor layer 101 and second semiconductor layer 102 through photoelectric conversion flows outside semiconductor substrate 6000 via second contact 204. The second charge is opposite in polarity to the first charge.

With this configuration, the second charge, which is a charge carrier of the second conductivity type generated through photoelectric conversion and avalanche multiplication, is discharged outside photodetector 1000 via second contact 204 disposed on second main surface S3 that is the backside of semiconductor substrate 6000, for example. This can reduce temporal fluctuations and spatial non-uniformity in voltage of the backside of semiconductor substrate 6000. Thus, spatial and temporal fluctuations in the photodetection efficiency of photodetector 1000 can be reduced.

For example, isolation region 1030 separates at least two multiplication regions 301 according to the potential.

With this configuration, as compared with the case where isolation region 1030 is a trench for example, the aperture ratio can be increased and thus the photosensitivity can be enhanced. In addition, a dark current and DCR can be reduced.

For example, the potential of isolation region 1030 is greater than a voltage change in first semiconductor layer 101 caused by the charge generated through the avalanche multiplication.

With this configuration, even if a voltage change occurs in first semiconductor layer 101, first semiconductor layers 101 adjacent to each other can be electrically separated by isolation region 1030.

Moreover, isolation region 1030 is depleted, for example.

With this configuration, depletion of isolation region 1030 allows two multiplication regions 301 to be separated at a short separation distance and also allows the electric field of isolation region 1030 to be reduced. This maintains the photosensitivity of photodetector 1000 and also achieves miniaturization of photodetector 1000. Thus, the aperture ratio of photodetector 1000 is increased. Moreover, depletion of isolation region 1030 keeps the electric field from concentrating in multiplication region 301. This eliminates the need for a guard ring, which has been required in a conventional photodetector, around multiplication region 301. Thus, isolation region 1030 of photodetector 1000 can be further reduced in size. In addition, photodetector 1000 can have a higher aperture ratio and thus achieve an enhanced photosensitivity. Here, miniaturization of pixel 60 is less likely to cause a decrease in the photosensitivity. This enables miniaturization to be easily achieved.

For example, a region including first semiconductor layer 101 and isolation region 1030 includes no STI nor contact.

This configuration can prevent generation of dark current.

Modifications

Next, modifications of photodetector 1000 according to Embodiment 3 are described. The following mainly describes differences between photodetector 1000 and the modifications. Components that are substantially the same are assigned the same reference mark, and descriptions on these components may be partially simplified or omitted.

Modification 1

Figure 57:
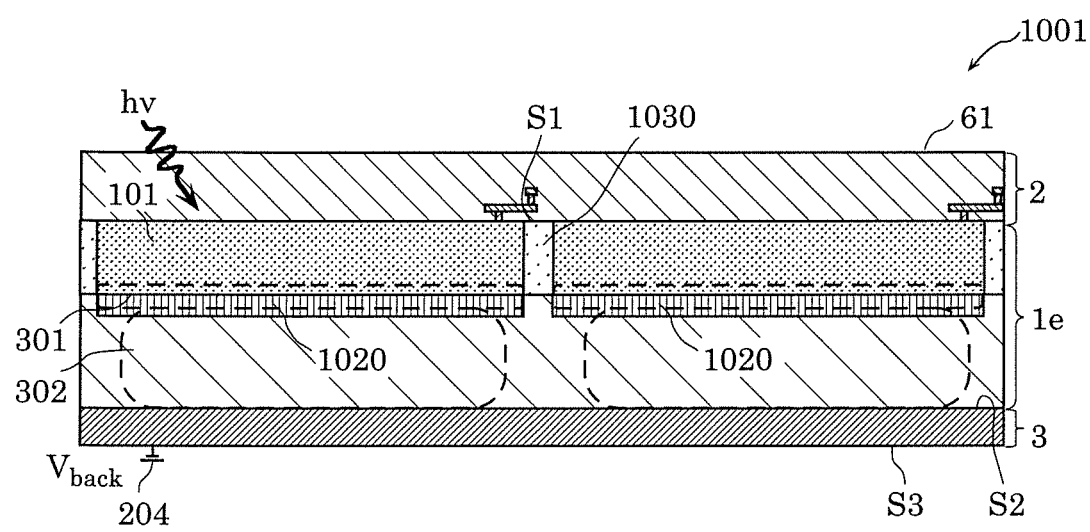
FIG. 57 is a cross-sectional view of a photodetector according to Modification 1 of Embodiment 3 of the present disclosure.

FIG. 57 is a cross-sectional view of a photodetector according to Modification 1 of Embodiment 3 of the present disclosure.

Photodetector 1001 according to Modification 1 includes epitaxial layer 1e in pixel 61. Epitaxial layer 1e is different from epitaxial layer 1h in photodetector 1000.

To be more specific, epitaxial layer 1e includes second semiconductor layer 1020 different in size in plan view from the corresponding layer included in epitaxial layer 1h. Even more specifically, photodetector 1001 according to Modification 1 includes second semiconductor layer 1020 different in width in cross-sectional view from the corresponding layer included in photodetector 1000. In other words, photodetector 1001 according to Modification 1 includes second semiconductor layer 1020 different in width, in a direction parallel to first main surface S1, from the corresponding layer included in photodetector 1000.

In the present embodiment, the width of second semiconductor layer 1020 (in a horizontal direction in the diagram) is roughly the same as the width of first semiconductor layer 101, in cross-sectional view.

For example, second semiconductor layer 1020 has the same shape as first semiconductor layer 101 or larger than first semiconductor layer 101, in plan view.

With this configuration, the electric field becomes more uniform in the direction roughly parallel to first main surface S1 of semiconductor substrate 6000 and thus an avalanche multiplication region (multiplication region 301) is increased in size. To be more specific, multiplication region 301 has the same width as first semiconductor layer 101 or has a greater width than first semiconductor layer 101, in cross-sectional view. This further increases the aperture ratio, which may result in a higher photosensitivity.

Modification 2

Figure 58:
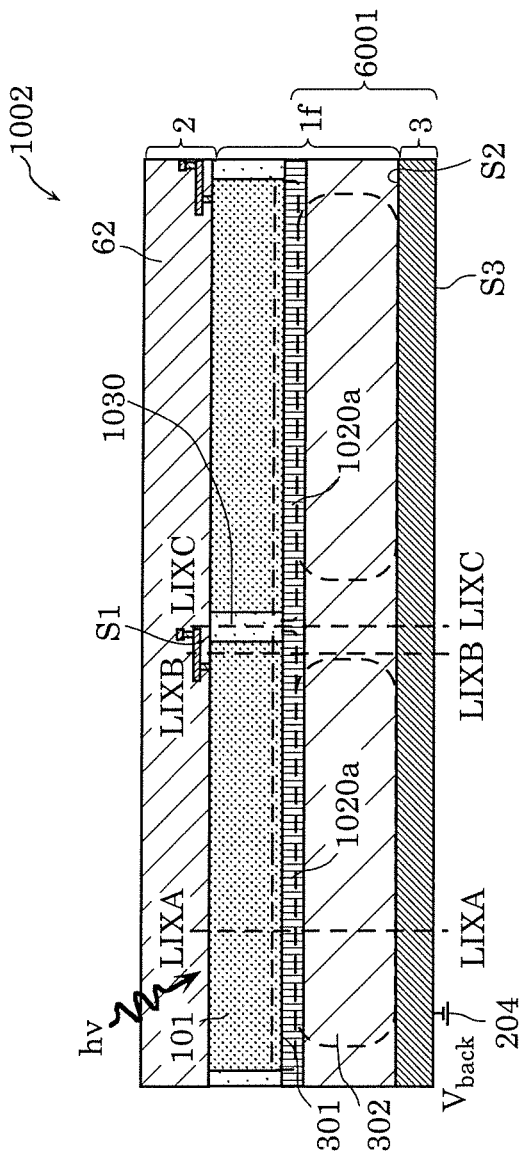
FIG. 58 is a cross-sectional view of a photodetector according to Modification 2 of Embodiment 3 of the present disclosure.

FIG. 58 is a cross-sectional view of a photodetector according to Modification 2 of Embodiment 3 of the present disclosure.

Photodetector 1002 according to Modification 2 includes epitaxial layer 1*f* in pixel 62. Epitaxial layer 1*f* is different from epitaxial layer 1*h* included in photodetector 1000. To be more specific, epitaxial layer 1*f* includes second semiconductor layer 1020*a* different in size in plan view from the corresponding layer included in epitaxial layer 1*h*. Even more specifically, photodetector 1002 according to Modification 2 includes second semiconductor layer 1020*a* disposed on a whole surface of epitaxial layer 1*f* in plan view. In other words, photodetector 1002 includes, for example, a plurality of first semiconductor layers 101, and second semiconductor layer 1020*a* is continuously disposed in semiconductor substrate 6001 to overlap with the plurality of first semiconductor layers 101 in plan view.

Figure 59:
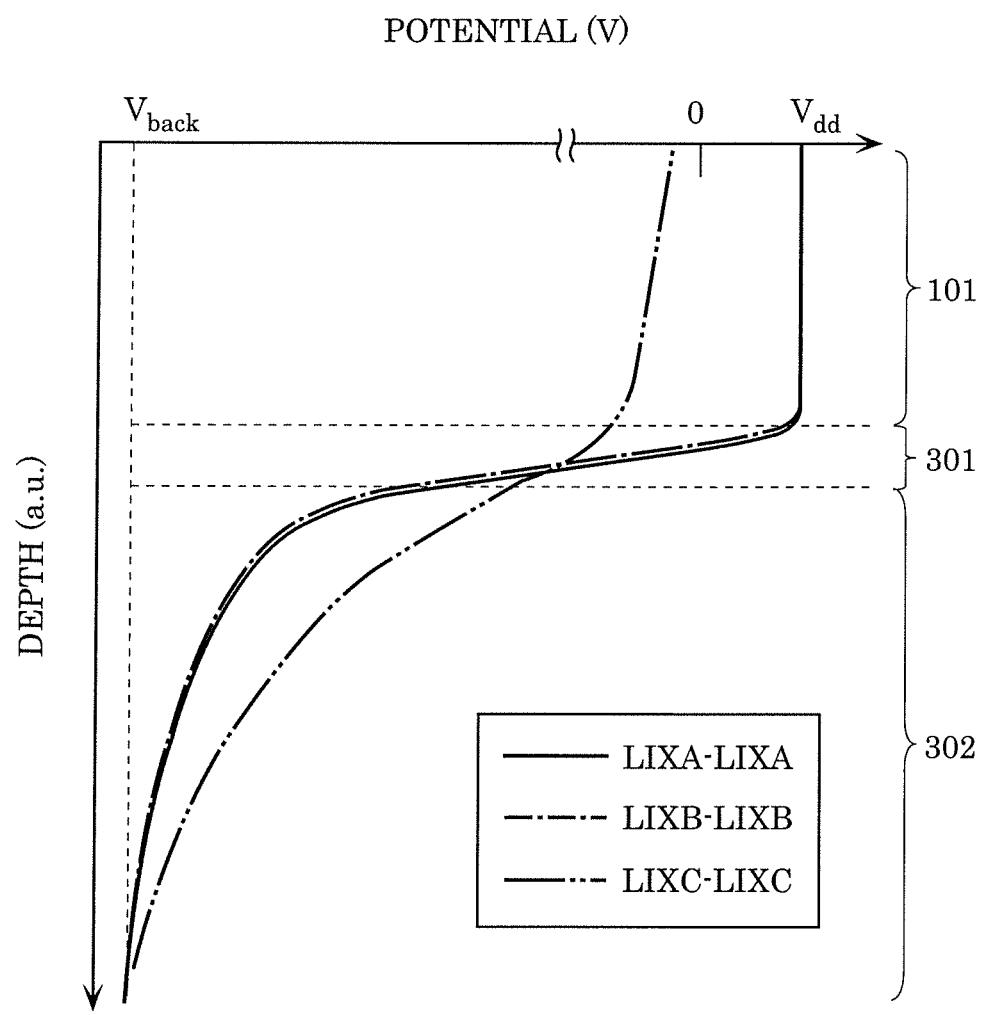
FIG. 59 illustrates potentials of the photodetector along line LIXA-LIXA, line LIXB-LIXB, and line LIXC-LIXC of FIG. 58, according to Modification 2 of Embodiment 3 of the present disclosure.

FIG. 59 illustrates potentials of photodetector 1002 along line LIXA-LIXA, line LIXB-LIXB, and line LIXC-LIXC of FIG. 58.

As can be seen from FIG. 59, a manner of variation in the potential of first semiconductor layer 101 stays about the same along the direction parallel to first main surface S1. This allows the electric field to be more uniform in the direction roughly parallel to first main surface S1 of semiconductor substrate 6001 and also allows multiplication region 301 to be increased in size. To be more specific, multiplication region 301 is larger than first semiconductor layer 101. This further increases the aperture ratio, which results in a higher photosensitivity.

Note that a combination of Embodiment 3 and either one or both of Embodiments 1 and 2 described above may be included in the scope of the present disclosure.

To be more specific, the concentrations of second semiconductor layers 102, 1020, and 1020*a* according to Embodiment 3 may also gradually increase from first main surfaces S1 of semiconductor substrates 6000 and 6001 toward second main surfaces S3. Moreover, each of second semiconductor layers 102, 1020, and 1020*a* may be an epitaxially-grown layer. Any circuit configurations and layouts described in Embodiments 1 and 2 may be applied to Embodiment 3.

Other Variations

Although the photodetectors according to one or more aspects of the present disclosure have been described based on the embodiments, the present disclosure is not limited to the embodiments. Those skilled in the art will readily appreciate that embodiments arrived at by making various modifications to the above embodiments or embodiments arrived at by selectively combining elements disclosed in the above embodiments without materially departing from the scope of the present disclosure may be included within one or more aspects of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The photodetector according to the present disclosure is applicable to, for example, a complementary metal oxide semiconductor (CMOS) image sensor having a high photosensitivity to detect faint light.

What is claimed is:

1. A photodetector, comprising:
    a semiconductor substrate that has a first main surface and a second main surface opposed to the first main surface;
    a first semiconductor layer that is of a first conductivity type, and is included in the semiconductor substrate and closer to the first main surface than to the second main surface;
    a second semiconductor layer that is of a second conductivity type different from the first conductivity type, and is included in the semiconductor substrate and interposed between the first semiconductor layer and the second main surface;
    a multiplication region that is included in the first semiconductor layer and the second semiconductor layer and causes avalanche multiplication to a charge generated in the semiconductor substrate through photoelectric conversion;
    a circuit region that is disposed alongside the first semiconductor layer in a direction parallel to the first main surface;
    an isolation transistor that is disposed in the circuit region, the isolation transistor comprising at least one isolation transistor;
    an isolation region that is interposed between the first semiconductor layer and the circuit region;
    a first contact that is disposed on the first semiconductor layer, the first contact comprising at least one first contact;
    a first line that connects the first contact to a source of the isolation transistor; and
    a readout circuit that is connected to a drain of the isolation transistor and reads a first charge included in the charge generated in the semiconductor substrate through photoelectric conversion.

2. The photodetector according to claim 1, further comprising
    a second contact that is disposed on the second main surface,
    wherein the charge generated between the first semiconductor layer and the second semiconductor layer through photoelectric conversion includes a second charge that is opposite in polarity to the first charge and that flows outside the semiconductor substrate via the second contact.

3. The photodetector according to claim 1, wherein the isolation region separates the first semiconductor layer and the circuit region according to a potential.

4. The photodetector according to claim 3, wherein the potential is greater than a voltage change in the first semiconductor layer caused by the charge generated through the avalanche multiplication.

5. The photodetector according to claim 1, wherein the isolation region is depleted.

6. The photodetector according to claim 1, wherein a region including the first semiconductor layer and the isolation region includes no shallow trench isolation (STI) nor contact.

7. The photodetector according to claim 1, wherein an impurity concentration of the second semiconductor layer increases with depth.

8. The photodetector according to claim 7, wherein an impurity concentration distribution of the second semiconductor layer is roughly constant in the direction parallel to the first main surface.

9. The photodetector according to claim 7, further comprising
a first well that is disposed in the circuit region, the first well comprising at least one first well,
wherein the first well is of the first conductivity type and has a lower impurity concentration than the first semiconductor layer at an interface between the first well and the second semiconductor layer.

10. The photodetector according to claim 9, wherein the first well is disposed further toward the second main surface than the first semiconductor layer is.

11. The photodetector according to claim 7, wherein a gradient of an impurity concentration distribution of the second semiconductor layer is steeper toward the second main surface from the first main surface.

12. The photodetector according to claim 1, wherein the second semiconductor layer is disposed to cover a whole surface of the first main surface.

13. The photodetector according to claim 1, wherein an interface between the first semiconductor layer and the second semiconductor layer is closer to the second main surface than a part of a top surface of the second semiconductor layer is.

14. The photodetector according to claim 1, wherein an impurity concentration of the first semiconductor layer is greater than an impurity concentration of the second semiconductor layer, in a region including an interface between the first semiconductor layer and the second semiconductor layer.

15. The photodetector according to claim 1, wherein an impurity concentration of the second semiconductor layer is at least $10^{16}$ cm$^{-3}$.

16. The photodetector according to claim 1, wherein the first semiconductor layer includes a region where an impurity concentration increases with depth.

17. The photodetector according to claim 1, wherein the first semiconductor layer includes a second conductivity layer that is in contact with the first main surface of the semiconductor substrate.

18. The photodetector according to claim 1, wherein the first contact comprises a plurality of first contacts,
the isolation transistor comprises a plurality of isolation transistors each of which is connected to a corresponding one among the plurality of first contacts, and
the plurality of isolation transistors are disposed in a same circuit region.

19. The photodetector according to claim 18, wherein at least two among the plurality of isolation transistors share the readout circuit.

20. The photodetector according to claim 18, wherein at least two among the plurality of isolation transistors share a drain connected to the readout circuit.

21. The photodetector according to claim 1, wherein the first semiconductor layer comprises N first semiconductor layers disposed in an N-polygon having an M-fold rotational symmetry to have the M-fold rotational symmetry, in plan view, where N is a positive integer not less than 3, and M is a positive integer not less than 2,
the circuit region is disposed in a rotational center of the N-polygon having the M-fold rotational symmetry, and
the isolation transistor comprises N isolation transistors disposed in the circuit region.

22. The photodetector according to claim 1, wherein the readout circuit includes, in the circuit region:
a reset transistor that is connected to the drain of the isolation transistor and resets the first semiconductor layer via the isolation transistor;
a source follower transistor that reads an output signal from the isolation transistor; and
a selection transistor that is connected to the source follower transistor.

* * * * *